(12) United States Patent
Wada et al.

(10) Patent No.: US 10,903,253 B2
(45) Date of Patent: Jan. 26, 2021

(54) IMAGING DEVICE, IMAGING SYSTEM, AND MOVING OBJECT

(71) Applicant: CANON KABUSHIKI KAISHA, Tokyo (JP)

(72) Inventors: Yoichi Wada, Yokohama (JP); Daisuke Yoshida, Ebina (JP); Fumihiro Inui, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 15 days.

(21) Appl. No.: 16/203,151

(22) Filed: Nov. 28, 2018

(65) Prior Publication Data

US 2019/0165014 A1 May 30, 2019

(30) Foreign Application Priority Data

Nov. 30, 2017 (JP) ................. 2017-230984

(51) Int. Cl.
| | |
|---|---|
| *H01L 27/146* | (2006.01) |
| *H04N 5/341* | (2011.01) |
| *H04N 5/3745* | (2011.01) |
| *H04N 5/343* | (2011.01) |
| *H04N 5/374* | (2011.01) |

(Continued)

(52) U.S. Cl.
CPC .. *H01L 27/14605* (2013.01); *H01L 27/14603* (2013.01); *H01L 27/14621* (2013.01); *H01L 27/14636* (2013.01); *H04N 5/341* (2013.01); *H04N 5/343* (2013.01); *H04N 5/347* (2013.01); *H04N 5/378* (2013.01); *H04N 5/379* (2018.08); *H04N 5/3742* (2013.01); *H04N 5/37455* (2013.01); *H04N 5/37457* (2013.01); *H01L 27/14641* (2013.01)

(58) Field of Classification Search
CPC ......... H01L 27/14605; H01L 27/14603; H01L 27/14636; H01L 27/14621; H01L 27/14641; H04N 5/343; H04N 5/3742; H04N 5/378; H04N 5/37457; H04N 5/347; H04N 5/379; H04N 5/341; H04N 5/37455

See application file for complete search history.

(56) References Cited

U.S. PATENT DOCUMENTS

| | | | |
|---|---|---|---|
| 6,310,546 B1 | 10/2001 | Seta | |
| 8,314,766 B2 * | 11/2012 | Chang | ............... G02F 1/13 345/99 |

(Continued)

FOREIGN PATENT DOCUMENTS

| | | |
|---|---|---|
| JP | 2005-228956 A | 8/2005 |
| JP | 2011-114324 A | 6/2011 |

(Continued)

*Primary Examiner* — Cuong B Nguyen

(74) *Attorney, Agent, or Firm* — Canon U.S.A., Inc., IP Division

(57) ABSTRACT

An imaging device is provided in which, at a position where a line passes a pixel in a first row along a second direction intersecting with a first direction, a first signal line and a second signal line are arranged at overlapping positions, in which, at a position where a line passes a pixel in a second row along the second direction, the first and the second signal lines are arranged at non-overlapping positions, and, in which, at a position where a line passes a pixel in a third row along the second direction, the first and the second signal lines are arranged at overlapping positions.

19 Claims, 25 Drawing Sheets

(51) Int. Cl.
*H04N 5/378* (2011.01)
*H04N 5/347* (2011.01)
*H04N 5/369* (2011.01)

(56) References Cited

U.S. PATENT DOCUMENTS

| | | |
|---|---|---|
| 2011/0128400 A1 | 6/2011 | Wakano |
| 2011/0128426 A1 | 6/2011 | Taruki |
| 2012/0098081 A1 | 4/2012 | Horiike |
| 2017/0201702 A1 | 7/2017 | Niwa |

FOREIGN PATENT DOCUMENTS

| | | |
|---|---|---|
| JP | 2011-114843 A | 6/2011 |
| JP | 2012-89739 A | 5/2012 |
| JP | 2015-50478 A | 3/2015 |
| JP | 2016-12904 A | 1/2016 |

\* cited by examiner

FIG.2

FIG.23B
FRONT VIEW
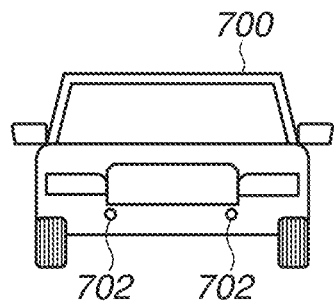
TOP VIEW
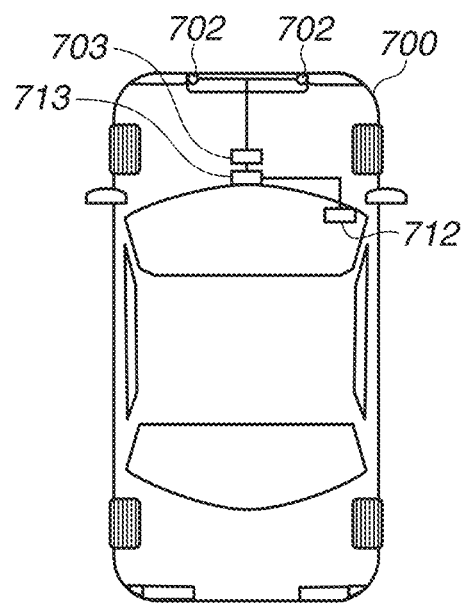
REAR VIEW
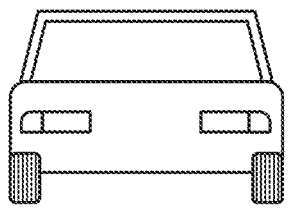

IMAGING DEVICE, IMAGING SYSTEM, AND MOVING OBJECT

BACKGROUND

Field

The present disclosure relates to an imaging device, an imaging system, and a moving object.

Description of the Related Art

Imaging devices having a plurality of pixels arranged over a plurality of rows and a plurality of columns are known. An imaging device discussed in Japanese Patent Application Laid-Open No. 2005-228956 is provided with signal lines corresponding to columns in which pixels are arranged. This imaging device is discussed to be further provided with signal output lines having portions extending in a first direction and portions extending in a second direction.

The imaging device discussed in Japanese Patent Application Laid-Open No. 2005-228956 does not take into consideration a suitable layout of a plurality of signal lines for transmitting signals output from pixels in one column in a multilayer wiring configuration.

SUMMARY

The present disclosure is directed to a layout for reducing the area of wiring regions of a plurality of signal lines provided for pixels in one column in the multilayer wiring configuration.

According to an aspect of the present disclosure, an imaging device includes a plurality of pixels arranged over a plurality of rows and a plurality of columns, and a plurality of signal lines including a first signal line and a second signal line extending in a first direction, arranged corresponding to one of the plurality of columns and connected to pixels in respectively different rows, and wherein the first signal line of the plurality of signal lines is arranged in a first wiring layer, and the second signal line thereof is arranged in a second wiring layer that is closer to the pixels than the first wiring layer, wherein, at a position where a line passes a pixel in a first row out of the plurality of rows along a second direction intersecting with the first direction, the first and the second signal lines are arranged at overlapping positions, wherein, at a position where a line passes a pixel in a second row out of the plurality of rows along the second direction, the first and the second signal lines are arranged at non-overlapping positions, and wherein, at a position where a line passes a pixel in a third row out of the plurality of rows along the second direction, the first and the second signal lines are arranged at overlapping positions.

Further features of the present disclosure will become apparent from the following description of exemplary embodiments with reference to the attached drawings.

BRIEF DESCRIPTION OF THE DRAWINGS

FIG. 2 illustrates layouts of pixels and signal processing circuits of the imaging device in a planar view.

FIGS. 23A and 23B illustrate a configuration of a moving object.

DESCRIPTION OF THE EMBODIMENTS

Exemplary embodiments will be described below with reference to the accompanying drawings. In the following descriptions, transistors are N-type transistors unless otherwise noted. However, in the following exemplary embodiments, transistors are not limited to N-type transistors, and P-type transistors may be suitably used. In this case, the potentials of the gate, source, and drain of each transistor can be suitably modified in the descriptions of the exemplary embodiments. For example, in the descriptions of a transistor operating as a switch according to the exemplary embodiments, the low and the high levels of the potential supplied to the gate need to be interchanged.

Overall Configuration of Imaging Device

Figure 1:
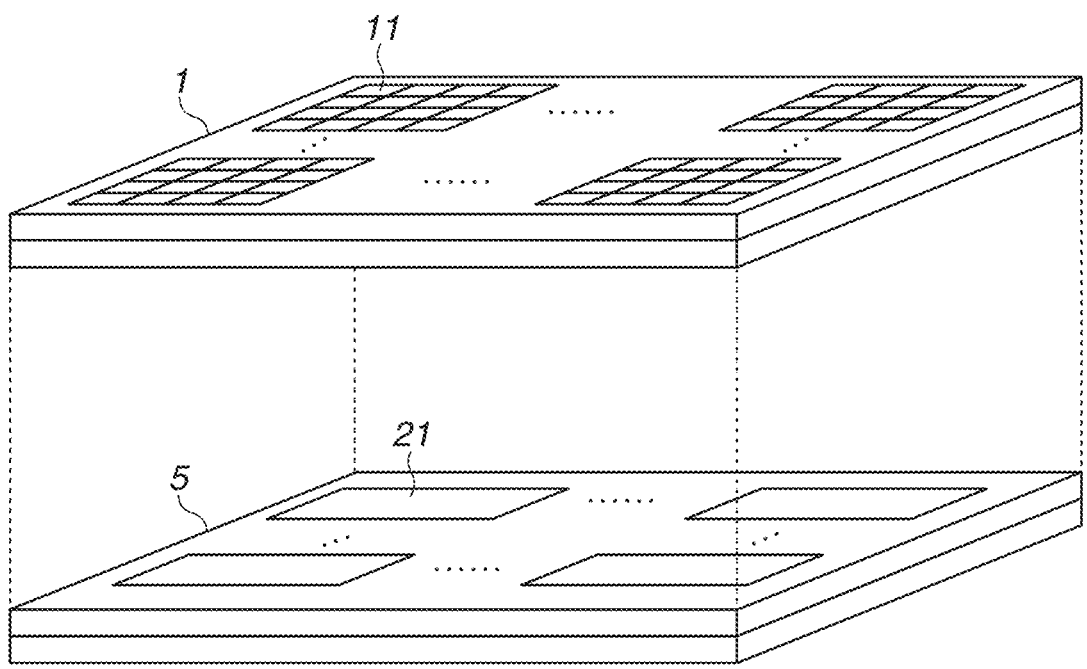
FIG. 1 illustrates a configuration of an imaging device.

FIG. 1 illustrates a first chip 1 and a second chip 5 included in an imaging device according to a first exemplary embodiment. The first chip 1 includes pixels 11 arranged over a plurality of rows and a plurality of columns. The second chip 5 includes signal processing circuits 21 over a plurality of rows and a plurality of columns. Although FIG. 1 illustrates only the pixels 11 and signal processing circuits 21, control lines for controlling the pixels 11 and signal lines for transmitting signals output from the pixels 11 are suitably arranged on the first chip 1. Further, drive circuits such as a vertical scanning circuit and a timing generator are suitably disposed on the first chip 1 or the second chip 5.

Figure 2:
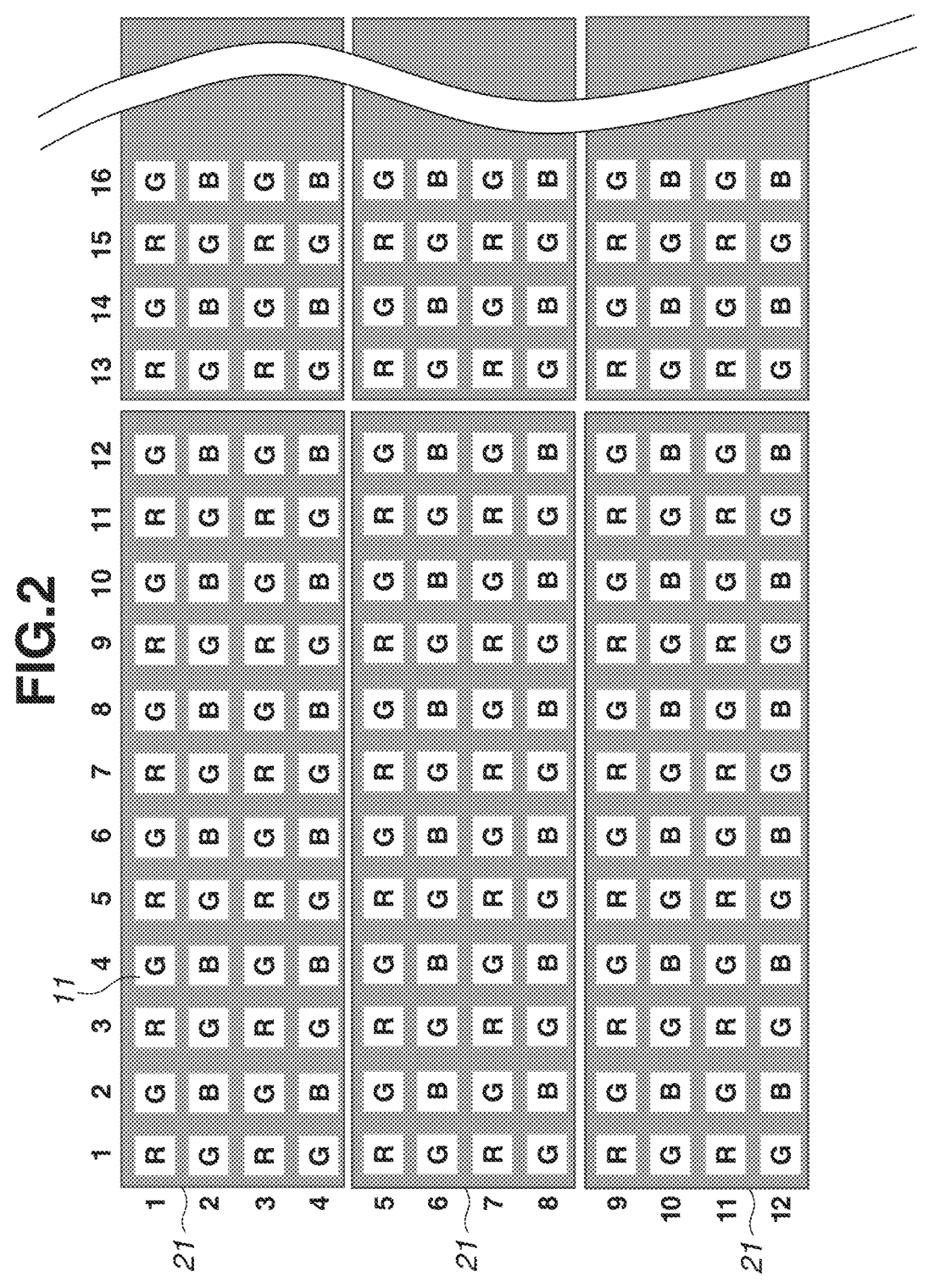

Layout Relationship between Pixels and Signal Processing Circuits in Planar View FIG. 2 illustrates layouts, in a planar view, of the pixels 11 provided in the first chip 1 and the signal processing circuits 21 provided in the second chip 5. FIG. 2 also illustrates colors of color filters included in the pixels 11. Referring to FIG. 2, R indicates that a pixel 11 includes a red (R) color filter. Similarly, G and B indicate that pixels 11 include a green (G) and a blue (B) color filter, respectively. In other words, the first chip 1 can be said to be provided with pixels to which light with a wavelength corresponding to a first color is incident and pixels to which light with a wavelength corresponding to a second color is incident.

Typically, the wavelength corresponding to red is 600 to 830 nm, the wavelength corresponding to green is 500 to 600 nm, and the wavelength corresponding to blue is 360 to 500 nm.

The color of a color filter may be distinguished with a peak wavelength with which the transmittance of the color filter is maximized. Typically, the peak wavelength of the transmittance of the blue color filter is about 450 nm, the peak wavelength of the transmittance of the green color filter is about 540 nm, and the peak wavelength of the transmittance of the red color filter is about 630 nm.

The color filter of each pixel 11 may be composed of a single color filter member. Alternatively, the color filter of each pixel 11 may have color filter members having different compositions between one part and the other part of a color filter forming region in a range that can be substantially recognized as the same single color.

Each signal processing circuit 21 is disposed to overlap with the pixels 11 arranged over a plurality of rows and a plurality of columns. In this case, each signal processing circuit 21 is disposed to overlap with the pixels 11 arranged over 4 rows and 12 columns. The signal processing circuit 21 includes a multiplexing circuit and an AD conversion circuit (AD conversion unit), as described below in detail. Therefore, either one or both of the multiplexing circuit and the AD conversion circuit of each signal processing circuit 21 are said to be disposed to overlap with the pixels 11.

The AD conversion circuit of each signal processing circuit 21 performs the AD conversion on the signal output from a pixel 11 having the color filter with the first color and does not perform the AD conversion on the signal output from a pixel 11 having the color filter with the second color, as described below in detail. Therefore, either one or both of the multiplexing circuit and the AD conversion circuit of each signal processing circuit 21 overlap with both the pixel 11 to be subjected to the AD conversion and the pixel 11 not to be subjected to the AD conversion in a planar view.

This layout is to be considered as an example. The present exemplary embodiment can employ a form in which the pixels 11 are arranged over a plurality of rows and a plurality of columns for each signal processing circuit 21.

Configuration of Imaging Device

Figure 3:
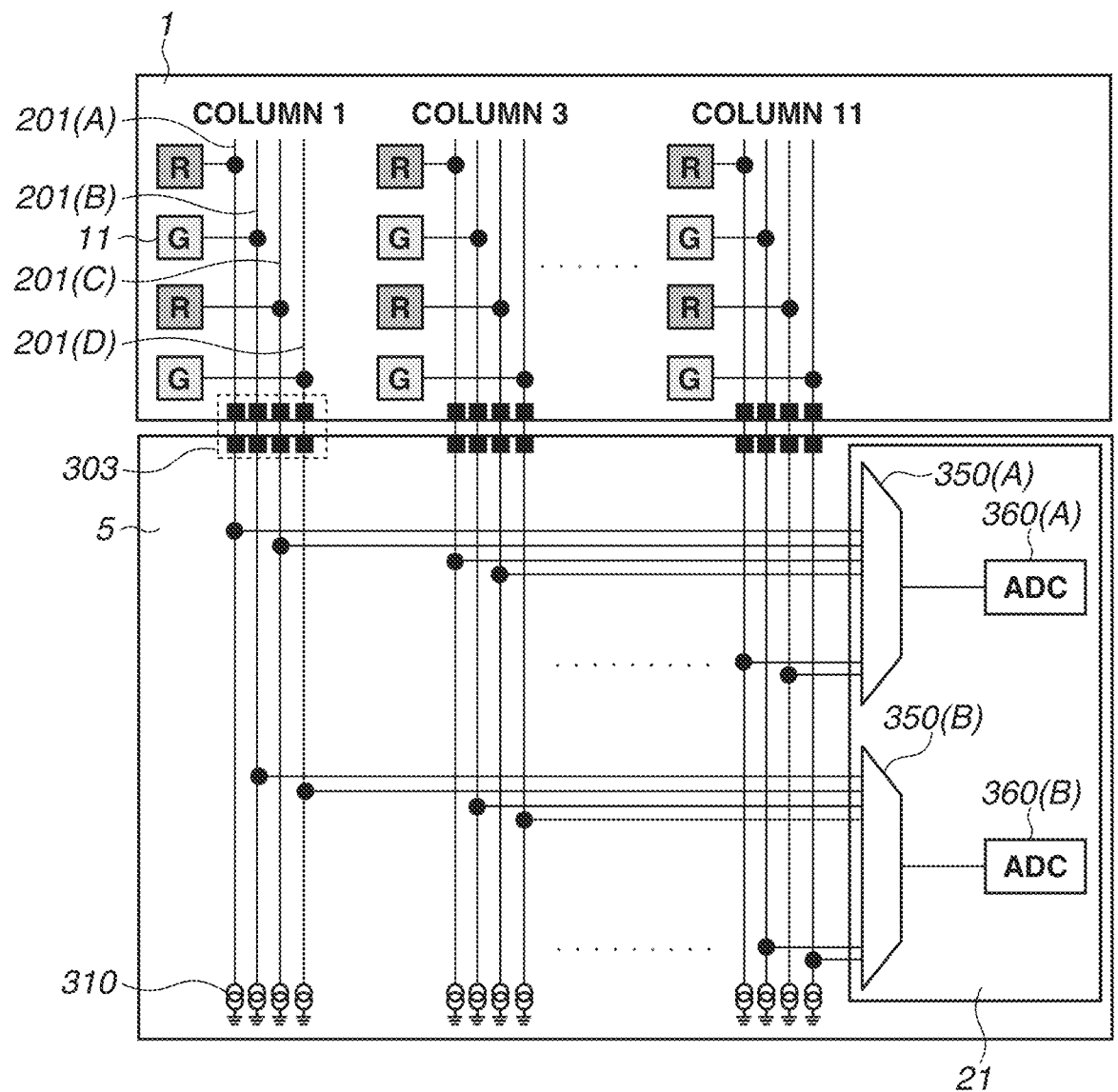
FIG. 3 is a block diagram illustrating pixels and a signal processing circuit.

FIG. 3 is a block diagram illustrating the imaging device illustrated in FIGS. 1 and 2. FIG. 3 illustrates only pixels 11 in odd-number columns out of the pixels 11 illustrated in FIG. 2. The pixels 11 in each column of the first chip 1 have four signal lines 201(A) to 201(D). In the following descriptions, the signal lines 201(A) to 201(D) are simply referred to as the signal line 201 when the four signal lines are not to be distinguished. The pixel 11 in Row 1 is connected to the signal line 201(A). Similarly, the pixels 11 in Rows 2, 3, and 4 are connected to the signal lines 201(B), 201(C), and 201(D), respectively. The signal lines 201(A) to 201(D) are arranged in a similar way to those for the pixels 11 in Column 1.

The signal lines 201(A) and 201(C) are connected to a multiplexing circuit (hereinafter referred to as an MPX circuit) 350(A) in the signal processing circuit 21 via a connecting portion 303. The signal processing circuit 21 includes AD conversion circuits (hereinafter referred to as ADCs in the specification and drawings) 360(A) and 360(B). The MPX circuit 350(A) is a first selection unit having an input portion connected to the signal lines 201(A) and 201(C) and an output portion connected to the ADC 360(A).

The signal lines 201(B) and 201(D) are connected to an MPX circuit 350(B) in the signal processing circuit 21 via the connecting portion 303. The MPX circuit 350(B) is a second selection unit having an input portion connected to the signal lines 201(B) and 201(D) and an output portion connected to the ADC 360(B).

As illustrated in FIG. 3, all of the pixels 11 connected to the ADC 360(A) are pixels 11 each having the R color filter, and all of the pixels 11 connected to the ADC 360(B) are pixels 11 each having the G color filter. In this way, each of the plurality of first pixels 11 having the color filter with the first color (R) is not connected to the ADC 360(B) (second AD conversion unit) but connected to the ADC 360(A) (first AD conversion unit). Each of the plurality of first pixels 11 including a color filter with the second color (G) is not connected to the ADC 360(A) (first AD conversion unit) but connected to the ADC 360(B) (second AD conversion unit).

As illustrated in FIG. 3, the second chip 5 has a current source 310 for supplying a current to the signal lines 201 in each column via the connecting portion 303.

Cross-Sectional Structure Around Connecting Portion of Imaging Device

Figure 4:
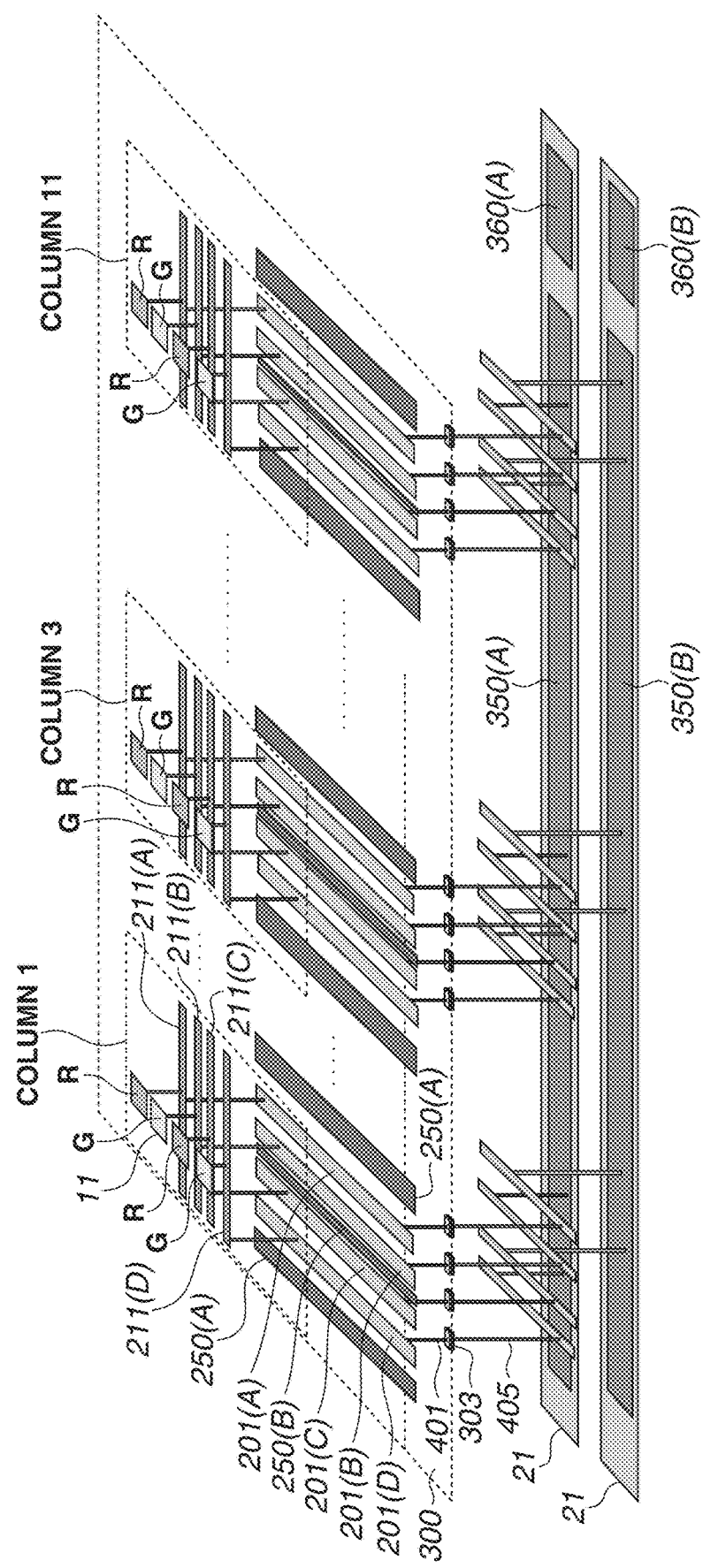
FIG. 4 illustrates connections between pixels, signal lines, and signal processing circuits.

FIG. 4 is a perspective view illustrating the imaging device illustrated in FIG. 3. FIG. 4 mainly illustrates the pixels 11 arranged in four rows and one column, and the pixel 11 in Row 1, Column 1. The first chip 1 and the second chip 5 illustrated in FIG. 1 are joined at a joint surface 300.

The imaging device according to the present exemplary embodiment is a back-side illumination imaging device. The pixel 11 includes a photoelectric conversion portion (not illustrated). Each of the signal lines 201(A) to 201(D) is arranged between the photoelectric conversion portion and the joint surface 300, and extends in a predetermined direction of the pixels 11 (first direction along the column as illustrated in FIG. 4). Wirings 211(A) to 211(D) extend in the direction (second direction) intersecting with the direction in which the signal lines 201(A) to 201(D) extend between the signal lines 201(A) to 201(D) and the photoelectric conversion portion, respectively. The wiring 211(A) is connected to the pixel 11 in Row 1 and the signal line 201(A). The wiring 211(B) is connected to the pixel 11 in Row 2 and the signal line 201(B). The wiring 211(C) is connected to the pixel 11 in Row 3 and the signal line 201(C). The wiring 211(D) is connected to the pixel 11 in Row 4 and the signal line 201(D). Each of the wirings 211(A) to 211(D) is arranged in a first wiring layer. Each of the signal lines 201(A) to 201(D) is arranged in a second wiring layer positioned more on the side of the second chip 5 than the first wiring layer, and is connected to the connecting portion 303 via connection wirings 401. The MPX circuit 350(A) is connected to the connecting portion 303 via a connection wiring 405. The connection wiring 401, the connection wiring 405, and the connecting portion 303 are arranged in an overlapped manner in a planar view. The connection between the signal processing circuit 21 and each signal line 201 can be made to the connection wiring 405 by forming the connection wiring 401 at overlapping positions in a planar view. Connecting each signal line 201 extending in a predetermined direction and the connection wiring 401 enables connecting the signal line 201 and the MPX circuit 350. Signal lines 201 extending in a predetermined direction make it easier to connect between the connection wiring 401 and the signal lines 201. Providing the wirings 211(A) to 211(D) enables connecting the pixels 11 in one column to the signal lines 201(A) to 201(D).

FIG. 4 illustrates a shield wiring 250(A) and a shield wiring 250(B) as a second shield wiring. The shield wiring 250(B) is arranged between the signal lines 201(B) and 201(C) along the direction in which these signal lines extend. The shield wiring 250(A) is arranged between the signal line 201(A) and the signal line 201(D) corresponding to the adjacent pixel column. Each of the shield wirings 250(A) and 250(B) is applied with a ground potential (GND voltage).

On the other hand, no shield wiring is arranged between the signal lines 201(A) and 201(B) and between the signal lines 201(C) and 201(D).

Figure 5A:
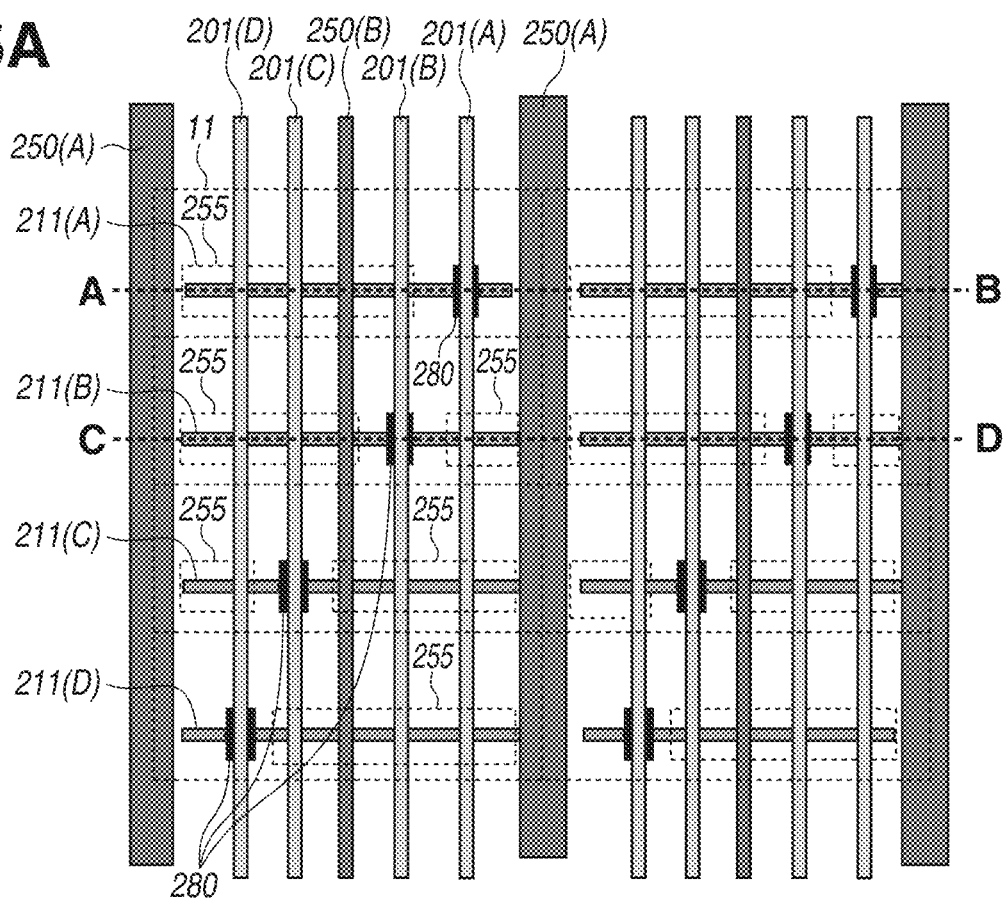
FIG. 5A is a plan view illustrating signal lines and shield wirings.

FIG. 5A is a top view illustrating the pixel 11 of the imaging device illustrated in FIG. 4 when viewed from the joint surface 300. In FIG. 5A, members similar to those illustrated in FIG. 4 are assigned the same reference numerals as those assigned in FIG. 4.

The signal line 201(A) is connected to the wiring 211(A) via a connecting portion 280 (via-plug). The wiring 211(A) is connected to the source region of a selection transistor 608 included in the pixel 11 to be described below with reference to FIG. 6. Since the drain region of the selection transistor 608 is connected to the source region of an amplification transistor 607 as a pixel output portion, the wiring 211(A) is a connection wiring electrically connected to the pixel output portion.

A third shield wiring 255 is arranged to extend along the direction in which the wiring 211(A) extends. The third shield wiring 255 is applied with a ground potential (GND potential).

Figure 5B:
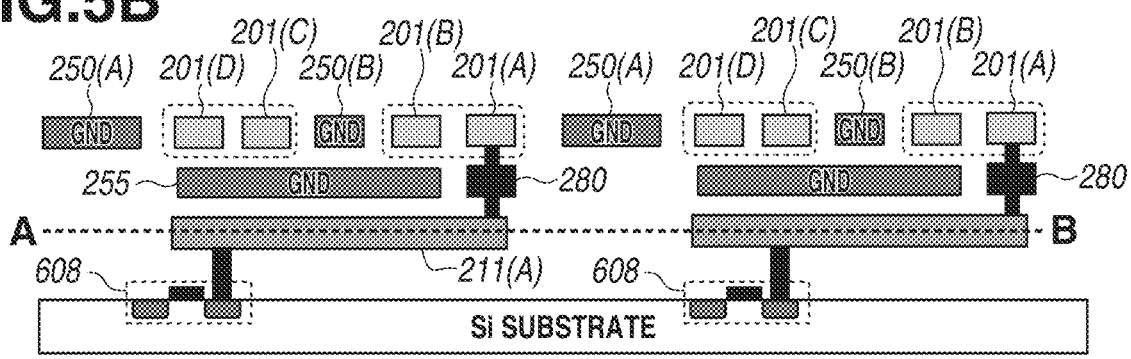
FIGS. 5B and 5C are cross-sectional views illustrating signal lines and shield wirings.

FIG. 5B is a cross-sectional view illustrating signal lines and shield wirings at the position taken along the line A-B illustrated in FIG. 5A.

The third shield wiring 255 is arranged in a third wiring layer between the wiring 211(A) arranged in the first wiring layer and the second wiring layer in which the signal line 201(A) is arranged. The third wiring layer is provided with the connecting portion 280.

The third shield wiring 255 is arranged across the signal line 201(B), the shield wiring 250(B), and the signal lines 201(C) and 201(D). This makes it possible to reduce the coupling capacitance between the signal lines 201(B), 201(C), and 201(D) and the wiring 211(A). Accordingly, the potential variations of the signal lines 201(B), 201(C), and 201(D) become hard to be propagated to the wiring 211(A).

The shield wiring 250(A) is wider than the shield wiring 250(B).

Figure 5C:
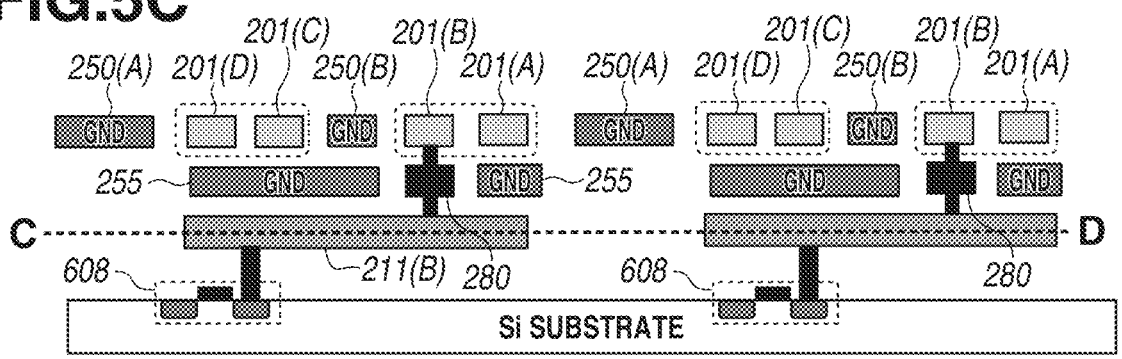

FIG. 5C is a cross-sectional view illustrating signal lines and shield wirings at the position taken along the line C-D illustrated in FIG. 5A. The configuration illustrated FIG. 5C differs from that illustrated in FIG. 5B in that each pixel 11 includes the plurality of third shield wirings 255. Accordingly, the potential variations of the signal lines 201(A), 201(C), and 201(D) become hard to be propagated to the wiring 211(B).

Equivalent Circuit of Pixel

Figure 6:
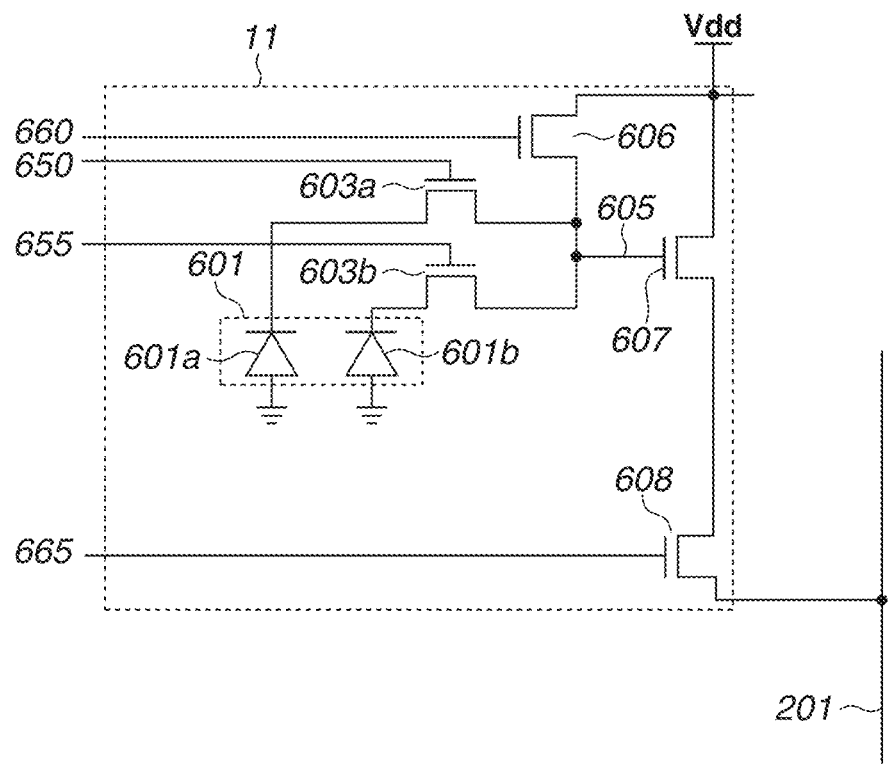
FIG. 6 is an equivalent circuit diagram illustrating a pixel.

FIG. 6 is an equivalent circuit diagram illustrating the pixel 11 according to the present exemplary embodiment. The pixel 11 includes photodiodes 601a and 601b as photoelectric conversion portions. Light transmits a micro lens (not illustrated) and color filters provided according to the arrangement illustrated in FIG. 2 and enters the photodiodes 601a and 601b. This means that the light incident onto the photodiode 601a and the light incident onto the photodiode 601b have substantially the same wavelength.

The photodiode 601a is connected to a floating diffusion portion (hereinafter referred to as a FD portion) 605 via a transfer transistor 603a. The gate of the transfer transistor 603a is connected to the vertical scanning circuit (not illustrated) via a control line 650.

The photodiode 601b is connected to the floating diffusion portion (hereinafter referred to as a FD portion) 605 via a transfer transistor 603b. The gate of the transfer transistor 603b is connected to the vertical scanning circuit (not illustrated) via a control line 655.

The FD portion 605 is connected to a reset transistor 606 and the gate of an amplification transistor 607 as a pixel output portion.

The reset transistor 606 and the amplification transistor 607 are supplied with a power voltage Vdd. The gate of the reset transistor 606 is connected to the vertical scanning circuit (not illustrated) via a control line 660.

The amplification transistor 607 is connected to the selection transistor 608. The gate of the selection transistor 608 is connected to the vertical scanning circuit (not illustrated) via a control line 665.

The selection transistor 608 is connected to a signal line 201.

The vertical scanning circuit also serves as a control unit for controlling the order of signals subjected to the AD conversion by the ADC 360.

Operations of Imaging Device: Imaging Mode

Figure 7:
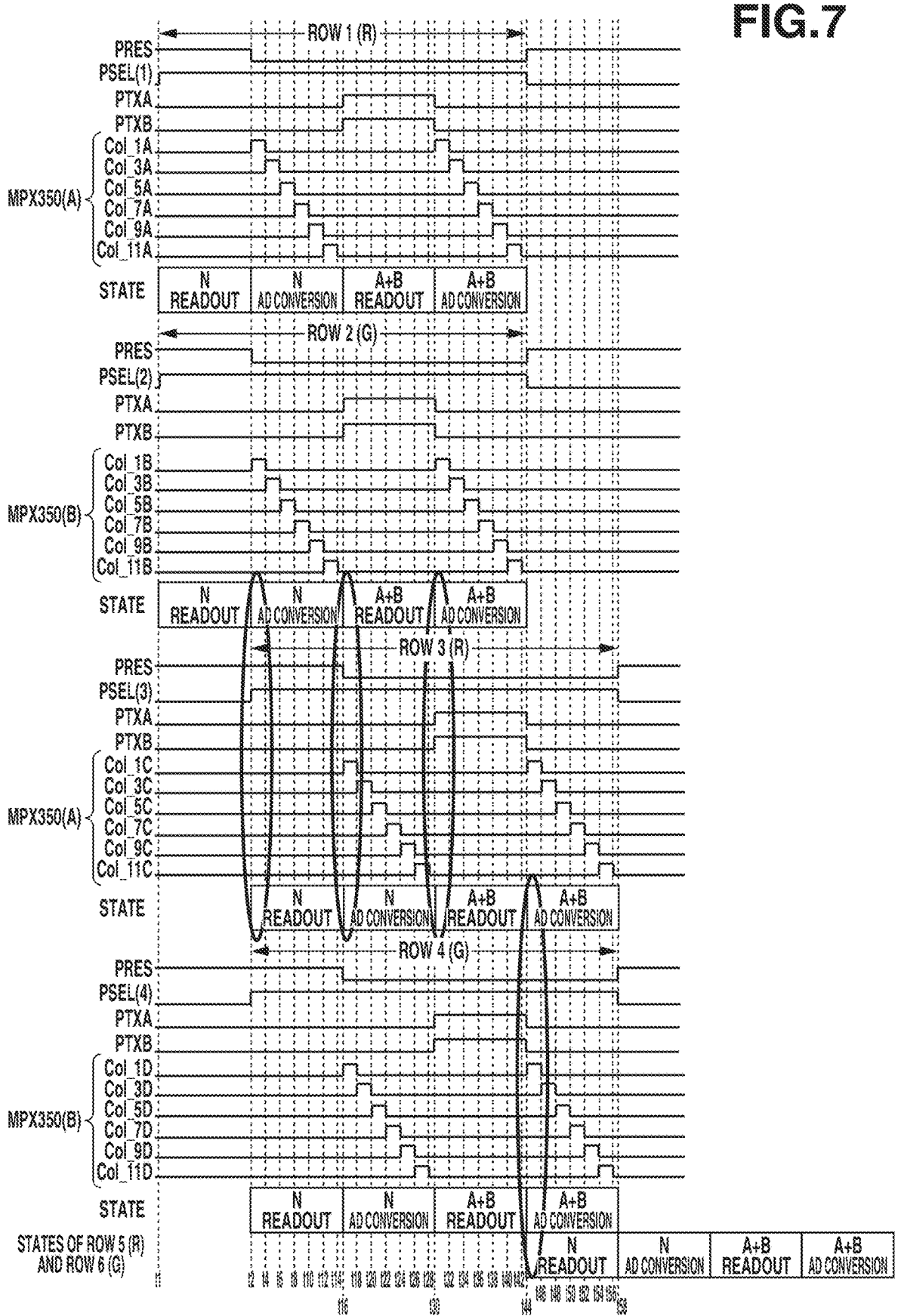
FIG. 7 is a timing chart illustrating operations of the imaging device.

FIG. 7 illustrates operations of the imaging device provided with the pixel 11 illustrated in FIG. 6. Operations illustrated in FIG. 7 do not output a focus detection signal but output an imaging signal. In other words, the pixel 11 does not output the first signal based on the signals of only a part of the plurality of photodiodes but outputs a second signal based on the signals of the plurality of photodiodes.

The signal PRES illustrated in FIG. 7 indicates a signal supplied from the vertical scanning circuit to the gate of the reset transistor 606 via the control line 660 illustrated in FIG. 6. Similarly, a signal PSEL indicates a signal supplied from the vertical scanning circuit to the gate of the selection transistor 608 of the pixel 11 in Row N via the control line 665. The trailing number of the signal PSEL indicates the row position of the pixel 11 to which the signal is output. For example, the signal PSEL(1) indicates the signal PSEL output to the pixel 11 in Row 1. The signal PTXA is a signal supplied from the vertical scanning circuit to the gate of the transfer transistor 603a via the control line 650. The signal PTXB is a signal supplied from the vertical scanning circuit to the gate of the transfer transistor 603b via the control line 655.

FIG. 7 illustrates operations related to the MPX circuits 350(A) and 350(B), and the ADCs 360(A) and 360(B). As illustrated in FIG. 3, signals of the pixels 11 having the R color filter positioned in each odd-number column out of Columns 1 to 12 in Rows 1 and 3 are input to the MPX circuit 350(A) and the ADC 360(A). As illustrated in FIG. 3, signals of the pixels 11 having the G color filter positioned in each odd-number column out of Columns 1 to 12 in Rows 2 and 4 are input to the MPX circuit 350(B) and the ADC 360(B). FIG. 7 illustrates operations of the pixels 11 positioned in each odd-number column out of Columns 1 to 12 in Rows 1 to 4.

Referring to FIG. 7, Col_nm indicates which columns the MPX circuits 350(A) and 350(B) select as columns for outputting signals to the ADCs 360(A) and 360(B), respectively. The notation "nm" is will be described below. n denotes the column number of the pixel 11. m denotes the alphabet (A to D) of the signal lines 201(A) to 201(D) arranged in association with the pixels 11 in one column. For example, Col_1A indicates the signal line 201(A) corresponding to the pixels 11 in Column 1.

The signal readout from the pixel 11 in Row 1 is performed in parallel with the signal readout from the pixel 11 in Row 2. The AD conversion on the signal of the pixel 11 in Row 1 is performed in parallel with the AD conversion on the signal of the pixel 11 in Row 2. The signal readout from the pixel 11 in Row 3 is performed in parallel with the signal readout from the pixel 11 in Row 4. The AD conversion on the signal of the pixel 11 in Row 3 is performed in parallel with the AD conversion on the signal of the pixel 11 in Row 4.

At a time t1, the vertical scanning circuit sets, to the High level, the signal PRES to be output to the pixel 11 in each of Rows 1 to 4. This turns ON the reset transistor 606 of the pixel 11 in Rows 1 to 4. Therefore, the FD portion 605 of the pixel 11 in each of Rows 1 to 4 is reset to the potential corresponding to the power voltage Vdd. At the time t1, the vertical scanning circuit sets the signals PSEL(1) and PSEL(2) to the High level. This turns ON each selection transistor 608 of the pixel 11 in each of Rows 1 and 2. Accordingly, the current supplied by the current source 310 illustrated in FIG. 3 is supplied to the amplification transistor 607 via the selection transistor 608 of the pixel 11 in each of Rows 1 and 2. Thus, a source follower circuit is formed by the power voltage Vdd, the amplification transistor 607, and the current source 310. More specifically, the amplification transistor 607 performs a source follower operation for outputting a signal corresponding to the potential of the FD portion 605 to the signal line 201 via the selection transistor 608.

Operation: Readout of N-Signal corresponding to Pixel 11 in each of Rows 1 and 2

At a time t2, the vertical scanning circuit sets, to the Low level, the signal PRES to be output to the pixel 11 in each of Rows 1 and 2. Then, the reset transistor 606 of the pixel 11 in each of Rows 1 and 2 turns OFF. Therefore, the reset state of the FD portion 605 is canceled. The amplification transistor 607 of the pixel 11 in Row 1 outputs, to the signal line 201(A) illustrated in FIG. 3, a signal based on the potential of the FD portion 605 of which the reset state has been canceled. The amplification transistor 607 of the pixel 11 in Row 2 outputs, to the signal line 201(B) illustrated in FIG. 3, a signal based on the potential of the FD portion 605 of which the reset was state has been canceled. This signal is referred to as an N-signal (noise signal). Accordingly, the N-signal is output from the pixel 11 to the signal line 201(A) in each column. The amplification transistor 607 of the pixel 11 in Row 2 outputs, to the signal line 201(B) illustrated in FIG. 3, a signal based on the potential of the FD portion 605 of which the reset state has been canceled. Accordingly, the N-signal is output from the pixel 11 to the signal line 201(B) in each column.

Operation: AD Conversion on N-Signal corresponding to Pixel 11 in each of Rows 1 and 2

After the time t2, the MPX circuit 350(A) sequentially connects, to the ADC 360(A), the signal line 201(A) corresponding to the pixel 11 in each odd-number column out of Columns 1 to 12 based on the signal MPX supplied from the timing generator. The MPX circuit 350(B) sequentially connects, to the ADC 360(B), the signal line 201(B) corresponding to the pixel 11 in each odd-number column out of Columns 1 to 12 based on the signal MPX supplied from the timing generator.

The ADC 360(A) performs the AD conversion on the noise signal of the signal line 201(A) in Column 1 output from the MPX circuit 350(A) to convert the noise signal into a digital signal. Subsequently, the ADC 360(A) sequentially performs the AD conversion on the noise signal output to the signal line 201(A) corresponding to the pixel 11 in each odd-number column out of Columns 1 to 12 to convert the noise signal into a digital signal.

The ADC 360(B) performs the AD conversion on the noise signal of the signal line 201(B) in Column 2 output from the MPX circuit 350(B) to convert the noise signal into a digital signal. Subsequently, the ADC 360(B) sequentially performs the AD conversion on the noise signal output to the signal line 201(B) corresponding to the pixel 11 in each odd-number column out of Columns 1 to 12 to convert the noise signal into a digital signal.

Operation: Readout of N-Signal corresponding to Pixel 11 in each of Rows 3 and 4

At a time t16, the vertical scanning circuit sets, to the Low level, the signal PRES to be output to the pixel 11 in each of Rows 3 and 4. Then, the reset transistor 606 of the pixel 11 in each of Rows 3 and 4 turns OFF. Therefore, the reset state of the FD portion 605 is canceled. The amplification transistor 607 of the pixel 11 in Row 3 outputs, to the signal line 201(C) illustrated in FIG. 3, the N-signal based on the potential of the FD portion 605 of which the reset state has been canceled. Accordingly, the N-signal is output from the pixel 11 to the signal line 201(C) in each column. The amplification transistor 607 of the pixel 11 in Row 4 outputs to the signal line 201(D) illustrated in FIG. 3 the N-signal based on the potential of the FD portion 605 of which the reset state has been canceled. Accordingly, the N-signal is output from the pixel 11 to the signal line 201(D) in each column.

Operation: AD Conversion on N-Signal corresponding to Pixel 11 in each of Rows 3 and 4

After the time t16, the MPX circuit 350(A) sequentially connects, to the ADC 360(A), the signal line 201(C) corresponding to the pixel 11 in each odd-number column out of Columns 1 to 12 based on the signal MPX supplied from the timing generator. The MPX circuit 350(B) sequentially connects, to the ADC 360(B), the signal line 201(D) corresponding to the pixel 11 in each odd-number column out of Columns 1 to 12 based on the signal MPX supplied from the timing generator.

The ADC 360(A) performs the AD conversion on the N-signal of the signal line 201(C) in Column 1 output from the MPX circuit 350(A) to convert the N-signal into a digital signal. Subsequently, the ADC 360(B) sequentially performs the AD conversion on the N-signal output to the signal line 201(C) corresponding to the pixel 11 in each odd-number column out of Columns 1 to 12 to convert the N-signal into a digital signal.

The ADC 360(B) performs the AD conversion on the N-signal of the signal line 201(D) in Column 1 output from the MPX circuit 350(B) to convert the N-signal into a digital signal. Subsequently, the ADC 360(B) sequentially performs the AD conversion on the N-signal output to the signal line 201(D) corresponding to the pixel 11 in each odd-number column out of Columns 1 to 12 to convert the N-signal into a digital signal.

Operation: Readout of A+B Signal corresponding to Pixel 11 in each of Rows 1 and 2

At the time t16, the vertical scanning circuit sets, to the High level, the signals PTXA and PTXB to be output to the pixel 11 in each of Rows 1 and 2. Then, the electric charges (electrons in the present exemplary embodiment) accumulated by the photodiodes 601a and 601b are transferred to the FD portion 605 via the transfer transistors 603a and 603b, respectively. In the FD portion 605, the electric charges of the photodiodes 601a and 601b are added. Accordingly, the FD portion 605 provides a potential corresponding to the sum of the electric charges of the photodiodes 601a and 601b. Assume that the amplification transistor 607 outputs an A-signal based on the potential of the FD portion 605 generated by the electric charge of only the photodiode 601a and outputs a B-signal based on the potential of the FD portion 605 generated by the electric charge of only the photodiode 601b. According to this notation, the signal output from the amplification transistor 607 based on the potential of the FD portion 605 corresponding to the sum of the electric charges of the photodiodes 601a and 601b can be regarded as an A+B signal indicating the sum of the A- and B-signals. The A+B signal of the pixel 11 in Row 1 is output to the signal line 201(A) in each column. The A+B signal is the second signal based on signals generated by a plurality of photodiodes. The second signal can be used as an imaging signal.

The A+B signal of the pixel 11 in Row 2 is output to the signal line 201(B) in each column.

Operation: AD Conversion on A+B Signal corresponding to Pixel 11 in each of Rows 1 and 2

After a time t30, the MPX circuit 350(A) sequentially connects, to the ADC 360(A), the signal line 201(A) corresponding to the pixel 11 in each odd-number column out of Columns 1 to 12 based on the signal MPX supplied from the timing generator. The MPX circuit 350(B) sequentially connects, to the ADC 360(B), the signal line 201(B) corresponding to the pixel 11 in each odd-number column out of Columns 1 to 12 based on the signal MPX supplied from the timing generator.

The ADC 360(A) performs the AD conversion on the A+B signal of the signal line 201(A) in Column 1 output from the MPX circuit 350(A) to convert the A+B signal into a digital signal. Subsequently, the ADC 360(A) sequentially performs the AD conversion on the A+B signal output to the signal line 201(A) corresponding to the pixel 11 in each odd-number column out of Columns 1 to 12 to convert the A+B signal into a digital signal.

The ADC 360(B) performs the AD conversion on the A+B signal of the signal line 201(B) in Column 1 output from the MPX circuit 350(B) to convert the A+B signal into a digital signal. Subsequently, the ADC 360(A) sequentially performs the AD conversion on the A+B signal output to the signal line 201(B) corresponding to the pixel 11 in each odd-number column out of Columns 1 to 12 to convert the A+B signal into a digital signal.

Operation: Readout of A+B Signal corresponding to Pixel 11 in each of Rows 3 and 4

At the time t30, the vertical scanning circuit sets, to the High level, the signals PTXA and PTXB to be output to the pixel 11 in each of Rows 3 and 4. Accordingly, the A+B signal of the pixel 11 in Row 3 is output to the signal line 201(C) in each column, and the A+B signal of the pixel 11 in Row 4 is output to the signal line 201(D) in each column.

Operation: AD Conversion on A+B Signal corresponding to Pixel 11 in each of Rows 3 and 4

After a time t44, the MPX circuit 350(A) sequentially connects, to the ADC 360(A), the signal line 201(C) corresponding to the pixel 11 in each odd-number column out of Columns 1 to 12 based on the signal MPX supplied from the timing generator. The MPX circuit 350(B) sequentially connects, to the ADC 360(B), the signal line 201(D) corresponding to the pixel 11 in each odd-number column out of Columns 1 to 12 based on the signal MPX supplied from the timing generator.

The ADC 360(A) performs the AD conversion on the A+B signal of the signal line 201(C) in Column 1 output from the MPX circuit 350(A) to convert the A+B signal into a digital signal. Subsequently, the ADC 360(A) sequentially performs the AD conversion on the A+B signal output to the signal line 201(C) corresponding to the pixel 11 in each odd-number column out of Columns 1 to 12 to convert the A+B signal into a digital signal.

The ADC 360(B) performs the AD conversion on the A+B signal of the signal line 201(D) in Column 1 output from the MPX circuit 350(B) to convert the A+B signal into a digital signal. Subsequently, the ADC 360(B) sequentially performs the AD conversion on the A+B signal output to the signal line 201(D) corresponding to the pixel 11 in each odd-number column out of Columns 1 to 12 to convert the A+B signal into a digital signal.

At the time t44, as indicated by "States of Row 5 (R) and Row 6 (G)", the vertical scanning circuit sets, to the High level, the signal PSEL to be output to the pixel 11 in each of Rows 5 and 6. Thus, the signal level of the signal line 201(A) changes from the level of the A+B signal of the pixel 11 in Row 1 to the level of a signal equivalent to the N-signal of the pixel 11 in Row 5. The signal level of the signal line 201(B) changes from the level of the A+B signal of the pixel 11 in Row 2 to the level of a signal equivalent to the N-signal of the pixel 11 in Row 6.

Parallel Operations Performed by Imaging Device in Operations Illustrated in FIG. 7

Characteristic effects of the present exemplary embodiment will be described below. Effects other than the effects will be described below.

In the operations illustrated in FIG. 7, the imaging device performs a plurality of operations in parallel as follows:
(1) Parallel operations of the AD conversion on the N-signal corresponding to the pixel 11 in Row 1 and the readout of the N-signal corresponding to the pixel 11 in Row 3
(2) Parallel operations of the AD conversion on the N-signal corresponding to the pixel 11 in Row 3 and the readout of the A+B signal corresponding to the pixel 11 in Row 1
(3) Parallel operations of the AD conversion on the A+B signal corresponding to the pixel 11 in Row 1 and the readout of the A+B signal corresponding to the pixel 11 in Row 3

These parallel operations make it possible to reduce the wait time period since the ADC 360(A) completes one AD conversion until it starts the following AD conversion. This makes it possible to shorten the time period required to perform the AD conversion on the signals output from all of the pixels 11. This enables increasing the frame rate of the imaging device.

Effects of Present Exemplary Embodiment

As illustrated in FIG. 4, the shield wiring 250(A) is arranged between the signal line 201(A) corresponding to the pixel 11 in Column 1 and the signal line 201(D) corresponding to the pixel 11 in Column 2 adjacent to Column 1. The shield wiring 250(B) is arranged between the signal line 201(B) corresponding to the pixel 11 in Column 1 and the signal line 201(C) corresponding to the pixel 11 in Column 1.

As described above, at the time t44, the vertical scanning circuit sets, to the High level, the signal PSEL of the pixel 11 in each of Rows 5 and 6. The following descriptions will be made focusing on the pixel 11 in Row 5. When the signal PSEL(5) is set to the High level, the vertical scanning circuit starts the readout of the signal of the pixel 11 in Row 5 to the signal line 201(A) in each column. Immediately before the time t44, the A+B signal of the pixel 11 in Row 1 was output to the signal line 201(A) in each column. Therefore, at the time t44, the potential will change from the A+B signal level of the pixel 11 in Row 1 to a signal level equivalent to the N-signal of the pixel 11 in Row 5. If the shield wiring 250(A) is not provided, the potential variation on the signal line 201(A) causes a potential variation on the signal line 201(D) through the coupling capacitance between the signal lines 201(A) and 201(D). During the time period between the time t44 and the time t56, the AD conversion is performed on the A+B signal of the pixel 11 in Row 4. Therefore, during this time period, the potential variation on the signal line 201(D) will degrade the AD conversion accuracy. On the other hand, according to the present exemplary embodiment, since the shield wiring 250(A) is provided between the signal lines 201(A) and 201(D), the potential variation on the signal line 201(D) can be restrained even with a large potential variation on the signal line 201(A).

The signal lines 201(B) and 201(C) operate in different phases. More specifically, at the time t2, in the time period during which the AD conversion is performed on the N-signal read to the signal line 201(B), the vertical scanning circuit starts the readout of the N-signal of the pixel 11 in Row 3 to the signal line 201(C). Therefore, at the time t2, the signal level of the signal line 201(C) changes to the signal level from the A+B signal level in the preceding row to the signal level equivalent to the N-signal. When the shield wiring 250(B) is not provided, the potential variation on the signal line 201(C) is propagated to the adjacent signal line 201(B) through the coupling capacitance. Therefore, the AD conversion accuracy of the N-signal of the signal line 201(B) degrades.

Similarly, at the time t16, in the time period during which the AD conversion is performed on the N-signal read to the signal line 201(C), the vertical scanning circuit starts the readout of the A+B signal to the signal line 201(B). More specifically, the signal level of the signal line 201(B) changes from the level of the N-signal to the level of the A+B signal. When the shield wiring 250(B) is not provided, the potential variation on the signal line 201(B) is transmitted to the adjacent signal line 201(C) through the coupling capacitance. Therefore, the AD conversion accuracy of the N-signal of the signal line 201(C) degrades.

Similarly, at the time t30, in the time period during which the AD conversion is performed on the A+B signal read to the signal line 201(B), the vertical scanning circuit starts the readout of the A+B signal to the signal line 201(C). More specifically, the signal level of the signal line 201(C) changes from the level of the N-signal to the level of the A+B signal. When the shield wiring 250(B) is not provided, the potential variation on the signal line 201(C) is transmitted to the adjacent signal line 201(B) through the coupling capacitance. Therefore, the AD conversion accuracy of the A+B signal of the signal line 201(B) degrades.

According to the present exemplary embodiment, the shield wiring 250(B) is provided between the signal lines 201(B) and 201(C). This makes it possible to reduce the coupling capacitance between the signal lines 201(B) and 201(C), hardly causing a potential variation between signal lines operating in different phases, i.e., a potential variation on one signal line hardly causes a potential variation on the other signal line. Thus, the AD conversion accuracy can be prevented from being degraded.

According to the present exemplary embodiment, the signal lines 201(A) and 201(B) are driven so that, in the time period during which the AD conversion is performed on the signal of one signal line 201, the potential variation on the other signal line 201 becomes hard to occur. More specifically, in the time period during which the AD conversion is performed on the A+B signal of the signal line 201(B), the signal level of the signal line 201(A) maintains the signal level of the A+B signal. Therefore, the shield wiring can be omitted between the signal lines 201(A) and 201(B).

In the operations illustrated in FIG. 7, the signal lines 201(A) and 201(B) are wired so as to operate in phase. "In phase" refers to a state where two or more signal levels synchronously start changing. More specifically, in the operations at the time t2 to t16 and the time t30 to t42, the signal lines A and B operate in phase. More specifically, the timing for starting the readout of the signal of the pixel 11 in a certain row to the signal line 201(A) is synchronized with the timing for starting the readout of the signal of the pixel 11 in another row to the signal line 201(B). The signal lines 201(C) and 201(D) are wired so as to operate in phase in the operations illustrated in FIG. 7. More specifically, in the operations at the time t16 to t28 and the time t44 to t56, the signal lines C and D operate in phase. More specifically, the timing for starting the readout of the signal of the pixel 11 in a certain row to the signal line 201(C) is synchronized with the timing for starting the readout of the signal of the pixel 11 in another row to the signal line 201(D). According to the present exemplary embodiment, this configuration hardly causes a potential variation between the signal lines 201(A) and 201(B) operating in phase and between the signal lines 201(C) and 201(D) operating in phase, i.e., a potential variation on one signal line hardly causes a potential variation on the other signal line. Therefore, according to the present exemplary embodiment, the shield wiring can be omitted between the signal lines 201(A) and 201(B) and between the signal lines 201(C) and 201(D). This means that the shield wiring can be omitted between the signal lines operating in phase. Omitting shield wires makes it possible to reduce the wiring area of the shield wirings in comparison with a case where shield wirings are arranged between all of the plurality of signal lines 201.

In this way, the imaging device according to the present exemplary embodiment can suitably restrain the parasitic capacitance between a plurality of wirings while restraining the increase in the wiring area of the shield wirings.

Operation of Imaging Device: Focus Detection+Imaging Mode

Figure 8:
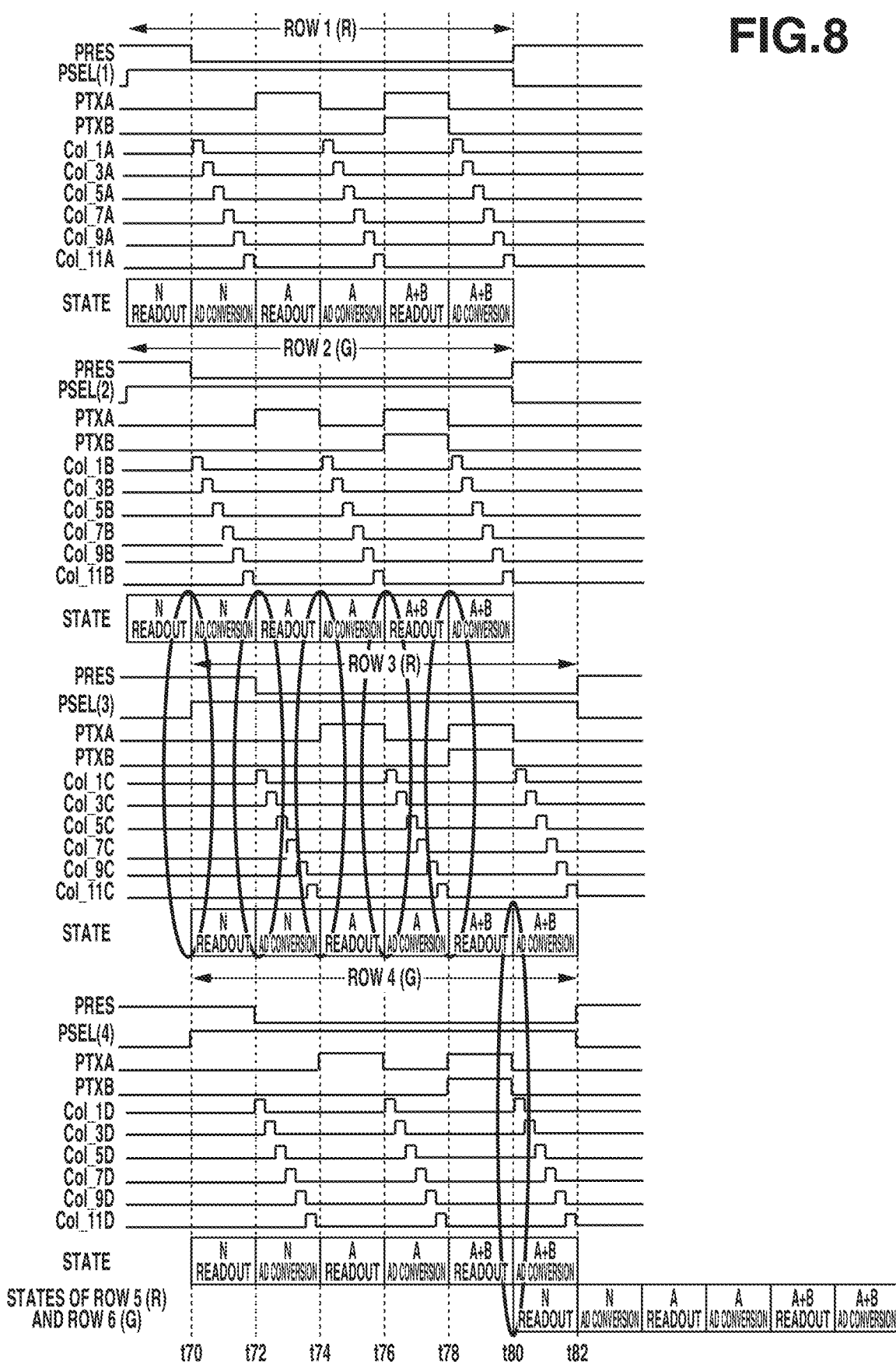
FIG. 8 is another timing chart illustrating operations of the imaging device.

FIG. 8 illustrates other operations of the imaging device having the pixel 11 illustrated in FIG. 6. In the operations illustrated in FIG. 8, the pixel 11 outputs both the focus detection signal and the imaging signal. More specifically, the pixel 11 outputs both the first signal based on the signals of only a part of the plurality of photodiodes and the second signal based on the signals of the plurality of photodiodes. The photoelectric conversion period corresponding to the A-signal at least partially overlaps with the photoelectric conversion period corresponding to the A+B signal. More specifically, referring to FIG. 8, the time period from at least a time t70 to a time t74 is overlapped. Actually, the time period since a photodiode reset is performed to reset the electric charges of the photodiodes 601a and 601b (before the time t70) until the electric charge of the photodiode 601a are transferred to the FD portion 605 is overlapped.

Operations until a time t72 can be similar to the operations until the time t16 illustrated in FIG. 7.

Operation: Readout of A-Signal corresponding to Pixel 11 in each of Rows 1 and 2

At the time t72, the vertical scanning circuit sets, to the High level, the signal PTXA to be output to the pixel 11 in each of Rows 1 and 2. Then, the electric charge accumulated by the photodiode 601a is transferred to the FD portion 605 via the transfer transistor 603a. Accordingly, the FD portion 605 provides a potential corresponding to the electric charge of the photodiode 601a. The A-signal of the pixel 11 in Row 1 is output to the signal line 201(A) in each column, and the A-signal of the pixel 11 in Row 2 is output to the signal line 201(B) in each column. The A-signal is the first signal based on the signals of only a part of the plurality of photodiodes. The first signal can be used as a focus detection signal.

Operation: AD Conversion on A-Signal corresponding to Pixel 11 in Row 1

After the time t74, the MPX circuit 350(A) sequentially connects, to the ADC 360(A), the signal line 201 (A) corresponding to the pixel 11 in each odd-number column out of Columns 1 to 12 based on the signal MPX supplied from the timing generator.

The ADC 360(A) performs the AD conversion on the A-signal of the signal line 201(A) in Column 1 output from the MPX circuit 350(A) to convert the A-signal into a digital signal. Subsequently, the ADC 360(A) sequentially performs the AD conversion on the A-signal output to the signal line 201(A) corresponding to the pixel 11 in each odd-number column out of Columns 1 to 12 to convert the A-signal into a digital signal.

After the time t74, the MPX circuit 350(B) sequentially connects, to the ADC 360(B), the signal line 201(B) corresponding to the pixel 11 in each odd-number column out of Columns 1 to 12 based on the signal MPX supplied from the timing generator.

The ADC 360(B) performs the AD conversion on the A-signal of the signal line 201(B) in Column 1 output from the MPX circuit 350(B) to convert the A-signal into a digital signal. Subsequently, the ADC 360(B) sequentially performs the AD conversion on the A-signal output to the signal line 201(B) corresponding to the pixel 11 in each odd-number column out of Columns 1 to 12 to convert the A-signal into a digital signal.

Operation: Readout of A-Signal corresponding to Pixel 11 in each of Rows 3 and 4

At the time t74, the vertical scanning circuit sets, to the High level, the signal PTXA to be output to the pixel 11 in each of Rows 3 and 4. Accordingly, the A-signal of the pixel 11 in Row 3 is output to the signal line 201(C) in each column, and the A-signal of the pixel 11 in Row 4 is output to the signal line 201(D) in each column.

Operation: AD Conversion on A+B Signal corresponding to Pixel 11 in each of Rows 3 and 4

After a time t76, the MPX circuit 350(A) sequentially connects, to the ADC 360(A), the signal line 201(C) corresponding to the pixel 11 in each odd-number column out of Columns 1 to 12 based on the signal MPX supplied from the timing generator.

The ADC 360(A) performs the AD conversion on the A-signal of the signal line 201(C) in Column 1 output from the MPX circuit 350(A) to convert the A-signal into a digital signal. Subsequently, the ADC 360(A) sequentially performs the AD conversion on the A-signal output to the signal line 201(C) corresponding to the pixel 11 in each odd-number column out of Columns 1 to 12 to convert the A-signal into a digital signal.

After the time t76, the MPX circuit 350(B) sequentially connects, to the ADC 360(B), the signal line 201(D) corresponding to the pixel 11 in each odd-number column out of Columns 1 to 12 based on the signal MPX supplied from the timing generator.

The ADC 360(B) performs the AD conversion on the A-signal of the signal line 201(D) in Column 1 output from the MPX circuit 350(B) to convert the A-signal into a digital signal. Subsequently, the ADC 360(B) sequentially performs the AD conversion on the A-signal output to the signal line 201(D) corresponding to the pixel 11 in each odd-number column out of Columns 1 to 12 to convert the A-signal into a digital signal.

Operation: Readout of A+B Signal corresponding to Pixel 11 in each of Rows 1 and 2

Before the time t76, the FD portion 605 of the pixel 11 in each of Rows 1 and 2 holds the electric charge generated by the photodiode 601a when the signal PTXA changes from the High level to the Low level at the time t74.

In a state where the FD portion 605 holds the electric charge of the photodiode 601a, at the time t76, the vertical scanning circuit sets, to the High level, the signals PTXA and PTXB to be output to the pixel 11 in each of Rows 1 and 2, respectively. The electric charge accumulated by the photodiode 601b and the electric charge accumulated by the photodiode 601a from the time t74 to the time t76 are transferred to the FD portion 605 via the transfer transistors 603a and 603b, respectively. In the FD portion 605, the electric charges of the photodiodes 601a and 601b are added. Accordingly, the FD portion 605 provides a potential corresponding to the sum of the electric charges of the photodiodes 601a and 601b. The A+B signal of the pixel 11 in Row 1 is output to the signal line 201(A) in each column, and the A+B signal of the pixel 11 in Row 2 is output to the signal line 201(B) in each column.

Operation: AD Conversion on A+B Signal corresponding to Pixel 11 in each of Rows 1 and 2

After a time t78, the MPX circuit 350(A) sequentially connects, to the ADC 360(A), the signal line 201(A) corresponding to the pixel 11 in each odd-number column out of Columns 1 to 12 based on the signal MPX supplied from the timing generator.

The ADC 360(A) performs the AD conversion on the A+B signal of the signal line 201(A) in Column 1 output from the MPX circuit 350(A) to convert the A+B signal into a digital signal. Subsequently, the ADC 360(A) sequentially performs the AD conversion on the A+B signal output to the signal line 201(A) corresponding to the pixel 11 in each odd-number column out of Columns 1 to 12 to convert the A+B signal into a digital signal.

After the time t78, the MPX circuit 350(B) sequentially connects, to the ADC 360(B), the signal line 201(B) corresponding to the pixel 11 in each odd-number column out of Columns 1 to 12 based on the signal MPX supplied from the timing generator.

The ADC 360(B) performs the AD conversion on the A+B signal of the signal line 201(B) in Column 1 output from the MPX circuit 350(B) to convert the A+B signal into a digital signal. Subsequently, the ADC 360(B) sequentially performs the AD conversion on the A+B signal output to the signal line 201(B) corresponding to the pixel 11 in each odd-number column out of Columns 1 to 12 to convert the A+B signal into a digital signal.

Operation: Readout of A+B Signal corresponding to Pixel 11 in each of Rows 3 and 4

At the time t78, the vertical scanning circuit sets, to the High level, the signals PTXA and PTXB to be output to the pixel 11 in each of Rows 3 and 4, respectively. Accordingly, the A+B signal of the pixel 11 in Row 3 is output to the signal line 201(C) in each column, and the A+B signal of the pixel 11 in Row 4 is output to the signal line 201(D) in each column.

Operation: AD Conversion on A+B Signal corresponding to Pixel 11 in each of Rows 3 and 4

After a time t80, the MPX circuit 350(A) sequentially connects, to the ADC 360(A), the signal line 201(C) corresponding to the pixel 11 in each odd-number column out of Columns 1 to 12 based on the signal MPX supplied from the timing generator.

The ADC 360(A) performs the AD conversion on the A+B signal of the signal line 201(C) in Column 1 output from the MPX circuit 350(A) to convert the A+B signal into a digital signal. Subsequently, the ADC 360(A) sequentially performs the AD conversion on the A+B signal output to the signal line 201(C) corresponding to the pixel 11 in each odd-number column out of Columns 1 to 12 to convert the A+B signal into a digital signal.

After the time t80, the MPX circuit 350(B) sequentially connects, to the ADC 360(B), the signal line 201(D) corresponding to the pixel 11 in each odd-number column out of Columns 1 to 12 based on the signal MPX supplied from the timing generator.

The ADC 360(B) performs the AD conversion on the A+B signal of the signal line 201(D) in Column 1 output from the MPX circuit 350(B) to convert the A+B signal into a digital signal. Subsequently, the ADC 360(B) sequentially performs the AD conversion on the A+B signal output to the signal line 201(D) corresponding to the pixel 11 in each odd-number column out of Columns 1 to 12 to convert the A+B signal into a digital signal.

Effects of Present Exemplary Embodiment

In the focus detection and imaging operation illustrated in FIG. 8, similar to the imaging operation illustrated in FIG. 7, the imaging device according to the present exemplary embodiment operates the signal lines 201(A) and 201(B) in phase. The imaging device according to the present exemplary embodiment also operates the signal lines 201(C) and 201(D) in phase. On the other hand, the imaging device according to the present exemplary embodiment operates the signal lines 201(B) and 201(C) in different phases. The signal lines 201(A) and 201(D) also operate in different phases.

A case where the shield wiring 250(B) is not provided will be described below. In the imaging operation illustrated in FIG. 7, there are four timings (at the time t2, t16, t30, and t44) when the potential variation on one of the signal lines 201(B) and 201(C) causes a potential variation on the other signal line through the coupling capacitance. In the focus detection and imaging operation illustrated in FIG. 8, when the shield wiring 250(B) is not provided, there are six such timings (time t70, t72, t74, t76, t78, and t80).

According to the present exemplary embodiment, the shield wiring 250(B) is provided between the signal lines 201(B) and 201(C). This makes it possible to reduce the coupling capacitance between the signal lines 201(B) and 201(C), hardly causing a potential variation between signal lines operating in different phases, i.e., a potential variation on one signal line hardly causes a potential variation on the other signal line. Accordingly, the AD conversion accuracy can be prevented from being degraded.

As illustrated in FIG. 4, the shield wiring 250(A) is arranged between the signal line 201(A) corresponding to the pixel 11 in Column 1 and the signal line 201(D) corresponding to the pixel 11 in Column 2 adjacent to Column 1. The shield wiring 250(B) is arranged between the signal line 201(B) corresponding to the pixel 11 in Column 1 and the signal line 201(C) corresponding to the pixel 11 in Column 1. Also, in the focus detection and imaging operation, this configuration hardly causes a potential variation between signal lines operating in different phases, i.e., a potential variation on one signal line hardly causes a potential variation on the other signal line.

According to the present exemplary embodiment, there are provided signal lines operating in phase also in the focus detection and imaging operation. Shield wirings are omitted between the signal lines 201(A) and 201(B) and between the signal lines 201(C) and 201(D). Omitting shield wires makes it possible to reduce the wiring area of the shield wirings in comparison with a case where shield wirings are arranged between all of the plurality of signal lines 201.

In this way, the imaging device according to the present exemplary embodiment can suitably restrain the parasitic capacitance between a plurality of wirings while restraining the increase in the wiring area of the shield wirings.

Additional Effects of Present Exemplary Embodiment: Reduced Number of Operation Mode Changes Additional Effects of the imaging device according to the present exemplary embodiment will be described below.

After performing the AD conversion on the A-signal of the pixel 11 in Row 1 and before performing the AD conversion on the A+B signal of the pixel 11 in Row 1, the imaging device according to the present exemplary embodiment performs the AD conversion on the A-signal of the pixel 11 in Row 2. In the AD conversion on the A-signal and the AD conversion on the A+B signal, the operation mode of ADC 360 is changed, for example, correction parameters are changed. This configuration produces a wait time for number-of-bits switching control or causes a correction parameter change due to the operation mode change of each ADC 360. Examples of correction parameter changes include the change of the correction parameter of the reference voltage VRF in a case of a successive approximation comparator according to a fourth exemplary embodiment (described below). The AD conversion of the signals of the pixels 11 in two rows will be focused below. In this case, the operation mode needs to be changed three times: between the AD conversion on the A-signal and the AD conversion on the A+B signal in Row 1, between the AD conversion on the A+B signal in Row 1 and the AD conversion on the A-signal in Row 2, and between the AD conversion on the A-signal and the AD conversion on the A+B signal in Row 2. When N pixel rows are subjected to the AD conversion, the operation mode needs to be changed 2N−1 times. If N=8, the operation mode needs to be changed 15 times. On the other hand, after performing the AD conversion on the A-signal of the pixel 11 in Row 1 and before performing the AD conversion on the A+B signal of the pixel 11 in Row 1, the imaging device according to the present exemplary embodiment performs the AD conversion on the A-signal of the pixel 11 in Row 2. This operation changes the operation mode (N/M)−1+(N/M)=(2N/M)−1 times, where M denotes the number of signal lines 201 connected to each ADC 360. According to the present exemplary embodiment, the operation mode is changed 3 times since N=8 and M=4. More specifically, after sequentially performing the AD conversion on the A-signal of the pixel 11 in each of Rows 1 to 4, the imaging device changes the operation mode (first change) and sequentially performs the AD conversion on the A+B signal of the pixel 11 in each of Rows 1 to 4. Then, the imaging device changes the operation mode (second change) and sequentially performs the AD conversion on the A-signal of the pixel 11 in each of Rows 5 to 8. Then, the imaging device changes the operation mode (third change) and sequentially performs the AD conversion on the A+B signal of the pixel 11 in each of Rows 5 to 8. Therefore, when the AD conversion on the A and the A+B signals of the pixel 11 in Row 1 is sequentially performed, the operation mode needs to be changed 15 times. On the other hand, according to the present exemplary embodiment, the operation mode needs to be changed only three times. As described above, the signal readout method according to the present exemplary embodiment can be said to be suitable for changing the operation mode of the AD conversion on the A and A+B signals.

Additional Effects of Present Exemplary Embodiment: Parallel Operations of Imaging Device in Operations Illustrated in FIG. 8

In the operations illustrated in FIG. 8, the imaging device performs a plurality of operations in parallel as follows:
(1) Parallel operations of the AD conversion on the N-signal corresponding to the pixel 11 in Row 1 and the readout of the N-signal corresponding to the pixel 11 in Row 3
(2) Parallel operations of the AD conversion on the N-signal corresponding to the pixel 11 in Row 3 and the readout of the A-signal corresponding to the pixel 11 in Row 1
(3) Parallel operations of the AD conversion on the A-signal corresponding to the pixel 11 in Row 1 and the readout of the A-signal corresponding to the pixel 11 in Row 3
(4) Parallel operations of the AD conversion on the A-signal corresponding to the pixel 11 in Row 3 and the readout of the A+B signal corresponding to the pixel 11 in Row 1
(5) Parallel operations of the AD conversion on the A+B signal corresponding to the pixel 11 in Row 1 and the readout of the A+B signal corresponding to the pixel 11 in Row 3

In particular, the imaging device according to the present exemplary embodiment performs the parallel operations (4). This parallel operations make it possible to reduce the wait time period since the ADC 360(A) completes one AD conversion until it starts the following AD conversion. In particular, the A+B signal corresponds to the total electric charge indicating the sum of the electric charges of the plurality of photodiodes and therefore tends to provide a larger amplitude than the A-signal. Accordingly, the time required for signal settlement in a case where the A+B signal is output to the signal lines 201 tends to be longer than that in a case where the A-signal is output to the signal lines 201. Therefore, the time period during which the A+B signal in Row 1 is read to the signal lines 201, which needs longer settlement time, is overlapped with the time period during which the AD conversion is performed on the A-signal in Row 2. In this way, the time period during which the A+B signal in Row 1 is read to the signal lines 201, which needs longer settlement time, hardly limits the operating speed of the imaging device.

This makes it possible to shorten the time period required to perform the AD conversion on the signals output from all of the pixels 11. This enable increasing the frame rate and the number of pixels of the imaging device.

Additional Effects of Present Exemplary Embodiment: ADC Applicable to Pixel Color Filters In the imaging device according to the present exemplary embodiment, as described above, all of the pixels 11 connected to the ADC 360(A) are pixels 11 having the R color filter, and all of the pixels 11 connected to the ADC 360(B) are pixels 11 having the G color filter. In this way, each of the plurality of first pixels 11 having the color filter with the first color (R) is not connected to the ADC 360(B) (second AD conversion unit) but connected to the ADC 360(A) (first AD conversion unit). Each of the plurality of first pixels 11 having the color filter with the second color (G) is not connected to the ADC 360(A) (first AD conversion unit) but connected to the ADC 360(B) (second AD conversion unit).

This configuration allows each ADC to support only one color of light corresponding to the signal subjected to the AD conversion. In an imaging device having the plurality of ADCs, correction processing for the AD conversion or correction processing after the AD conversion may be required to cope with the variation in the AD conversion characteristics for each ADC. The correction processing for the AD conversion includes, for example, the correction of a reference signal used by the ADCs. The correction processing after the AD conversion includes, for example, the correction of a digital signal. If one ADC supports a plurality colors of light corresponding to the signal subjected to the AD conversion, it may be necessary to prepare correction parameters corresponding to each of the plurality of colors. Accordingly, there is a problem that the correction processing for the AD conversion and the correction processing after the AD conversion become complicated.

On the other hand, in the imaging device according to the present exemplary embodiment, one ADC supports only one color of light corresponding to the signal subjected to the AD conversion. In this way, the imaging device according to the present exemplary embodiment has an effect that the correction processing for the AD conversion and the correction processing after the AD conversion can be simplified.

As described above, the present exemplary embodiment can offer an imaging device provided with a suitable connection relationship between pixels and AD conversion units in a case where the plurality of first pixels includes the color filter of the first color and the plurality of second pixels includes the color filter of the second color.

Other Exemplary Embodiments: Changing Color of Pixels Subjected to AD Conversion by Each ADC in Frame Units The present exemplary embodiment has specifically been described above centering on an example where the signal lines 201, which are connected with the pixels 11 having the color filters with the first color and not connected with the pixels 11 having the color filters with the second color, are connected to one ADC 360. In this example, there is provided no connecting portion through which the ADC 360 and the pixels 11 having the color filter with the second color are connected.

An imaging device according to a second exemplary embodiment will be described below centering on differences from that according to the first exemplary embodiment.

Figure 9:
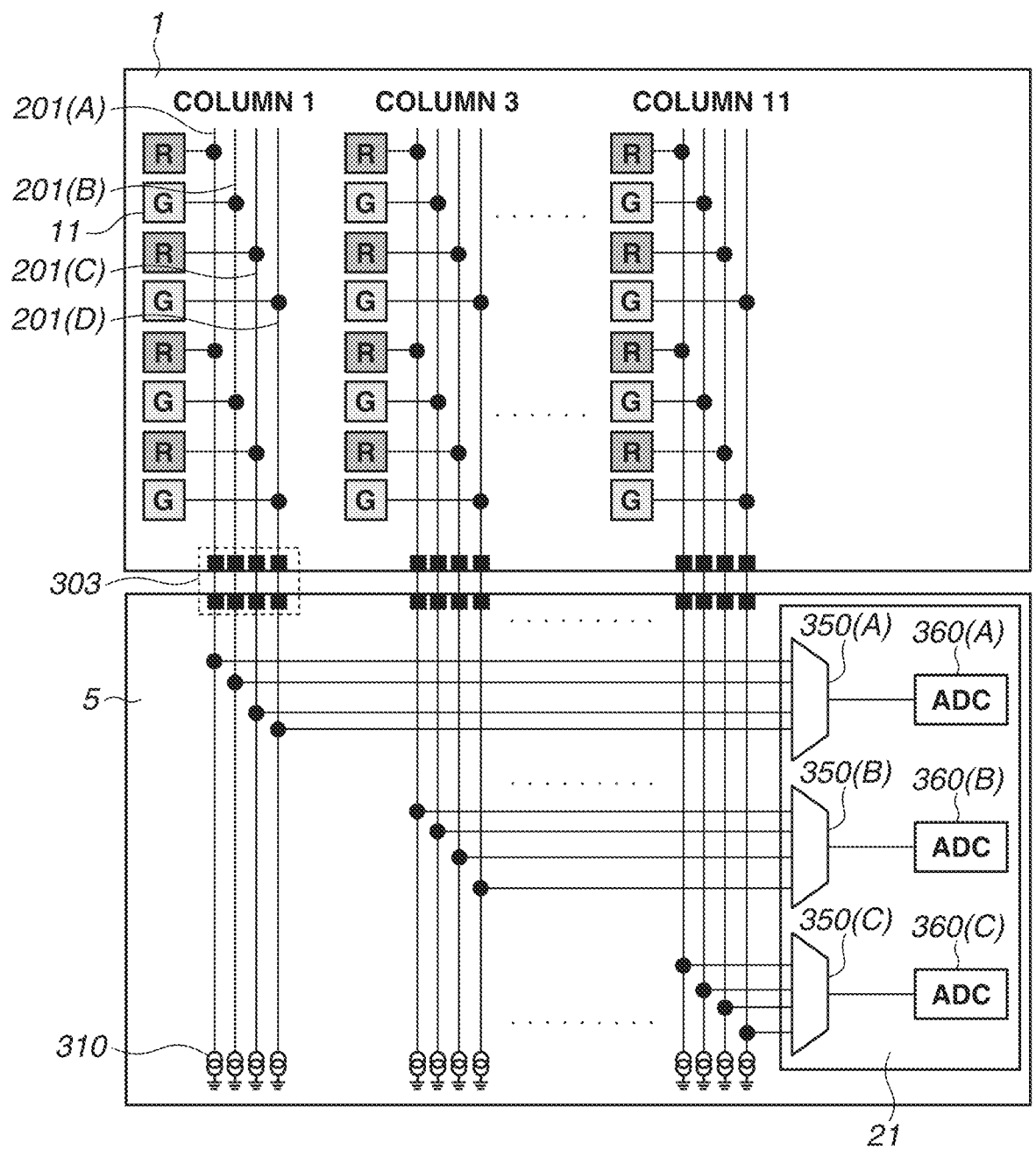
FIG. 9 is a block diagram illustrating pixels and a signal processing circuit.

FIG. 9 is a block diagram illustrating the imaging device according to the present exemplary embodiment. In the imaging device according to the present exemplary embodiment, the plurality of signal lines 201(A) to 201(D) is provided for the pixels 11 in one column. The plurality of signal lines 201(A) to 201(D) arranged in association with the pixels 11 in one column is connected to the one MPX circuit 350(A). The output of the MPX circuit 350(A) is input to the ADC 360(A).

The layout of the shield wirings 250 and the signal lines 201 according to the present exemplary embodiment is similar to those illustrated in FIGS. 5A, 5B, and 5C.

Figure 10:
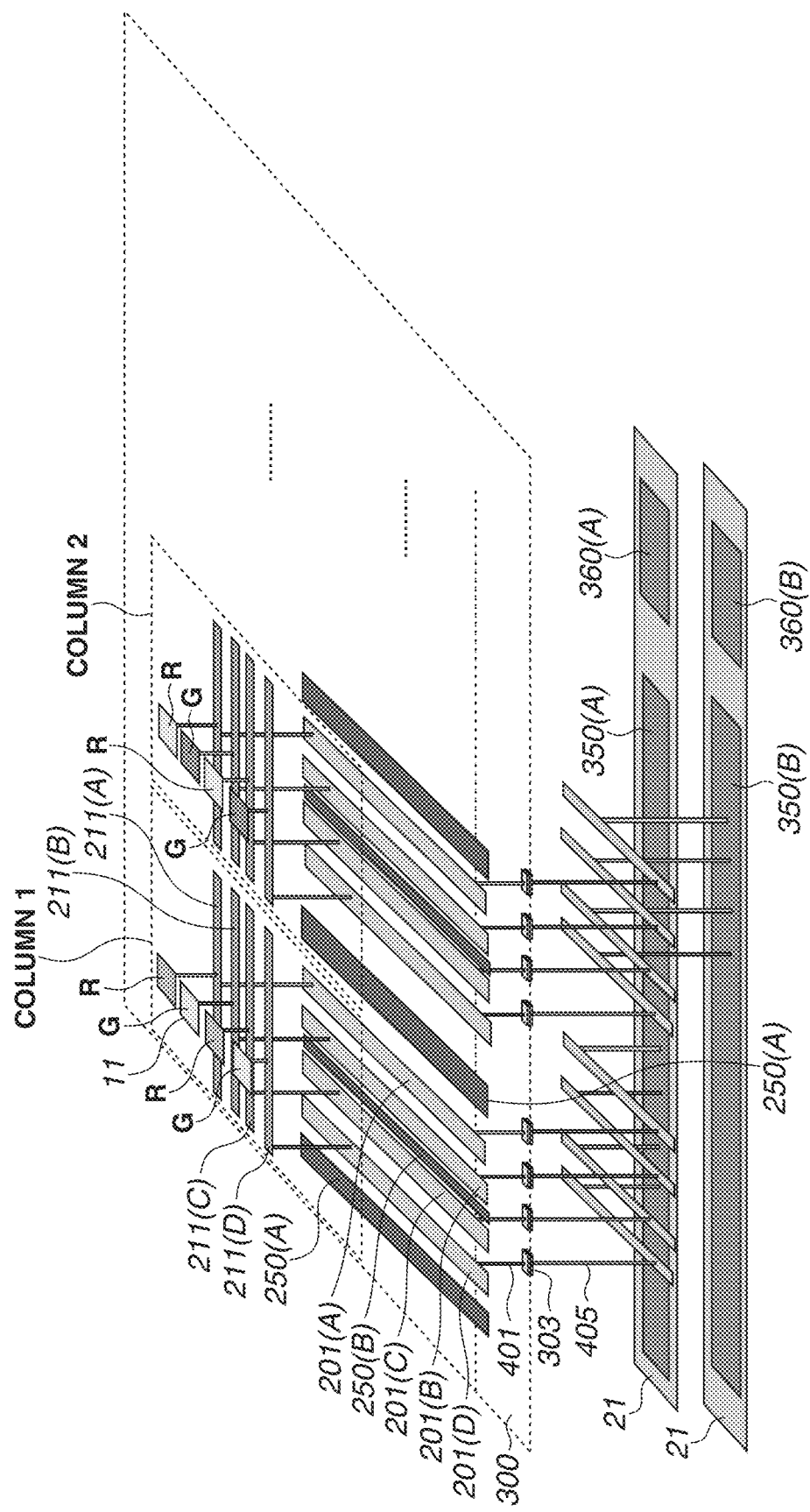
FIG. 10 illustrates connections between pixels, signal lines, and signal processing circuits.

FIG. 10 illustrates a layout of connections from the pixel 11 to the signal processing circuit 21 of the imaging device according to the present exemplary embodiment. The layout of connections of the imaging device according to the present exemplary embodiment differs from that illustrated in FIG. 4 in that, on the second chip 5, the connecting portions 303 corresponding to the pixels 11 in one column are connected to a common MPX circuit 350. Other points are similar to those in the layout of connections illustrated in FIG. 4.

Operations of Imaging device: Imaging Mode

Figure 11:
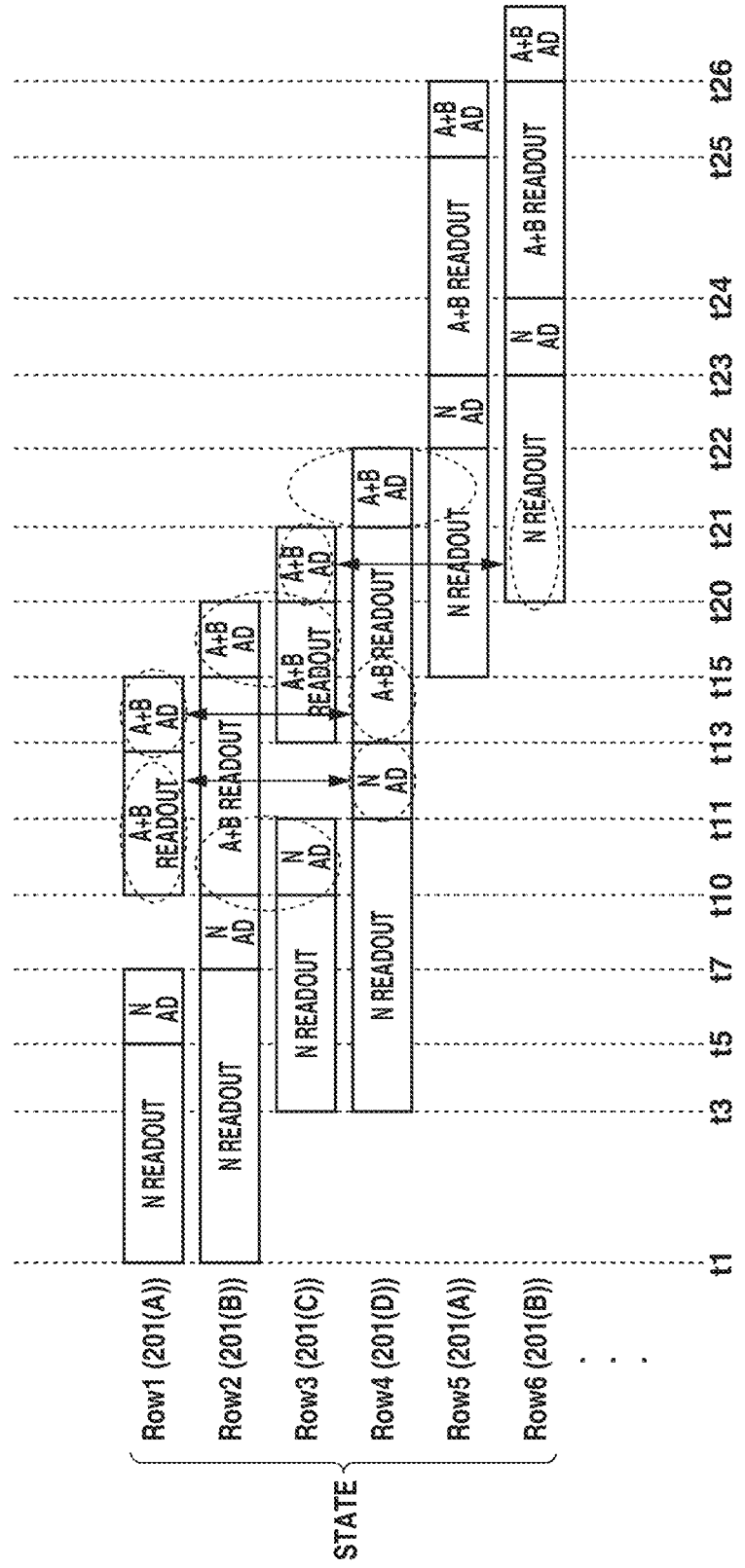
FIG. 11 illustrates operations of the imaging device.

FIG. 11 illustrates operations of the imaging device illustrated in FIG. 9. Description will be made centering on differences from the operation illustrated in FIG. 7. The imaging device performs the operations illustrated in FIG. 11 to output the imaging signal. Referring to FIG. 11, signal processing for the pixel 11 in each row is referred to as a state. Operations in each state are similar to the operations illustrated in FIG. 7.

The MPX circuit 350(A) illustrated in FIG. 9 sequentially outputs, to the ADC 360(A), the signals of the plurality of signal lines 201(A) to 201(D) arranged in association with the pixels 11 in one column. FIG. 11 illustrates signals output from the MPX circuit 350(A) as Row_n, where n denotes the pixel row number corresponding to each signal to be output to the ADC 360(A) by the MPX circuit 350(A). More specifically, Row_1 set to the High level indicates that the MPX circuit 350(A) is outputting, to the ADC 360(A), the signal output to the signal line 201(A) by the pixel 11 in Row 1.

Operation: Readout of N-Signal corresponding to Pixel 11 in each Row

At a time t1, the vertical scanning circuit starts the readout of the N-signal of the pixel 11 in each of Rows 1 and 2. Then, the N-signal of the pixel 11 in Row 1 is read to the signal line 201(A), and the N-signal of the pixel 11 in Row 2 is read to the signal line 201(B).

At a time t3, the vertical scanning circuit starts the readout of the N-signal of the pixel 11 in each of Rows 3 and 4. Then, the N-signal of the pixel 11 in Row 3 is read to the signal line 201(C), and the N-signal of the pixel 11 in Row 4 is read to the signal line 201(D).

Operation: AD Conversion on N-Signal of Pixel 11 in each Row

At a time t5, the MPX circuit 350(A) outputs, to the ADC 360(A), the signal of the signal line 201(A), i.e., the N-signal of the pixel 11 in Row 1. The ADC 360(A) converts the N-signal of the pixel 11 in Row 1 into a digital signal.

At a time t7, the MPX circuit 350(A) outputs, to the ADC 360(A), the signal of the signal line 201(B), i.e., the N-signal of the pixel 11 in Row 2. The ADC 360(A) converts the N-signal of the pixel 11 in Row 2 into a digital signal.

At a time t10, the MPX circuit 350(A) outputs, to the ADC 360(A), the signal of the signal line 201(C), i.e., the N-signal of the pixel 11 in Row 3. The ADC 360(A) converts the N-signal of the pixel 11 in Row 3 into a digital signal.

At the time t11, the MPX circuit 350(A) outputs, to the ADC 360(A), the signal of the signal line 201(D), i.e., the N-signal of the pixel 11 in Row 4. The ADC 360(A) converts the N-signal of the pixel 11 in Row 4 into a digital signal.

Operation: Readout of A+B Signal Corresponding to Pixel 11 in Each Row

At the time t10, the vertical scanning circuit sets, to the High level, the signals PTXA and PTXB to be output to the pixel 11 in each of Rows 1 and 2. Then, the electric charges accumulated by the photodiodes 601a and 601b are transferred to the FD portion 605 via the transfer transistors 603a and 603b, respectively. The A+B signal of the pixel 11 in Row 1 is output to the signal line 201(A).

The A+B signal of the pixel 11 in Row 2 is output to the signal line 201(B).

At a time t13, the vertical scanning circuit sets, to the High level, the signals PTXA and PTXB to be output to the pixel 11 in each of Rows 3 and 4. Then, the electric charges accumulated by the photodiodes 601a and 601b are transferred to the FD portion 605 via the transfer transistors 603a and 603b, respectively. The A+B signal of the pixel 11 in Row 3 is output to the signal line 201(C), and the A+B signal of the pixel 11 in Row 4 is output to the signal line 201(D).

Operation: AD Conversion on A+B Signal of Pixel 11 in Each Row

At the time t13, the MPX circuit 350(A) outputs, to the ADC 360(A), the signal of the signal line 201(A), i.e., the A+B signal of the pixel 11 in Row 1. The ADC 360(A) converts the A+B signal of the pixel 11 in Row 1 into a digital signal.

At a time t15, the MPX circuit 350(A) outputs, to the ADC 360(A), the signal of the signal line 201(B), i.e., the A+B signal of the pixel 11 in Row 2. The ADC 360(A) converts the A+B signal of the pixel 11 in Row 2 into a digital signal.

At a time t20, the MPX circuit 350(A) outputs, to the ADC 360(A), the signal of the signal line 201(C), i.e., the A+B signal of the pixel 11 in Row 3. The ADC 360(A) converts the A+B signal of the pixel 11 in Row 3 into a digital signal.

At a time t21, the MPX circuit 350(A) outputs, to the ADC 360(A), the signal of the signal line 201(D), i.e., the A+B signal of the pixel 11 in Row 4. The ADC 360(A) converts the A+B signal of the pixel 11 in Row 4 into a digital signal.

Subsequently, similar operations are repeated.

In this way, the imaging device according to the present exemplary embodiment can obtain digital signals based on the N-signal of each pixel and digital signals based on the A+B signal of each pixel.

Further, at a time t15, the vertical scanning circuit starts the readout of the N-signal of the pixel 11 in each of Rows 5 and 6. Then, the N-signal of the pixel 11 in Row 5 is read to the signal line 201(A), and the N-signal of the pixel 11 in Row 6 is read to the signal line 201(B).

When the shield wiring 250(B) is not provided, a potential variation arises in the AD conversion on the N-signal of the pixel 11 in Row 3 at the time t10. More specifically, the readout of the A+B signal of the pixel 11 in Row 2 to the signal line 201(B) causes a potential variation on the signal line 201(C). In addition, a potential variation arises in the AD conversion on the A+B signal of the pixel 11 in Row 2 at the time t15. More specifically, the readout of the A+B signal of the pixel 11 in Row 3 to the signal line 201(C) causes a potential variation on the signal line 201(B). In addition, a potential variation arises in the AD conversion on the A+B signal of the pixel 11 in Row 3 at the time t20. More specifically, the readout of the N-signal of the pixel 11 in Row 6 to the signal line 201(B) causes a potential variation on the signal line 201(C).

When the shield wiring 250(A) is not provided, a potential variation arises in the AD conversion on the N-signal of the pixel 11 in Row 4 at the time t11. More specifically, the readout of the A+B signal of the pixel 11 in Row 1 to the signal line 201(A) causes a potential variation on the signal line 201(D). In addition, a potential variation arises in the AD conversion on the A+B signal of the pixel 11 in Row 1 at the time t13. More specifically, the readout of the A+B signal of the pixel 11 in Row 4 to the signal line 201(D) causes a potential variation on the signal line 201(A). In addition, a potential variation arises in the AD conversion on the A+B signal of the pixel 11 in Row 4 at the time t21. More specifically, the readout of the N-signal of the pixel 11 in Row 5 to the signal line 201(A) causes a potential variation on the signal line 201(D).

The AD conversion accuracy is degraded by the above-described potential variations.

On the other hand, similar to the imaging device according to the first exemplary embodiment, in the imaging device according to the present exemplary embodiment, the shield wirings 250(A) and 250(B) are arranged with the layout illustrated in FIGS. 5A, 5B, and 5C. In the imaging operation of the imaging device according to the present exemplary embodiment, the signal lines 201(A) and 201(B) are operated in phase, and the signal lines 201(C) and 201(D) are also operated in phase.

In this way, similar to the first exemplary embodiment, the imaging device according to the present exemplary embodiment can suitably restrain the parasitic capacitance between a plurality of wirings while restraining the increase in the wiring area of the shield wirings.

Additional Effects in Present Exemplary Embodiment: Increase in Operation Speed through Parallel Operations by Imaging device in Operations Illustrated in FIG. 11

In the operations illustrated in FIG. 11, a plurality of operations is performed in parallel as follows:
(1) Parallel operations of the readout of the N-signal corresponding to the pixel 11 in Row 1 and the readout of the N-signal corresponding to the pixel 11 in Row 2
(2) Parallel operations of the AD conversion on the N-signal corresponding to the pixel 11 in Row 1 and the readout of the N-signal corresponding to the pixel 11 in Row 2
(3) Parallel operations of the AD conversion on the N-signal corresponding to the pixel 11 in Row 4, and the readout of the A+B signal corresponding to the pixel 11 in Row 1
(4) Parallel operations of the readout of the A+B signal corresponding to the pixel 11 in Row 1 and the readout of the A+B signal corresponding to the pixel 11 in Row 2
(5) Parallel operations of the AD conversion on the A+B signal corresponding to the pixel 11 in Row 1 and the readout of the A+B signal corresponding to the pixel 11 in Row 2

These parallel operations make it possible to reduce the wait time period since the ADC 360(A) completes one AD conversion until it starts the following AD conversion. This makes it possible to shorten the time period required to perform the AD conversion on the signals output from all of the pixels 11. This enables increasing the frame rate of the imaging device.

Operation of Imaging device: Focus Detection+Imaging Mode

Figure 12:
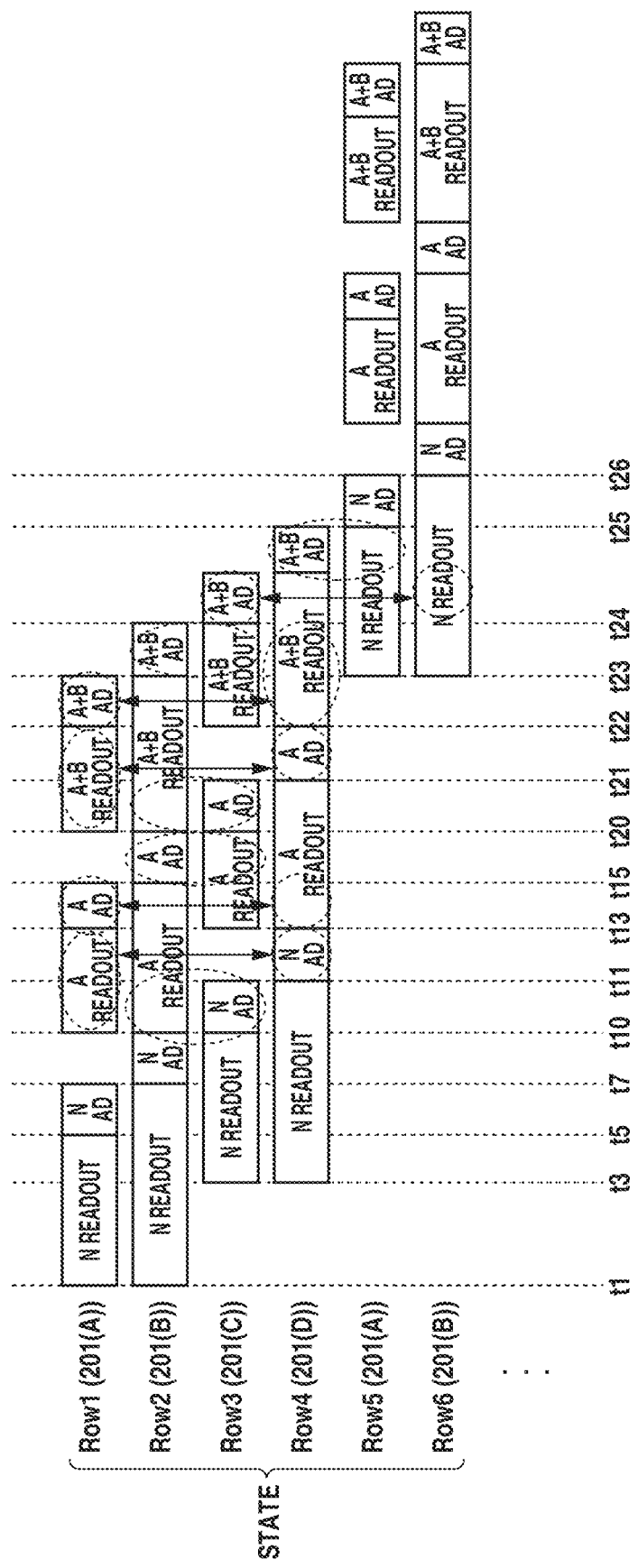
FIG. 12 illustrates operations of the imaging device.

FIG. 12 illustrates operations of the imaging device illustrated in FIG. 9. Operations illustrated in FIG. 12 are performed by the imaging device to output the focus detection signal and the imaging signal.

Description will be made centering on differences from the operations illustrated in FIG. 11.

Operation: Readout of N-Signal from Pixel 11 in Each Row

Operations are similar to those illustrated in FIG. 11.

Operation: AD Conversion on N-Signal of Pixel 11 in Each Row

Operations are similar to those illustrated in FIG. 11.

Operation: Readout of A-Signal Corresponding to Pixel 11 in Each Row

At the time t10, the vertical scanning circuit starts the readout of the A-signal of the pixel 11 in each of Rows 1 and 2. More specifically, the vertical scanning circuit sets, to the High level, the signal PTXA to be output to the pixel 11 in each of Rows 1 and 2. Then, the electric charge accumulated by the photodiode 601a is transferred to the FD portion 605 via the transfer transistor 603a. Accordingly, the FD portion 605 provides a potential corresponding to the electric charge of the photodiode 601a. The A-signal of the pixel 11 in Row 1 is output to the signal line 201(A) in each column, and the A-signal of the pixel 11 in Row 2 is output to the signal line 201(B) in each column. The A-signal is the first signal based on the signals of only a part of the plurality of photodiodes. The first signal can be used as a focus detection signal.

At the time t13, the vertical scanning circuit starts the readout of the A-signal of the pixel 11 in each of Rows 3 and 4. More specifically, the vertical scanning circuit sets, to the High level, the signal PTXA to be output to the pixel 11 in each of Rows 3 and 4. Accordingly, the A-signal of the pixel 11 in Row 3 is output to the signal line 201(C) in each column, and the A-signal of the pixel 11 in Row 4 is output to the signal line 201(D) in each column.

Operation: AD Conversion on A-Signal corresponding to Pixel 11 in each Row

At the time t13, the MPX circuit 350(A) outputs, to the ADC 360(A), the signal of the signal line 201(A), i.e., the A-signal of the pixel 11 in Row 1. The ADC 360(A) converts the A-signal of the pixel 11 in Row 1 into a digital signal.

At the time t15, the MPX circuit 350(A) outputs, to the ADC 360(A), the signal of the signal line 201(B), i.e., the A-signal of the pixel 11 in Row 2. The ADC 360(A) converts the A-signal of the pixel 11 in Row 2 into a digital signal.

At the time t20, the MPX circuit 350(A) outputs, to the ADC 360(A), the signal of the signal line 201(C), i.e., the A-signal of the pixel 11 in Row 3. The ADC 360(A) converts the A-signal of the pixel 11 in Row 3 into a digital signal.

At the time t21, the MPX circuit 350(A) outputs, to the ADC 360(A), the signal of the signal line 201(D), i.e., the A-signal of the pixel 11 in Row 4. The ADC 360(A) converts the A-signal of the pixel 11 in Row 4 into a digital signal.

(Operation: Readout of A+B Signal of Pixel 11 in each Row)

At the time t20, the vertical scanning circuit starts the readout of the A+B signal of the pixel 11 in each of Rows 1 and 2. More specifically, the vertical scanning circuit sets, to the High level, the signals PTXA and PTXB to be output to the pixel 11 in each of Rows 1 and 2. Then, the electric charges accumulated by the photodiodes 601a and 601b is transferred to the FD portion 605 via the transfer transistors 603a and 603b, respectively. The A+B signal of the pixel 11 in Row 1 is output to the signal line 201(A), and the A+B signal of the pixel 11 in Row 2 is output to the signal line 201(B).

At a time t22, the vertical scanning circuit starts the readout of the A+B signal of the pixel 11 in each of Rows 3 and 4. More specifically, the vertical scanning circuit sets, to the High level, the signals PTXA and PTXB to be output to the pixel 11 in each of Rows 3 and 4. Then, the electric charges accumulated by the photodiodes 601a and 601b are transferred to the FD portion 605 via the transfer transistors 603a and 603b, respectively. The A+B signal of the pixel 11 in Row 3 is output to the signal line 201(C), and the A+B signal of the pixel 11 in Row 4 is output to the signal line 201(D).

Operation: AD Conversion on A+B Signal of Pixel 11 in each Row

At the time t22, the MPX circuit 350(A) outputs, to the ADC 360(A), the signal of the signal line 201(A), i.e., the A+B signal of the pixel 11 in Row 1. The ADC 360(A) converts the A+B signal of the pixel 11 in Row 1 into a digital signal.

At a time t23, the MPX circuit 350(A) outputs, to the ADC 360(A), the signal of the signal line 201(B), i.e., the A+B signal of the pixel 11 in Row 2. The ADC 360(A) converts the A+B signal of the pixel 11 in Row 2 into a digital signal.

At a time t24, the MPX circuit 350(A) outputs, to the ADC 360(A), the signal of the signal line 201(C), i.e., the A+B signal of the pixel 11 in Row 3. The ADC 360(A) converts the A+B signal of the pixel 11 in Row 3 into a digital signal.

At a time t25, the MPX circuit 350(A) outputs, to the ADC 360(A), the signal of the signal line 201(D), i.e., the A+B signal of the pixel 11 in Row 4. The ADC 360(A) converts the A+B signal of the pixel 11 in Row 4 into a digital signal.

In this way, the imaging device according to the present exemplary embodiment can obtain digital signals based on the N-signal of each pixel, digital signals based on the A-signal of each pixel, and digital signals based on the A+B signal of each pixel.

At the time t23, the vertical scanning circuit starts the readout of the N-signal of the pixel 11 in each of Rows 5 and 6.

When the shield wiring 250(B) is not provided, a potential variation arises in the AD conversion on the N-signal of the pixel 11 in Row 3 at the time t10. More specifically, the readout of the A-signal of the pixel 11 in Row 2 to the signal line 201(B) causes a potential variation on the signal line 201(C). In addition, a potential variation arises in the AD conversion on the A-signal of the pixel 11 in Row 2 at the time t15. More specifically, the readout of the A-signal of the pixel 11 in Row 3 to the signal line 201(C) causes a potential variation on the signal line 201(B). In addition, a potential variation arises in the AD conversion on the A-signal of the pixel 11 in Row 3 at the time t20. More specifically, the readout of the A+B signal of the pixel 11 in Row 6 to the signal line 201(B) causes a potential variation on the signal line 201(C). In addition, a potential variation arises in the AD conversion on the A+B signal of the pixel 11 in Row 3 at the time t20. More specifically, the readout of the A+B signal of the pixel 11 in Row 2 to the signal line 201(B) causes a potential variation on the signal line 201(C). In addition, a potential variation arises in the AD conversion on the A+B signal of the pixel 11 in Row 2 at the time t23. More specifically, the readout of the A+B signal of the pixel 11 in Row 3 to the signal line 201(C) causes a potential variation on the signal line 201(B). In addition, a potential variation arises in the AD conversion on the A+B signal of the pixel 11 in Row 3 at the time t24. More specifically, the readout of the N-signal of the pixel 11 in Row 6 to the signal line 201(B) causes a potential variation on the signal line 201(C).

When the shield wiring 250(A) is not provided, a potential variation arises in the AD conversion on the N-signal of the pixel 11 in Row 4 at the time t11. More specifically, the readout of the A-signal of the pixel 11 in Row 1 to the signal line 201(A) causes a potential variation on the signal line 201(D). In addition, a potential variation arises in the AD conversion on the A-signal of the pixel 11 in Row 1 at the time t13. More specifically, the readout of the A-signal of the pixel 11 in Row 4 to the signal line 201(D) causes a potential variation on the signal line 201(A). In addition, a potential variation arises in the AD conversion on the A-signal of the pixel 11 in Row 4 at the time t21. More specifically, the readout of the A+B signal of the pixel 11 in Row 1 to the signal line 201(A) causes a potential variation on the signal line 201(D). In addition, a potential variation arises in the AD conversion on the A+B signal of the pixel 11 in Row 1 at the time t22. More specifically, the readout of the A+B signal of the pixel 11 in Row 4 to the signal line 201(D) causes a potential variation on the signal line 201(A). In addition, a potential variation arises in the AD conversion on the A+B signal of the pixel 11 in Row 4 at the time t25. More specifically, the readout of the N-signal of the pixel 11 in Row 5 to the signal line 201(A) causes a potential variation on the signal line 201(D).

The AD conversion accuracy is degraded by the above-described potential variations.

On the other hand, similar to the imaging device according to the first exemplary embodiment, in the imaging device according to the present exemplary embodiment, the shield wirings 250(A) and 250(B) are arranged with the layout illustrated in FIGS. 5A, 5B, and 5C. In the imaging operations of the imaging device according to the present exemplary embodiment, the signal lines 201(A) and 201(B) are operated in phase, and the signal lines 201(C) and 201(D) are also operated in phase.

In this way, similar to the first exemplary embodiment, the imaging device according to the present exemplary embodiment can suitably restrain the parasitic capacitance between a plurality of wirings while restraining the increase in the wiring area of the shield wirings.

Additional Effects in Present Exemplary Embodiment: Increase in Operation Speed through Parallel Operations by Imaging Device in Operations Illustrated in FIG. 12

In the operations illustrated in FIG. 12, a plurality of operations is performed in parallel as follows:
(1) Parallel operations of the readout of the N-signal corresponding to the pixel 11 in Row 1 and the readout of the N-signal corresponding to the pixel 11 in Row 2
(2) Parallel operations of the AD conversion on the N-signal corresponding to the pixel 11 in Row 1 and the readout of the N-signal corresponding to the pixel 11 in Row 2
(3) Parallel operations of the AD conversion on the N-signal corresponding to the pixel 11 in Row 4 and the readout of the A-signal corresponding to the pixel 11 in Row 1
(4) Parallel operations of readout of the A-signal corresponding to the pixel 11 in Row 1 and the readout of the A-signal corresponding to the pixel 11 in Row 2
(5) Parallel operations of the AD conversion on the A-signal corresponding to the pixel 11 in Row 1 and the readout of the A-signal corresponding to the pixel 11 in Row 2
(6) Parallel operations of the AD conversion on the A-signal corresponding to the pixel 11 in Row 4 and the readout of the A+B signal corresponding to the pixel 11 in Row 1
(7) Parallel operations of the readout of the A+B signal corresponding to the pixel 11 in Row 1 and the readout of the A+B signal corresponding to the pixel 11 in Row 2
(8) Parallel operations of the AD conversion on the A+B signal corresponding to the pixel 11 in Row 1 and the readout of the A-signal corresponding to the pixel 11 in Row 2.

These parallel operations make it possible to reduce the wait time period since the ADC 360(A) completes one AD conversion until it starts the following AD conversion. This makes it possible to shorten the time period required to perform the AD conversion on the signals output from all of the pixels 11. This enables increasing the frame rate of the imaging device.

The present exemplary embodiment is not limited to this example. For example, in one frame period, it is possible that the signal lines 201 are connected to the pixels 11 having the color filter with the first color and not connected to the pixels 11 having the color filter with the second color. Focusing on the pixel 11 in Column 1, the MPX circuit 350(A) connects, to the ADC 360(A), the signal lines 201(A) and 201(C) connected with the pixels 11 having the R color filter with the first color. On the other hand, in the one-frame period, the MPX circuit 350(A) does not connect, to the ADC 360(A), the signal lines 201(B) and 201(D) connected with the pixels 11 having the G color filters with the second color. This configuration makes it possible to obtain an effect of simplifying the correction processing for the AD conversion and the correction processing after the AD conversion according to the first exemplary embodiment.

An imaging device according to a third exemplary embodiment will be described below centering on differences from that according to the second exemplary embodiment.

The imaging device according to the second exemplary embodiment is not provided with a circuit for sampling and holding signals output to the signal lines 201. Accordingly, in the operations illustrated in FIGS. 11 and 12, the length of the signal readout period differs for each pixel row. More specifically, referring to FIG. 11, the length of the N-signal readout period ranges from the time t1 to the time t5 for the pixels 11 in Row 1 and ranges from the time t1 to the time t7 for the pixels 11 in Row 2. Similarly, the length of the A+B signal readout period differs for each pixel row. Because of this difference in length of the readout period, the signal level input to the ADC 360 may be different even if the potential of the FD portion 605 of the pixels 11 is equal in Rows 1 and 2. For example, when the signal readout period of the pixel 11 in Row 1 is shorter than the signal settlement period of the signal of each signal line 201, the AD conversion will be performed before the signal of each signal line 201 settles. On the other hand, the signal readout period of the pixel 11 in Row 2 is longer than the signal readout period of the pixel 11 in Row 1. Accordingly, the AD conversion will be performed in a state where the signal of each signal line 201 of the pixel 11 in Row 2 is closer to the settlement level than the signal of each signal line 201 of the pixel 11 in Row 1. Even if the potential of the FD portion 605 of the pixel 11 is equal in Rows 1 and 2, the value of the signal acquired by performing the AD conversion on the signal of the pixel 11 will be different between Rows 1 and 2.

Figure 13:
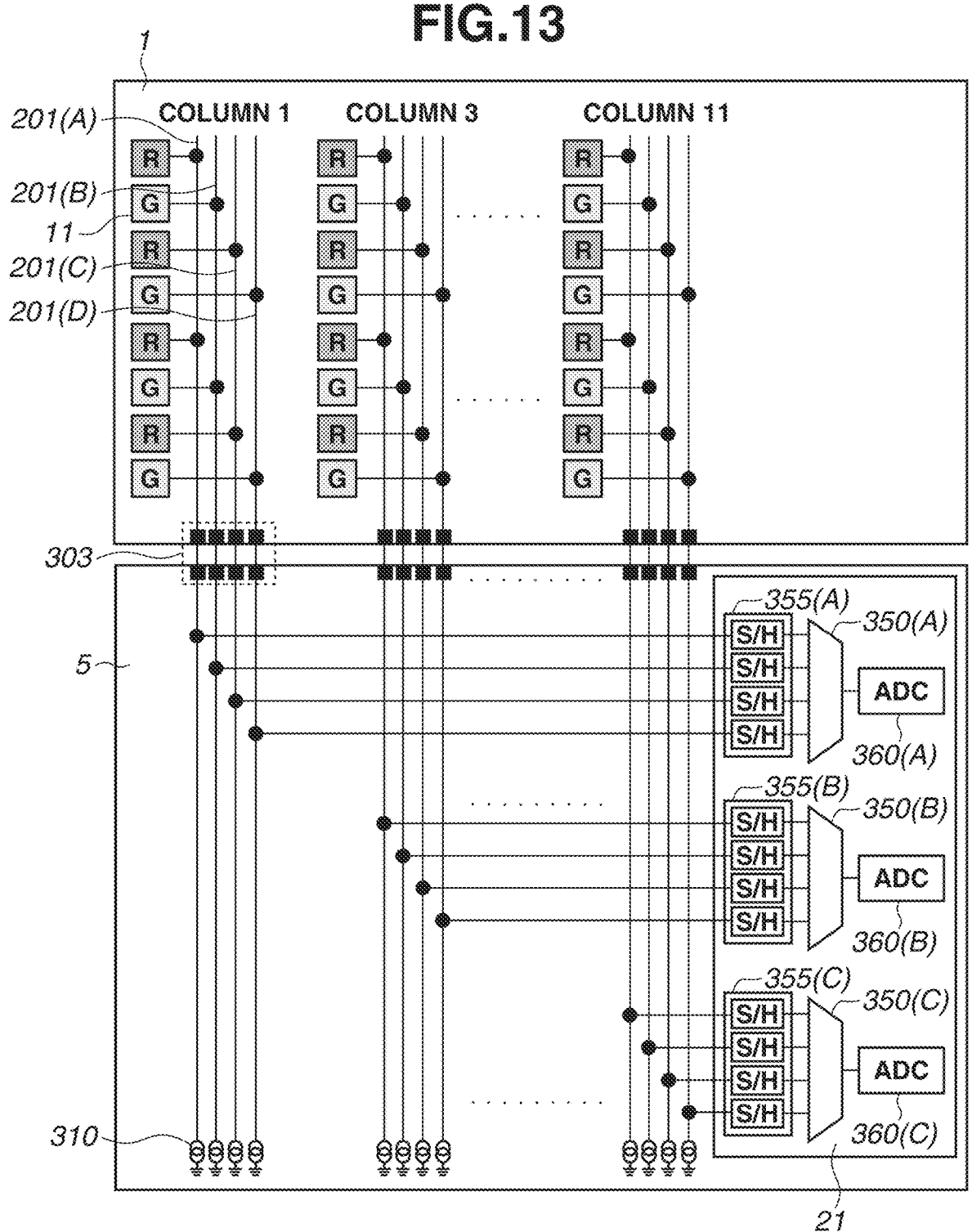
FIG. 13 is a block diagram illustrating pixels and a signal processing circuit.

FIG. 13 is a block diagram illustrating the imaging device according to the present exemplary embodiment. In the configuration illustrated in FIG. 13, a sample hold unit (hereinafter referred to as an S/H unit as illustrated in FIG. 13) 355 is provided between each signal line 201 and the MPX circuit 350. The S/H unit 355 holds the signal read to the signal line 201 and outputs the held signal to the MPX circuit 350. One S/H unit 355 includes four different S/H circuits. The four S/H circuits are provided for the signal lines 201(A) to 201(D), respectively.

Figure 14:
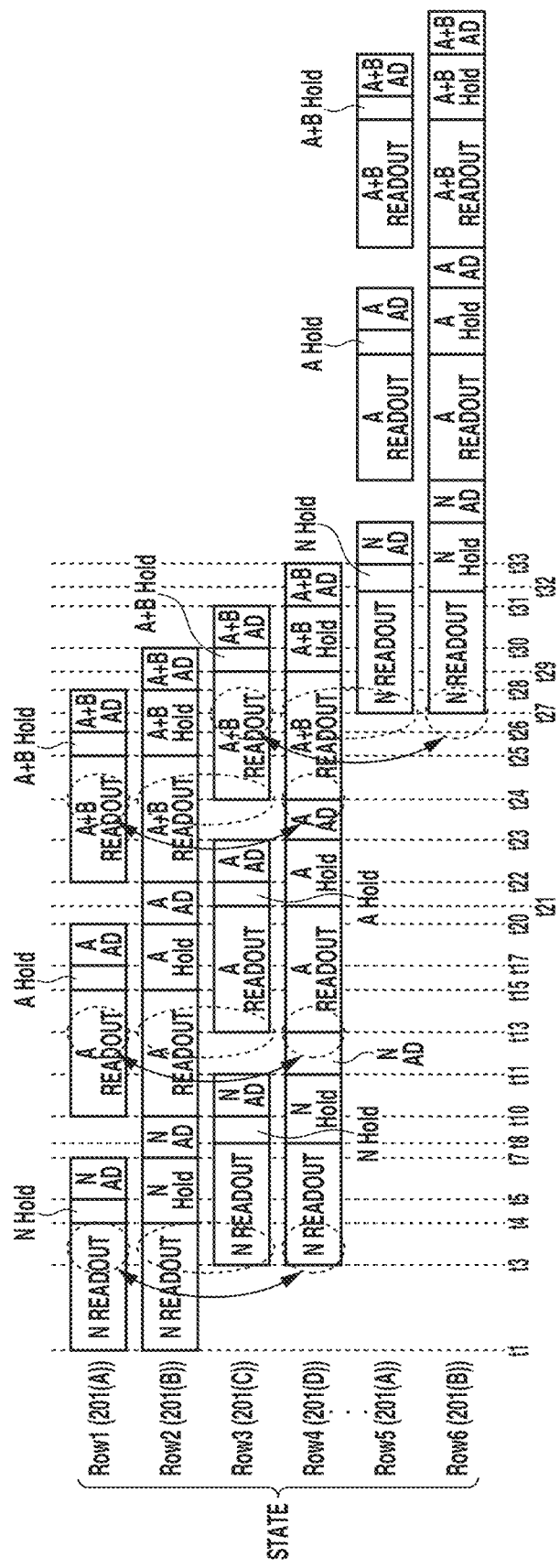
FIG. 14 illustrates operations of the imaging device.

FIG. 14 illustrates an imaging operation of the imaging device according to the present exemplary embodiment. Description will be made centering on differences from the operations illustrated in FIG. 11.

Readout, Hold, and AD Conversion of N-Signal in each Row

At a time t3, the N-signal of the pixel 11 in Row 1 is being read to the signal line 201(A), and the N-signal of the pixel 11 in Row 2 is being read to the signal line 201(B). At the time t3, the vertical scanning circuit starts the readout of the N-signal of the pixel 11 in Row 3 to the signal line 201(C), and the readout of the N-signal of the pixel 11 in Row 4 to the signal line 201(D). Thus, a potential variation occurs on the signal lines 201(C) and 201(D).

At a time t4, each of the S/H circuit connected to the signal line 201(A) and the S/H circuit connected to the signal line 201(B) holds the N-signal. More specifically, the N-signal of the pixel 11 in Row 1 and the N-signal of the pixel 11 in Row 2 are held by the respectively corresponding S/H circuits.

At the time t5, the MPX circuit 350(A) connects, to the ADC 360(A), the S/H circuit holding the signal of the signal line 201(A). Thus, the AD conversion is performed on the N-signal of the pixel 11 in Row 1.

At the time t7, the MPX circuit 350(A) connects, to the ADC 360(A), the S/H circuit holding the signal of the signal line 201(B). Thus, the AD conversion is performed on the N-signal of the pixel 11 in Row 2.

At a time t8, each of the S/H circuit connected to the signal line 201(C) and the S/H circuit connected to the signal line 201(D) holds the N-signal. More specifically, the N-signal of the pixel 11 in Row 3 and the N-signal of the pixel 11 in Row 4 are held by the respectively corresponding S/H circuits.

At a time t10, The MPX circuit 350(A) connects, to the ADC 360(A), the S/H circuit holding the signal of the signal line 201(C). Thus, the AD conversion is performed on the N-signal of the pixel 11 in Row 3.

At a time t11, the MPX circuit 350(A) connects, to the ADC 360(A), the S/H circuit holding the signal of the signal line 201(D). Thus, the AD conversion is performed on the N-signal of the pixel 11 in Row 2.

Readout, Hold, and AD Conversion of A-Signal in each Row

At the time t10, the vertical scanning circuit starts the readout of the A-signal of the pixel 11 in each of Rows 1 and 2. The A-signal of the pixel 11 in Row 1 is read to the signal line 201(A), and the A-signal of the pixel 11 in Row 2 is read to the signal line 201(B).

At a time t13, the vertical scanning circuit starts the readout of the A-signal of the pixel 11 in Row 3 to the signal line 201(C), and the readout of the A-signal of the pixel 11 in Row 4 to the signal line 201(D). Then, a potential variation occurs on the signal lines 201(C) and 201(D).

Subsequently, similar to the case of the N-signal, the A-signal is held by the S/H circuits and the AD conversion is performed by the ADC 360(A).

Readout, Hold, and AD Conversion of A+B Signal in each Row

At a time t22, the vertical scanning circuit starts the readout of the A+B signal of the pixel 11 in each of Rows 1 and 2. The A+B signal of the pixel 11 in Row 1 is read to the signal line 201(A), and the A+B signal of the pixel 11 in Row 2 is read to the signal line 201(B).

Then, at a time t24, the vertical scanning circuit starts the readout of the A+B signal of the pixel 11 in Row 3 to the signal line 201(C), and the readout of the A+B signal of the pixel 11 in Row 4 to the signal line 201(D). With this operation, a potential variation occurs on the signal lines 201(C) and 201(D).

Subsequently, similar to the case of the N- and A-signals, the A+B signal is held by the S/H circuits and the AD conversion is performed by the ADC 360(A).

At a time t27, the vertical scanning circuit starts the readout of the N-signal of the pixel 11 in each of Rows 5 and 6. The N-signal of the pixel 11 in Row 5 is read to the signal line 201(A), and the N-signal of the pixel 11 in Row 6 is read to the signal line 201(B). With this operation, a potential variation occurs on the signal lines 201(A) and 201(B).

Starting the readout of the N-signal of the pixel 11 in Row 4 at the time t3 causes a potential variation on the signal line 201(D). If the shield wiring 250(A) is not provided, the coupling capacitance between the signal lines 201(D) and 201(A) causes a potential variation on the signal line 201(A) subjected to the readout of the N-signal of the pixel 11 in Row 1. Similarly, starting the readout of the A-signal of the pixel 11 in Row 4 at the time t13 causes a potential variation on the signal line 201(A). Similarly, starting the readout of the A+B signal of the pixel 11 in Row 4 at the time t24 causes a potential variation on the signal line 201(A). Similarly, starting the readout of the N-signal of the pixel 11 in Row 5 at the time t27 causes a potential variation on the signal line 201(D).

Starting the readout of the N-signal of the pixel 11 in Row 3 at the time t3 causes a potential variation on the signal line 201(C). If the shield wiring 250(B) is not provided, the coupling capacitance between the signal lines 201(C) and 201(B) causes a potential variation on the signal line 201(B) subjected to the readout of the N-signal of the pixel 11 in Row 2. Similarly, starting the readout of the A-signal of the pixel 11 in Row 3 at the time t13 causes a potential variation on the signal line 201(B). Similarly, starting the readout of the A+B signal of the pixel 11 in Row 3 at the time t24 causes a potential variation on the signal line 201(B). Similarly, starting the readout of the N-signal of the pixel 11 in Row 6 at the time t27 causes a potential variation on the signal line 201(C).

The AD conversion accuracy is degraded by the above-described potential variations.

On the other hand, similar to the imaging device according to the first exemplary embodiment, in the imaging device according to the present exemplary embodiment, the shield wirings 250(A) and 250(B) are arranged with the layout illustrated in FIGS. 5A, 5B, and 5C. In the imaging operation of the imaging device according to the present exemplary embodiment, the signal lines 201(A) and 201(B) are operated in phase, and the signal lines 201(C) and 201(D) are also operated in phase.

In this way, similar to the imaging apparatus according to the first exemplary embodiment, the imaging device according to the present exemplary embodiment can suitably restrain the parasitic capacitance between a plurality of wirings while restraining the increase in the wiring area of the shield wirings.

In the imaging device according to the present exemplary embodiment, the plurality of S/H circuits is provided for the plurality of signal lines 201, respectively. Thus, the length of the signal readout period can be made the same for each pixel row. This makes it possible to restrain signal variations caused by the difference in length of the signal readout period.

An imaging device according to a fourth exemplary embodiment will be described below centering on differences from that according to the first exemplary embodiment. The imaging device according to the present exemplary embodiment uses a successive approximation A/D converter as the ADCs 360(A) and 360(B) according to the first exemplary embodiment. Other configurations can be similar to those of the imaging device according to the first exemplary embodiment.

Although the present exemplary embodiment will be described below centering on the application to the ADCs according to the first exemplary embodiment, the present exemplary embodiment is also applicable to the ADCs in the imaging device according to the second exemplary embodiment.

Equivalent Circuit of Successive Approximation ADC

Figure 15:
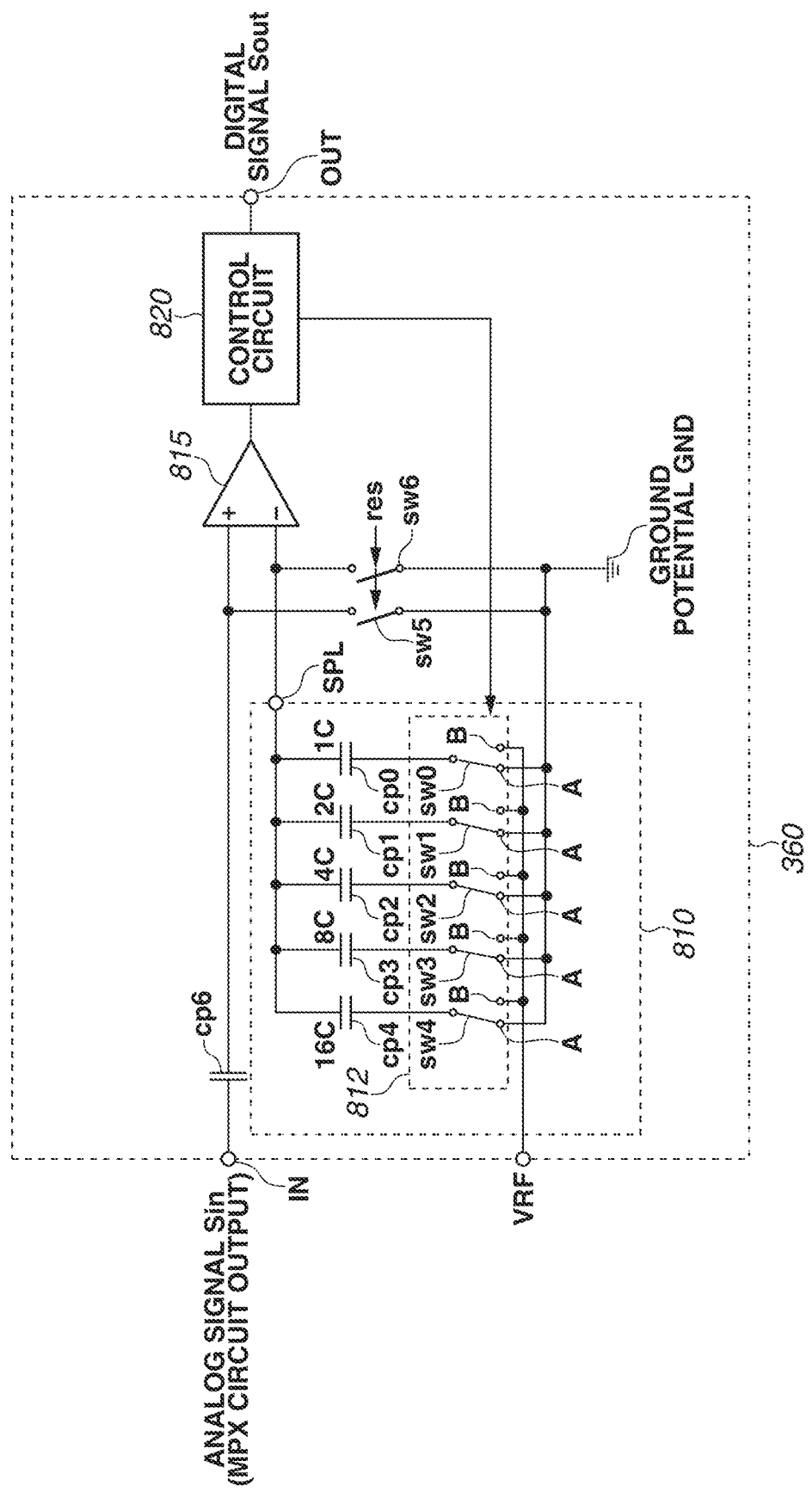
FIG. 15 is an equivalent circuit diagram illustrating an analog-to-digital (AD) conversion unit.

FIG. 15 is an equivalent circuit diagram illustrating the ADC 360 according to the present exemplary embodiment.

The ADC 360 including an input terminal IN and an output terminal OUT receives an analog signal Sin (output of the MPX circuit 350) from the input terminal IN, converts the analog signal Sin into a digital signal Sout, and outputs the digital signal Sout through the output terminal OUT. The analog signal Sin can be used as either one or both of the N-signal according to the first exemplary embodiment and an S-signal. The ADC 360 converts the output of the MPX circuit 350 into the digital signal Sout with the 5-bit resolution.

The ADC 360 further includes a generation circuit 810 for generating a comparison signal used for comparison with the analog signal Sin. The generation circuit 810 includes a plurality of capacitive elements cp0 to cp4 having a capacitance value of a binary weight, and a plurality of switches sw0 to sw4 connected to the capacitive elements cp0 to cp4, respectively. The plurality of switches sw0 to sw4 forms a switch circuit for selecting at least one of the plurality of capacitive elements cp0 to cp4, respectively. The binary weight refers to a set of weights (capacitance values) which forms a geometric series with a geometric ratio of 2. In the example illustrated in FIG. 15, the capacitive elements cp0 to cp4 have respective capacitance values of 1C, 2C, 4C, 8C, and 16C. One end of each of electrodes of the capacitive elements cp0 to cp4 is connected to a supply terminal SPL of the generation circuit 810, and the other end of each of the electrodes of the capacitive elements cp0 to cp4 is connected to the corresponding switches sw0 to sw4. One end of each of the switches sw0 to sw4 is connected to the corresponding capacitive elements cp0 to cp4 and the other end of each of the switches sw0 to sw4 is toggled between the terminals A and B. The terminal A is supplied with a ground potential GND, and the terminal B is supplied with a reference voltage VRF. The reference voltage VRF is a constant voltage supplied from the outside of the ADC 360 and is higher than the ground potential GND. When the switch sw0 is toggled to the terminal A, the capacitive element cp0 is supplied with the ground potential GND. When the switch sw0 is toggled to the terminal B, the capacitive element cp0 is supplied with the reference voltage VRF. This also applies to other switches sw1 to sw4. When the switches sw0 to sw4 change, the combined capacitance value of the capacitive elements connected between the supply terminal SPL and the reference voltage VRF changes, resulting in the variation of the value of a comparison signal Vcmp output from the supply terminal SPL.

The ADC 360 further includes a comparator 815 for comparing the value of the analog signal Sin with the value of the comparison signal Vcmp and outputting a signal according to the comparison result. The non-inversion input terminal of the comparator 815 is supplied with the analog signal Sin via a capacitive element cp6, and the inversion terminal of the comparator 815 is supplied with the comparison signal Vcmp from the supply terminal SPL of the generation circuit 810. When the value of the analog signal Sin is equal to or larger than the value of the comparison signal Vcmp, the comparator 815 outputs the High level. On the other hand, when the value of the analog signal Sin is smaller than the value of the comparison signal Vcmp, the comparator 815 outputs the Low level. Although, in this example, the High level is output when the value of the analog signal Sin is equal to the value of the comparison signal Vcmp, the Low level may be output. The capacitive element cp6 adjusts the value of the analog signal Sin to a range in which the comparison with the comparison signal Vcmp is possible. To simplify the descriptions in the present exemplary embodiment, the value of the analog signal Sin is equal to or larger than the ground potential GND and equal to or lower than the reference voltage VRF, and the non-inversion terminal of the comparator 815 is supplied with a signal having the same magnitude as the analog signal Sin.

Although, in the example illustrated in FIG. 15, the non-inversion terminal of the comparator 815 is supplied with the analog signal Sin and the inversion terminal of the comparator 815 is supplied with the comparison signal Vcmp, other configurations are also applicable as long as the magnitude relationship between the values of the analog signal Sin and the comparison signal Vcmp can be determined. For example, the non-inversion terminal of the comparator 815 may be supplied with the difference between the analog signal Sin and the comparison signal Vcmp, and the inversion terminal thereof may be supplied with the ground potential GND.

The ADC 360 further includes switches sw5 and sw6. When the switches sw5 and sw6 turn ON, the non-inversion and the inversion terminals of the comparator 815 are supplied with the ground potential GND to reset the comparator 815.

The ADC 360 further includes a control circuit 820. The control circuit 820 is supplied with the comparison result from the comparator 815. The control circuit 820 generates a digital signal Sout based on the comparison result and outputs the digital signal Sout from the output terminal OUT. The control circuit 820 also transmits control signals to the switches sw0 to sw6 to change their states.

Operation of Successive Approximation ADC

Figure 16:
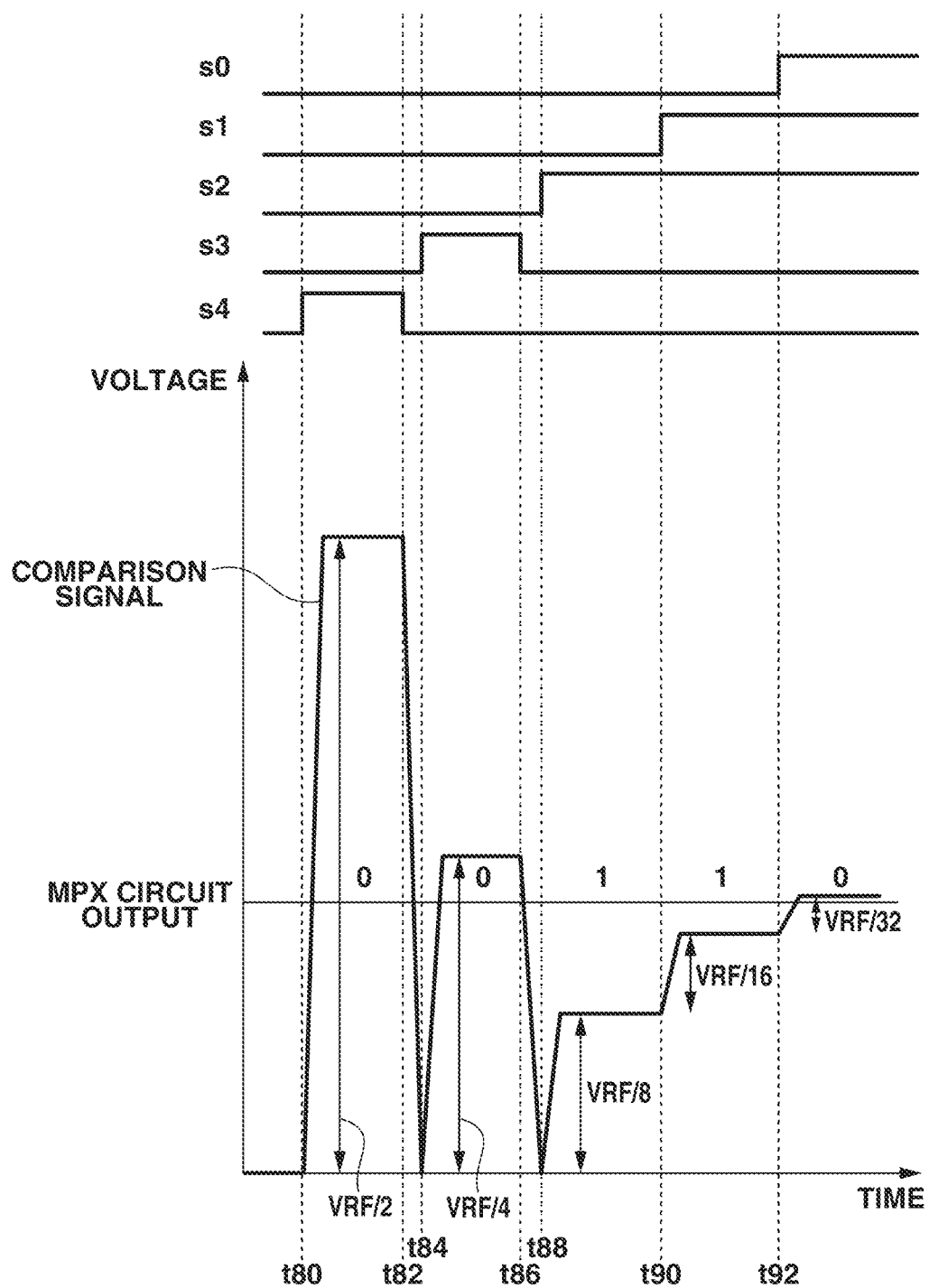
FIG. 16 illustrates operations of the AD conversion unit.

Referring to FIG. 16, s0 to s4 denote the values of the control signals supplied from the control circuit 820 to the switches sw0 to sw6. The switches sw0 to sw4 are toggled to the terminal B when control signals with the High level are supplied and are toggled to the terminal A when control signals with the Low level are supplied. The switches sw5 and sw6 turn ON when control signals with the High level are supplied, and turn OFF when control signals with the Low level are supplied. The bottom chart of FIG. 16 illustrates the analog signal Sin and the comparison signal Vcmp. Referring to the example illustrated in FIG. 16, the value of the analog signal Sin is equivalent to a binary number 00110.

The AD conversion operation of the A/D converter 100 will be described below in time series. In the preparation time period, the control circuit 820 sets, to the Low level, the control signals to be supplied to the switches sw0 to sw4 and sets, to the High level, the control signals to be supplied to the switches sw5 and sw6. With these settings, the non-inversion and the inversion terminals of the comparator 815 are reset to the ground potential GND, and the value of the comparison signal Vcmp becomes equal to the ground potential GND. Then, the control circuit 820 sets, to the Low level, the control signals to be supplied to the switches sw5 and sw6. In the subsequent operations, the non-inversion terminal of the comparator 815 is kept being supplied with the analog signal Sin.

Then, when the successive approximation period starts, the control circuit 820 changes, to the High level, the control signals to be supplied to the switch sw4. Then, the switch sw4 is toggled to the terminal B, and the supply terminal SPL of the generation circuit 810 is applied with the reference voltage VRF via the capacitor cp4 having the largest capacitance value in the binary weight. As a result, the value of the comparison signal Vcmp increases by VRF/2 to become VRF/2. Based on the comparison result from the comparator 815, the control circuit 820 determines that the value of the analog signal Sin is smaller than the value of the comparison signal Vcmp (VRF/2) and returns, to the Low level the control signal to be supplied to the switch sw4. Accordingly, the value of the comparison signal Vcmp returns to the ground potential GND. This comparison result means that the most significant bit (MSB) of the value of the digital signal Sout is 0 (MSB is the fifth bit when the least significant bit (LSB) is the first bit).

Then, the control circuit 820 changes, to the High level, the control signal to be supplied to the switch sw3. Thus, the supply terminal SPL of the generation circuit 810 is applied with the reference voltage VRF via the capacitor cp3 having the second largest capacitance value in the binary weight. As a result, the value of the comparison signal Vcmp increases by VRF/4 to become VRF/4. Based on the comparison result of the comparator 815, the control circuit 820 determines that the value of the analog signal Sin is smaller than the value of the comparison signal Vcmp (VRF/4) and returns, to the Low level, the control signal to be supplied to the switch sw3. Accordingly, the value of the comparison signal Vcmp returns to the ground potential GND. This comparison result means that the fourth bit of the value of the digital signal Sout is 0.

Then, the control circuit 820 changes, to the High level, the control signal to be supplied to the switch sw2. Then, the supply terminal SPL of the generation circuit 810 is applied with the reference voltage VRF via the capacitor cp2 having the third largest capacitance value in the binary weight. As a result, the value of the comparison signal Vcmp increases by VRF/8 to become VRF/8. Based on the comparison result of the comparator 815, the control circuit 820 determines that the value of the analog signal Sin is larger than the value of the comparison signal Vcmp (VRF/8) and maintains, to the High level, the control signal to be supplied to the switch sw2. Accordingly, the value of the comparison signal Vcmp is maintained to VRF/8. This comparison result means that the third bit of the value of the digital signal Sout is 1.

Then, the control circuit 820 changes, to the High level, the control signal to be supplied to the switch sw1. Thus, the supply terminal SPL of the generation circuit 810 is applied with the reference voltage VRF via the capacitor cp2 and the capacitor cp1 having the fourth largest capacitance value in the binary weight. As a result, the value of the comparison signal Vcmp increases by VRF/16 to become VRF*3/16. The symbol "*" used in the present specifications means multiplication. Based on the comparison result of the comparator 815, the control circuit 820 determines that the value of the analog signal Sin is larger than the value of the comparison signal Vcmp (VRF*3/16) and maintains, to the High level, the control signal to be supplied to the switch sw1. Accordingly, the value of the comparison signal Vcmp is maintained to VRF*3/16. This comparison result means that the second bit of the value of the digital signal Sout is 1.

Finally, the control circuit 820 changes, to the High level, the control signal supplied to the switch sw0. Thus, the supply terminal SPL of the generation circuit 810 is applied with the reference voltage VRF via the capacitor cp1, capacitor cp2, and the capacitor cp0 having the fifth largest capacitance value in the binary weight. As a result, the value of the comparison signal Vcmp increases by VRF/32 to become VRF*7/32. Based on the comparison result of the comparator 815, the control circuit 820 determines that the value of the analog signal Sin is smaller than the value of the comparison signal Vcmp (VRF*7/32) and returns, to the Low level, the control signal to be supplied to the switch sw0. Accordingly, the value of the comparison signal Vcmp returns to VRF*3/16. This comparison result means that the first bit of the value of the digital signal Sout is 0.

With the above-described successive approximation, the control circuit 820 determines that the digital signal Sout corresponding to the analog signal is 00110.

In this way, the ADC 360 can perform the AD conversion for generating a digital signal corresponding to the input analog signal.

Other AD Conversion Formats

The fourth exemplary embodiment has been described above centering on an example where a successive approximation A/D converter is used as the ADC 360. However, the ADC 360 is not limited to a successive approximation A/D converter. The ramp signal approximation type, delta-sigma type, pipeline type, flash type, and other various types of A/D converters are also applicable.

Number of Bits for AD Conversion on A– and A+B Signals

In the imaging device according to the first to the third exemplary embodiments, the pixel 11 outputs the A and A+B signals. The A-signal tends to provide a smaller signal amplitude than the A+B signal. Therefore, the number of bits for the AD conversion on the A-signal can be made smaller than the number of bits for the AD conversion on the A+B signal. Typically, the amplitude of the A-signal is a half of the amplitude of the A+B signal or less. Therefore, the number of bits for the AD conversion on the A-signal can be smaller than the number of bits for the AD conversion on the A+B signal by one. More specifically, in a case of the successive approximation A/D converter according to the present exemplary embodiment, the input of the comparison signal used for determining the most significant bit in the AD conversion on the A+B signal will be omitted in the AD conversion on the A-signal. Then, in the AD conversion on the A-signal, the input may be started from the comparison signal having an amplitude of a half of the amplitude of the comparison signal used for determining the most significant bit in the AD conversion on the A+B signal. Thus, the AD conversion period of the A-signal can be made shorter than the AD conversion period of the A+B signal.

Making the number of bits for the AD conversion on the A-signal smaller than the number of bits for the AD conversion on the A+B signal is not limited to the successive approximation A/D converter. For example, in a case of a ramp approximation AD converter using a ramp signal, the time period during which the ramp signal potential is changed in the AD conversion on the A-signal needs to be shorter than the time period in the AD conversion on the A+B signal. This enables making the AD conversion period of the A-signal shorter than the AD conversion period of the A+B signal.

In addition, by making the number of bits for the digital signal of the A-signal smaller than the number of bits for the digital signal of the A+B signal, the time period during which the digital signal of the A-signal is read from the ADC 360 can be shortened. This enables shortening the time period during which the digital signal of the A-signal is read from the plurality of ADCs 360.

In the imaging device according to the first to the third exemplary embodiments, each ADC 360 performs the AD conversion on the A-signal of the pixel 11 in Row 2 after performing the AD conversion on the A-signal of the pixel 11 in Row 1 and before performing the AD conversion on the A+B signal of the pixel 11 in Row 1. In this configuration, making the number of bits for the digital signal of the A-signal smaller than the number of bits for the digital signal of the A+B signal enables acquiring more remarkable effects. More specifically, when performing the AD conversion on the A+B signal of the pixel 11 in Row 1 after performing the AD conversion on the A-signal of the pixel 11 in Row 1, the ADC 360 needs to perform control for changing the number of bits. This configuration produces a wait time for number-of-bits switching control or causes a correction parameter change by the operation mode change of the ADC 360. Examples of correction parameter changes include the correction of the reference voltage VRF in the case of a successive approximation comparator. In the processing accompanying the change of the number of bits, the AD conversion of the signal of the pixel 11 in two rows is focused. In this case, the number of bits needs to be changed three times: between the AD conversion on the A-signal and the AD conversion on the A+B signal in Row 1, between the AD conversion on the A+B signal in Row 1 and the AD conversion on the A-signal in Row 2, and between the AD conversion on the A-signal and the AD conversion on the A+B signal in Row 2. When N pixel rows are subjected to the AD conversion, the number of bits needs to be changed 2N−1 times. If N=8, the number of bits needs to be changed 15 times. According to the first to the third exemplary embodiments, the ADC 360 performs the AD conversion on the A-signal of the pixel 11 in Row 2 after performing the AD conversion on the A-signal of the pixel 11 in Row 1 and before performing the AD conversion on the A+B signal of the pixel 11 in Row 1. In this operation, the ADC 360 changes the number of bits (N/M)−1+(N/M) =(2*N/M)−1 times, where M denotes the number of signal lines 201 connected to each ADC 360. According to the first to the third exemplary embodiments, the ADC 360 changes the number of bits 3 times since N=8 and M=4. More specifically, after sequentially performing the AD conversion on the A-signal of the pixel 11 in each of Rows 1 to 4, the ADC 360 increases the number of bits (first change of the number of bits) and sequentially performs the AD conversion on the A+B signals of the pixel 11 in each of Rows 1 to 4. Then, the ADC 360 decreases the number of bits (second change of the number of bits) and sequentially perform the AD conversion on the A-signal of the pixel 11 in each of Rows 5 to 8. Then, the ADC 360 changes the operation mode (third change of the number of bits) and sequentially performs the AD conversion on the A+B signal of the pixel 11 in each of Rows 5 to 8. Therefore, when sequentially performing the AD conversion on the A and the A+B signals of the pixel 11 in Row 1, the ADC 360 needs to change the number of bits 15 times. On the other hand, according to the first to the third exemplary embodiments, the ADC 360 needs to change the number of bits only three times. As described above, the signal readout method according to the first to the third exemplary embodiments can be said to be suitable for changing the number of bits for the A− and A+B signals.

A fifth exemplary embodiment is suitable for offering a layout for reducing the area of wiring regions of a plurality of signal lines provided for pixels in one column in the multilayer wiring configuration.

The present exemplary embodiment will be described below based on an example where six signal lines 201(A) to 201(F) are provided for the pixels 11 in one column. The signal lines 201(A) to 201(C) operate in phase, and the signal lines 201(D) to 201(F) also operate in phase. On the other hand, the signal lines 201(D) to 201(F) operate in different phases from the signal lines 201(A) to 201(C).

The four signal lines 201(A), 201(B), 201(C), and 201(E) are arranged in the first wiring layer. The signal line 201(C) and 201(F) are arranged in the second wiring layer which is closer to the photoelectric conversion portion of each pixel 11 than the first wiring layer. The shield wirings 250(A) and 250(B) are arranged in the first and the second wiring layers, respectively, in the multilayer wiring configuration.

Figure 17:
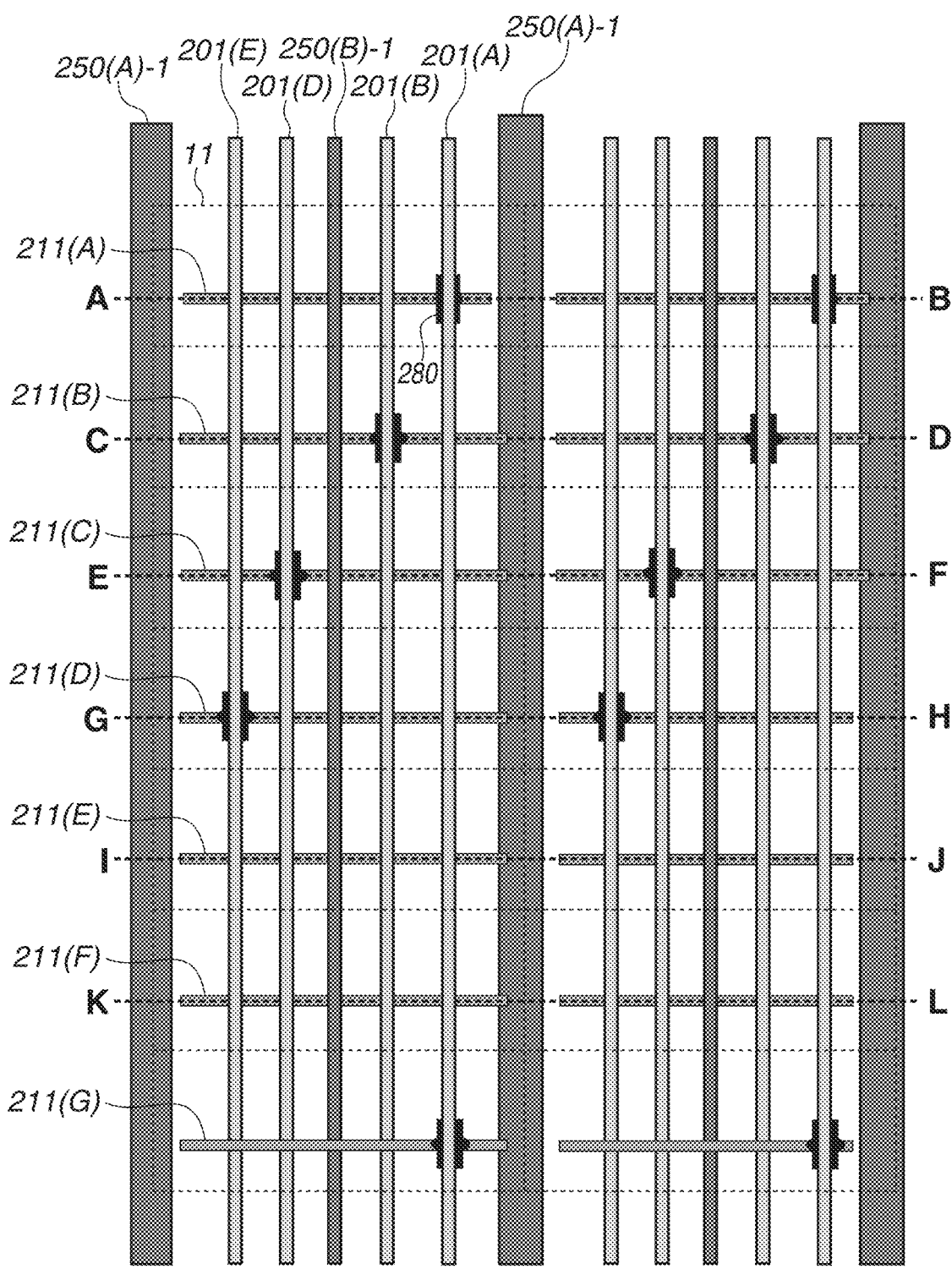
FIG. 17 is a top view illustrating signal lines and shield wirings.

FIG. 17 is a top view illustrating the first wiring layer including the four signal lines 201(A), 201(B), 201(C), and 201(E) when the pixels 11 are viewed from the second chip 5.

In the first wiring layer, shield wirings 250(A)-1 and 250(B)-1 are arranged.

The signal lines 201(A), 201(B), 201(D), and 201(E) are connected to wirings 211 of the pixels 11 in Rows 1, 2, 3, and 4, respectively, via the connecting portions 280 as via-plugs.

FIGS. 18A, 18B, 18C, 19A, 19B, and 19C are cross-sectional views illustrating the imaging device illustrated in FIG. 17.

Figure 18A:
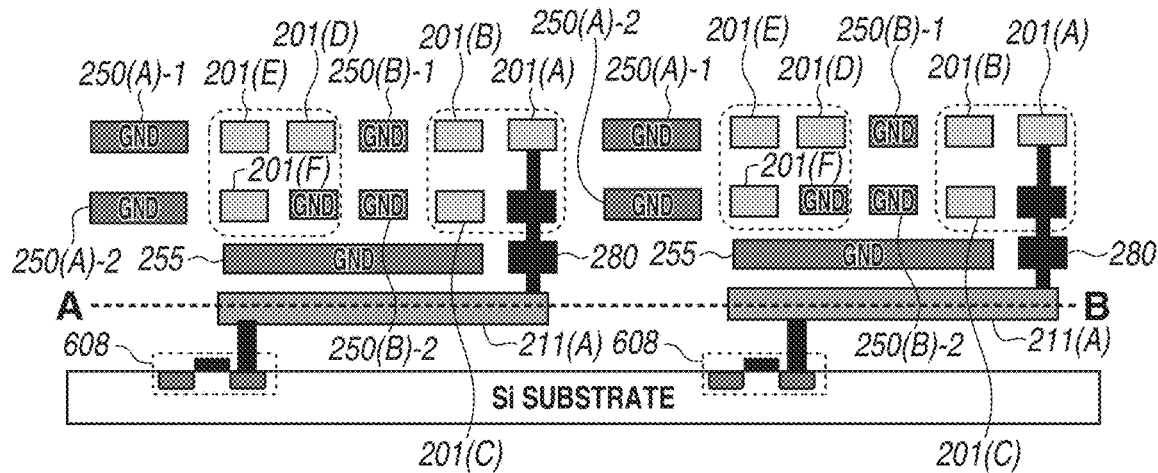
FIGS. 18A, 18B, and 18C are cross-sectional views illustrating signal lines and shield wirings.

FIG. 18A is a cross-sectional view taken along the A-B line illustrated in FIG. 17.

Figure 18B:
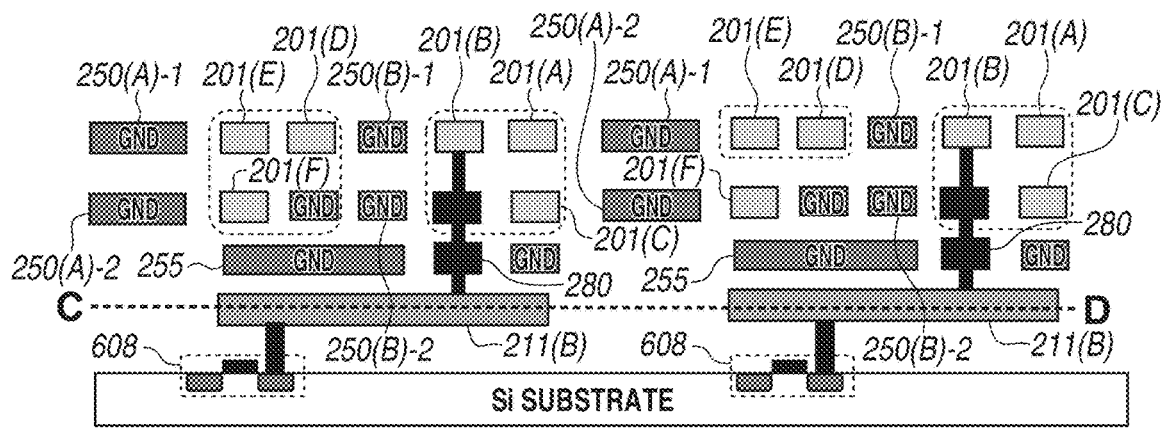

FIG. 18B is a cross-sectional view taken along the C-D line illustrated in FIG. 17.

Figure 18C:
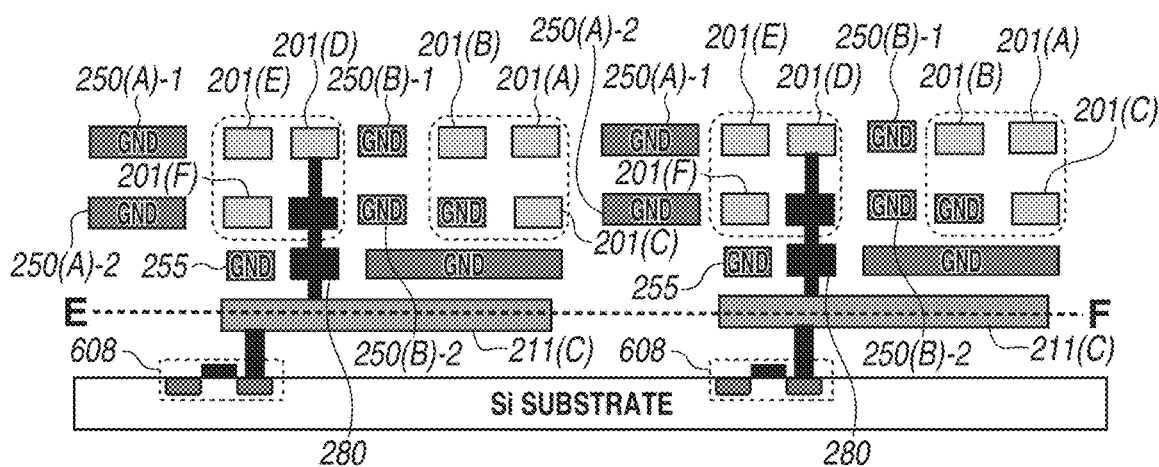

FIG. 18C is a cross-sectional view taken along the E-F line illustrated in FIG. 17.

Figure 19A:
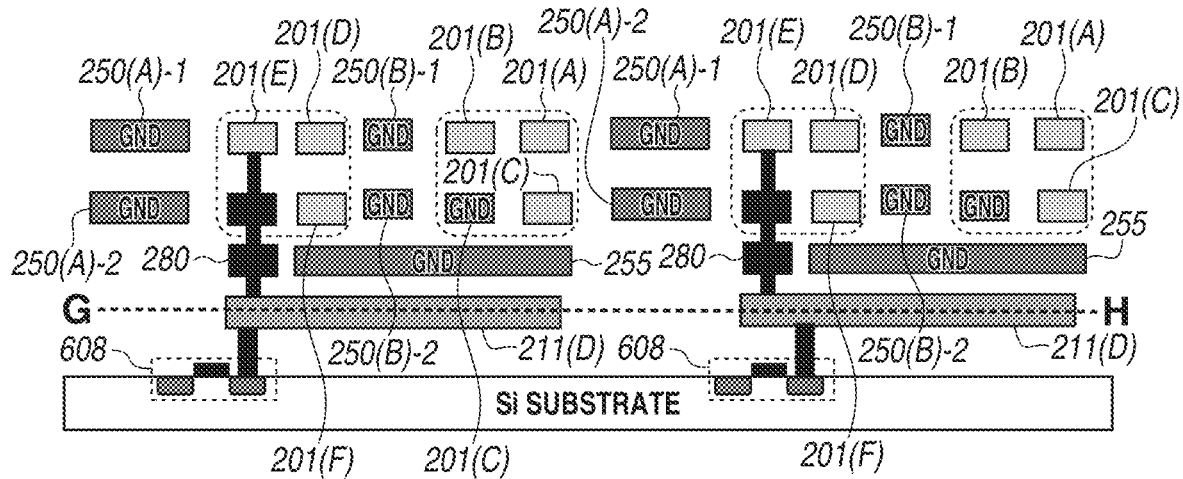
FIGS. 19A, 19B, and 19C are cross-sectional views illustrating signal lines and shield wirings.

FIG. 19A is a cross-sectional view taken along the G-H line illustrated in FIG. 17.

Figure 19B:
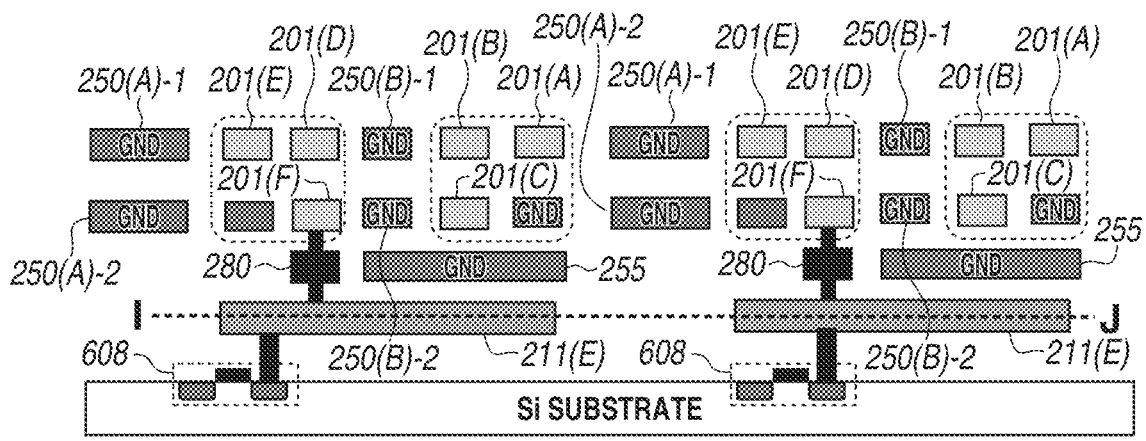

FIG. 19B is a cross-sectional view taken along the I-J line illustrated in FIG. 17.

Figure 19C:
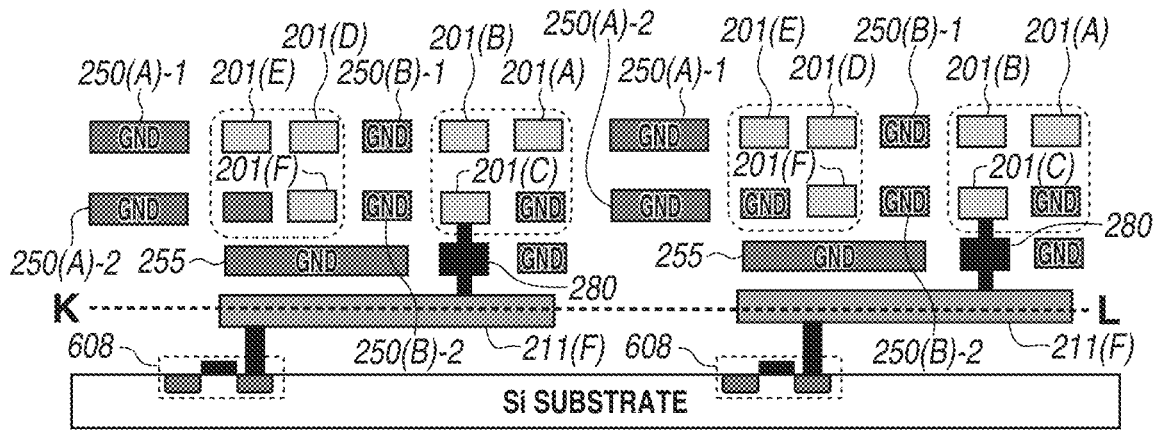

FIG. 19C is a cross-sectional view taken along the K-L line illustrated in FIG. 17.

The cross-sectional view illustrated in FIG. 18A will be described below. The shield wiring 250(A) includes shield wirings 250(A)-1 and 250(A)-2 in the multilayer wiring configuration according to the present exemplary embodiment. The shield wiring 250(B) includes shield wirings 250(B)-1 and 250(B)-2 in the multilayer wiring configuration according to the present exemplary embodiment.

A first set of the signal lines 201(A) to 201(C) operating in phase is arranged in the first wiring layer, and a second set thereof is arranged in the second wiring layer. The signal line 201(C) as one of the signal lines of the second set arranged in the second wiring layer is arranged at a first position, which overlaps, in a planar view, with the signal line 201(B) as one of the signal lines of the first set arranged in the first wiring layer.

A first set of the signal lines 201(D) to 201(F) operating in phase is arranged in the first wiring layer, and a second set thereof is arranged in the second wiring layer. The signal line 201(F) as one of the signal lines of the second set arranged in the second wiring layer is arranged at the first position, which overlaps, in a planar view, with the signal line 201(E) as one of the signal lines of the first set arranged in the first wiring layer.

The cross-sectional view illustrated in FIG. 18B will be described. The signal line 201(B) is connected to the wiring 211(B). The signal line 201(C) as one of the signal lines of the second set arranged in the second wiring layer is arranged at the second position, which overlaps, in a planar view, with the signal line 201(A) as one of the signal lines of the first set arranged in the first wiring layer. In other words, the signal line 201(C) is arranged at a different position from the first position, which overlaps, in a planar view, with the signal line 201(B) as one of the signal lines of the first set arranged in the first wiring layer.

The cross-sectional view illustrated in FIG. 18C will be described. The signal line 201(D) is connected to the wiring 211(C). The signal line 201(F) as one of the signal lines of the second set arranged in the second wiring layer is arranged at the first position, which overlaps, in a planar view, with the signal line 201(E) as one of the signal lines of the first set arranged in the first wiring layer.

The cross-sectional view illustrated in FIG. 19A will be described. The signal line 201(E) is connected to the wiring 211(D). The signal line 201(F) as one of the signal lines of the second set arranged in the second wiring layer is arranged at the second position, which overlaps, in a planar view, with the signal line 201(D) as one of the signal lines of the first set arranged in the first wiring layer. In other words, the signal line 201(F) is arranged at a different position from the first position, which overlaps, in a planar view, with the signal line 201(E) as one of the signal lines of the first set arranged in the first wiring layer.

The cross-sectional view illustrated in FIG. 19B will be described. The signal line 201(F) is connected to the wiring 211(E). The signal line 201(F) as one of the signal lines of the second set arranged in the second wiring layer is arranged at the second position, which overlaps, in a planar view, with the signal line 201(D) as one of the signal lines of the first set arranged in the first wiring layer. In other words, the signal line 201(F) is arranged at a different position from the first position, which overlaps, in a planar view, with the signal line 201(E) as one of the signal lines of the first set arranged in the first wiring layer.

The cross-sectional view illustrated in FIG. 19C will be described. The signal line 201(C) is connected to the wiring 211(F). The signal line 201(C) as one of the signal lines of the second set arranged in the second wiring layer is arranged at the first position, which overlaps, in a planar view, with the signal line 201(B) as one of the signal lines of the first set arranged in the first wiring layer.

Figure 20:
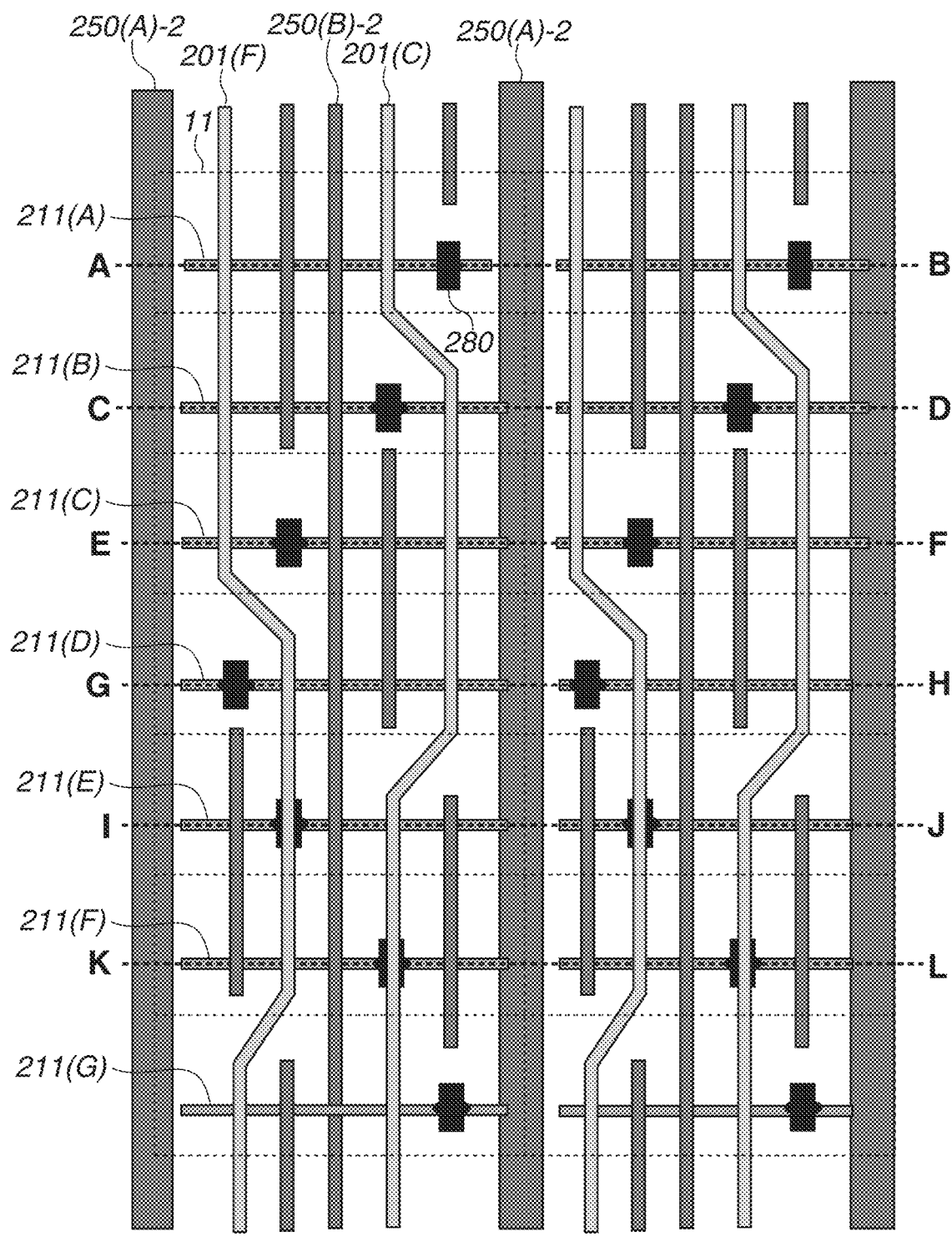
FIG. 20 is a top view illustrating signal lines and shield wirings.

FIG. 20 is a top view illustrating the second wiring layer (a wiring layer in which the shield wirings 250(A)-2 and 250(B)-2 are arranged).

Figure 21:
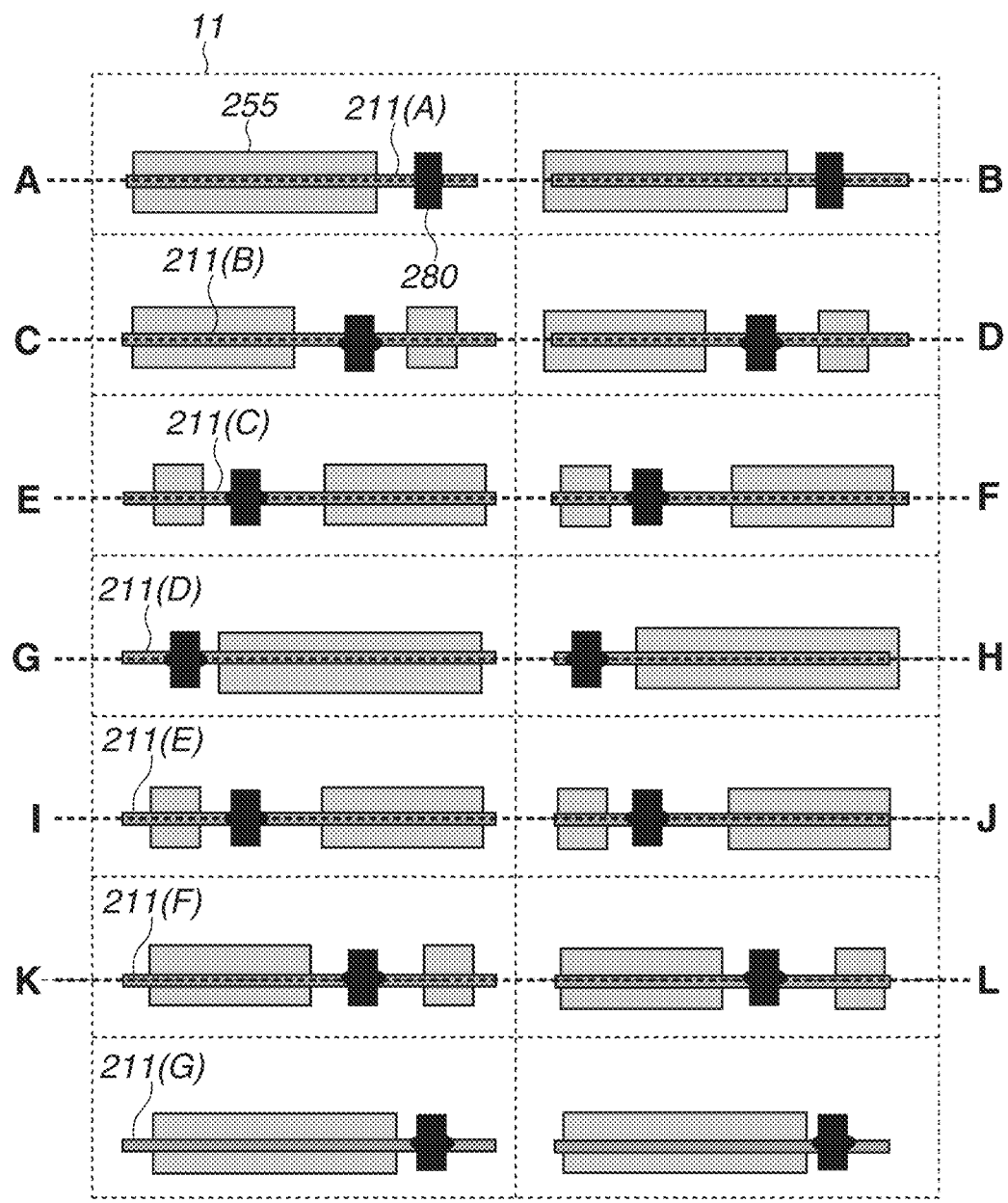
FIG. 21 is another top view illustrating signal lines and shield wirings.

FIG. 21 is a top view illustrating a third wiring layer (a wiring layer in which the third shield wirings 255 are arranged).

The second wiring layer illustrated in FIG. 20 will be described.

The signal line 201(C) and 201(F) are arranged in the second wiring layer.

The signal line 201(C) is connected with the wiring 211F. The signal line 201(F) is connected with the wiring 211E.

The signal line 201(C) includes partial wirings C-1, C-3, and C-5 which extend along the first direction in which the shield wiring 250(A)-2 extends. The signal line 201(C) also includes a partial wiring 201(C)-2 extending along a third direction between the second direction intersecting with the first direction and the first direction. The signal line 201(C) also includes a partial wiring 201(C)-4 extending along a fifth direction between a fourth direction (opposite to the second direction intersecting with the first direction) and the first direction. The partial wiring C-1 extending along the first direction is connected to the partial wiring C-2 extending along the third direction. The partial wiring C-2 is connected to the partial wiring C-3 extending along the first direction. The partial wiring C-3 is connected to the partial wiring C-4 extending along the fifth direction. The partial wiring C-4 is connected to the partial wiring C-5 extending along the first direction.

Suppose that the signal line 201(C) is referred to as a first signal line, the signal line 201(B) is referred to as a second signal line, the signal line 201(A) is referred to as a third signal line, and the signal line 201(D) is referred to as a fourth signal line. In the section taken along an imaginary line (line A-B) passing in the second direction through the position where the connecting portion 280 (at which the third signal line connects with a wiring 211) is formed, the first and the second signal lines overlap with each other in a planar view. In the section taken along an imaginary line (line C-D) passing in the second direction through the position where the connecting portion 280 (at which the second signal line connects with a wiring 211) is formed, the first and the third signal lines overlap with each other in a planar view. In the section taken along an imaginary line (line K-L) passing in the second direction through the position where the connecting portion 280 (at which the first signal line connects with a wiring 211) is formed, the first and the second signal lines overlap with each other in a planar view.

In this way, the signal line 201(C) meanders to bypass the connecting portions 280 as via-plugs for connecting the wiring 211(B) and the signal line 201(B). This enables suitably implementing the multilayer wiring configuration of the signal lines 201.

The signal line 201(C) arranged in the second wiring layer according to the present exemplary embodiment includes the partial wiring C-1 extending along the first direction and the partial wiring C-2 extending along the third direction. The signal line 201(C) further includes the partial wiring C-3 extending along the first direction, the partial wiring C-4 extending along the fifth direction, and the partial wiring C-5 extending along the first direction. This enables connecting the wirings 211 and the signal lines 201 arranged in the first wiring layer while making the width of the regions for arranging the plurality of signal lines 201 smaller than that in a case where the plurality of signal lines 201 is arranged in the single wiring layer.

The imaging device according to the present exemplary embodiment also includes the shield wirings 250(A) and 250(B). Similar to the imaging apparatus according to the first exemplary embodiment, the imaging device according to the present exemplary embodiment can suitably restrain the parasitic capacitance between a plurality of wirings while restraining the increase in the wiring area of the shield wirings.

Figure 22:
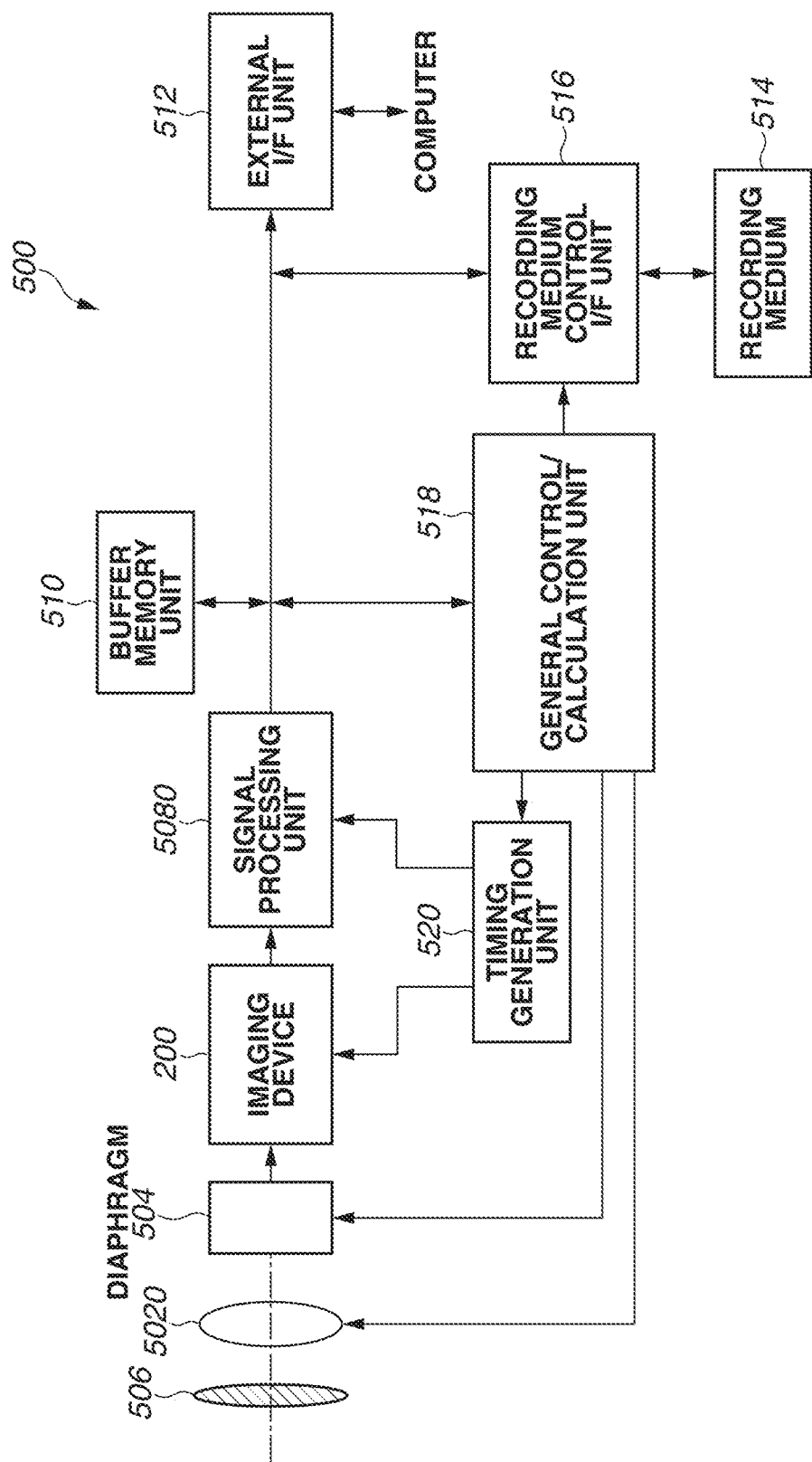
FIG. 22 is a block diagram illustrating a configuration of an imaging system.

FIG. 22 is a block diagram illustrating a configuration of an imaging system 500 according to a sixth exemplary embodiment. The imaging system 500 according to the present exemplary embodiment includes an imaging device 200 to which the configuration of the imaging devices according to any one of the above-described exemplary embodiments is applied. Specific examples of the imaging system 500 include a digital still camera, a digital camcorder, and a monitoring camera. FIG. 22 illustrates an example of a configuration of a digital still camera to which the imaging device of any one of the above-described exemplary embodiments is applied as the imaging device 200.

The imaging system 500 illustrated in FIG. 22 includes the imaging device 200, a lens 5020 for forming a subject optical image on the imaging device 200, a diaphragm 504 for varying the light quantity passing through the lens 5020, and a barrier 506 for protecting the lens 5020. The lens 5020 and the diaphragm 504 form an optical system for condensing light to the imaging device 200.

The imaging system 500 further includes a signal processing unit 5080 for processing an output signal from the imaging device 200. The signal processing unit 5080 performs signal processing operations for performing various types of corrections and compression on the input signal as required. The signal processing unit 5080 may be provided with a function of performing AD conversion processing on the output signal from the imaging device 200. In this case, the imaging device 200 does not necessarily include an AD conversion circuit.

The imaging system 500 further includes a buffer memory unit 510 for temporarily storing image data, and an external interface (I/F) unit 512 for communicating with an external computer. The imaging system 500 further includes a recording medium 514, such as semiconductor memory, for recording and reading imaging data, and a recording medium control I/F unit 516 for recording and reading data to/from the recording medium 514. The recording medium 514 may be built in the imaging system 500 or attachable to and detachable from the imaging system 500.

The imaging system 500 further includes a general control/calculation unit 518 for performing various calculations and controlling the entire digital still camera, and a timing generation unit 520 for outputting various timing signals to the imaging device 200 and the signal processing unit 5080. Timing signals may be input from the outside. The imaging system 500 needs to be provided with at least the imaging device 200 and the signal processing unit 5080 for processing an output signal output from the imaging device 200. The general control/calculation unit 518 and the timing generation unit 520 may be configured to perform a part or whole of control functions of the imaging device 200.

The imaging device 200 outputs an image signal to the signal processing unit 5080. The signal processing unit 5080 performs predetermined signal processing on the image signal output from the imaging device 200 and outputs image data. The signal processing unit 5080 generates an image by using the image signal.

An imaging system for acquiring images with better image quality can be achieved by configuring an imaging system by using the imaging device according to each of the above-described exemplary embodiments.

An imaging system and a moving object according to a seventh exemplary embodiment will be described below with reference to FIGS. 23A, 23B, and 24.

Figure 23A:
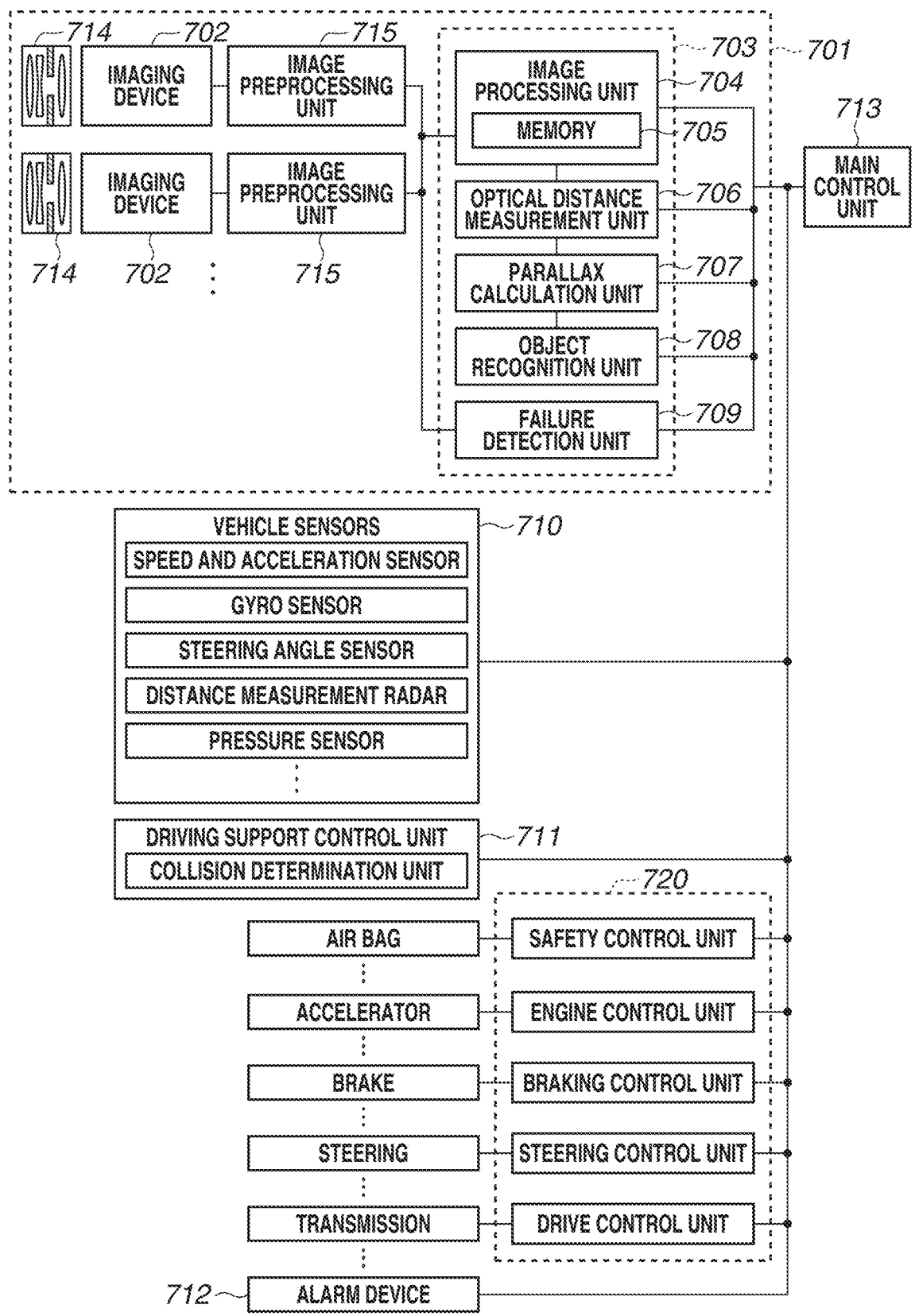
Figure 24:
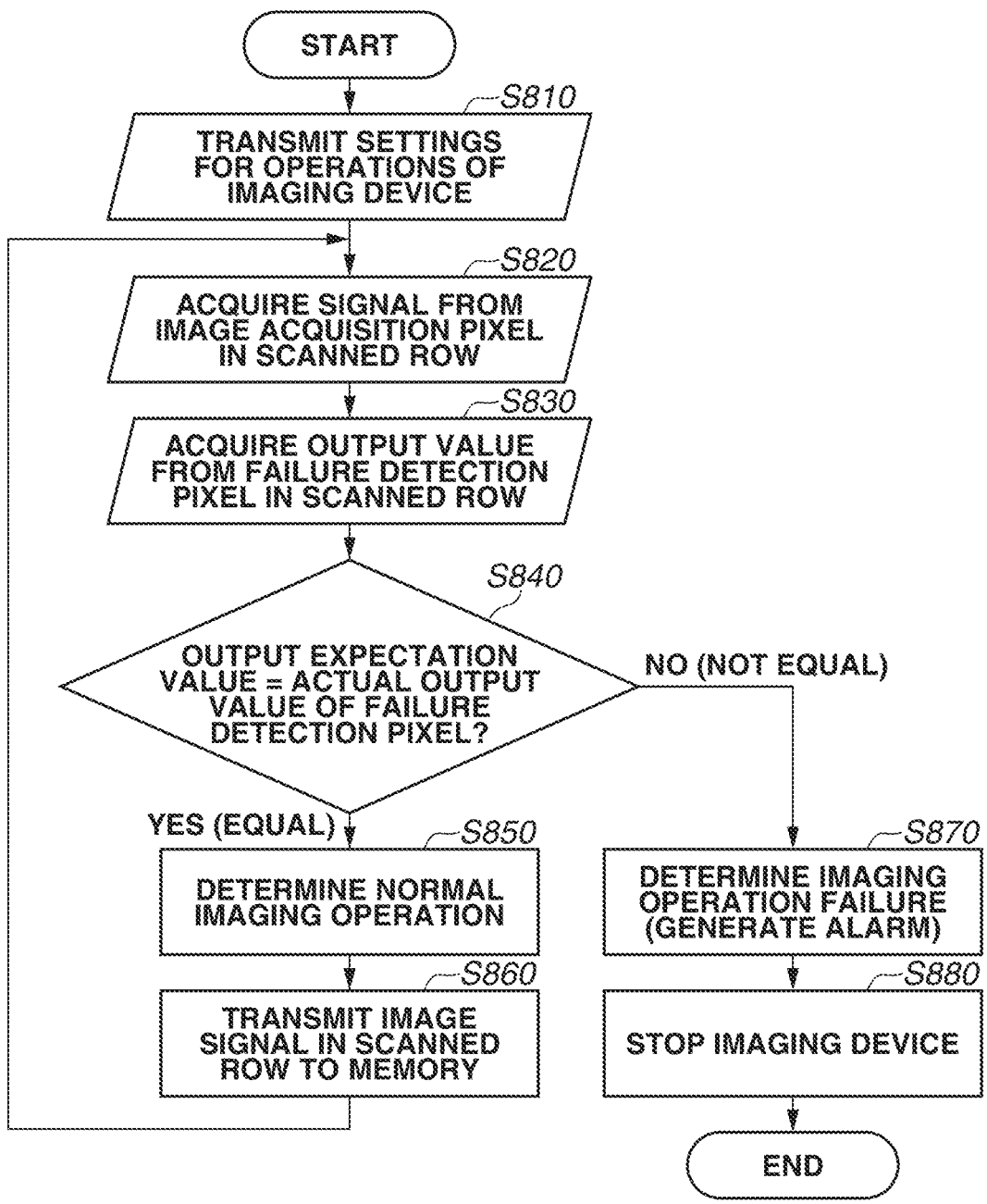
FIG. 24 is a flowchart illustrating operations of the imaging system.

FIGS. 23A and 23B are schematic views illustrating an example of a configuration of the imaging system and the moving object according to the present exemplary embodiment. FIG. 24 is a flowchart illustrating operations of the imaging system according to the present exemplary embodiment.

The present exemplary embodiment will be described below centering on an example of an imaging system related to an in-vehicle camera. FIGS. 23A and 23B illustrate an example of a vehicle system and an imaging system mounted on the vehicle system. An imaging system 701 includes imaging devices 702, image preprocessing units 715, an integrated circuit 703, and optical systems 714. Each optical system 714 forms a subject's optical image on the imaging device 702. Each imaging device 702 converts the subject's optical image formed by the optical system 714 into an electric signal. The imaging device 702 is the imaging device according to any one of the above-described exemplary embodiments. Each image preprocessing unit 715 performs predetermined signal processing on a signal output from the imaging device 702. The function of the image preprocessing unit 715 may be built in the imaging device 702. The imaging system 701 is provided with at least two sets of the optical system 714, the imaging device 702, and the image preprocessing unit 715. The output signal from the image preprocessing unit 715 of each set is input to the integrated circuit 703.

The integrated circuit 703, which is an integrated circuit for use in an imaging system, includes an image processing unit 704 including a memory 705, an optical distance measurement unit 706, a parallax calculation unit 707, an object recognition unit 708, and a failure detection unit 709. The image processing unit 704 performs image processing, such as developing processing and defective correction processing, on the output signal from the image preprocessing unit 715. The memory 705 primarily stores a captured image and defective positions of imaging pixels. The optical distance measurement unit 706 performs focusing and distance measurement of a subject. The parallax calculation unit 707 calculates the parallax (phase difference of a parallax image) based on a plurality of pieces of image data acquired by the plurality of imaging devices 702. The object recognition unit 708 recognizes subjects, such as cars, paths, signs, and persons. Upon detecting a failure, the failure detection unit 709 issues an alarm to a main control unit 713.

The integrated circuit 703 may be implemented by specially designed hardware, software modules, or a combination of both. The integrated circuit 703 may also be implemented by a Field Programmable Gate Array (FPGA), an Application Specific Integrated Circuit (ASIC), or a combination of both.

The main control unit 713 totally controls operations of the imaging system 701, vehicle sensors 710, and a control unit 720. A certain method which does not use the main control unit 713 may be applicable. In this method, each of the imaging system 701, the vehicle sensors 710, and the control unit 720 has a communication interface and transmits and receives control signals via the communication network (for example, based on the CAN standard).

The integrated circuit 703 has a function of receiving control signals from the main control unit 713 or a function of transmitting control signals and setting values to the imaging device 702 via its own control unit. For example, the integrated circuit 703 transmits a setting for pulse-driving a voltage switch 13 in the imaging device 702 and a setting for changing the voltage switch 13 for each frame.

The imaging system 701 connected to the vehicle sensors 710 can detect vehicle running states (including the vehicle speed, yaw rate, and steering angle), the environment outside the vehicle, and states of other vehicles and obstacles. The vehicle sensors 710 also serve as distance information acquisition units for acquiring information about the distance from a parallax image to a subject. The imaging system 701 is connected to a driving support control unit 711 for performing various driving support functions such as automatic steering, automatic cruising, and collision prevention functions. In particular, a collision determination function presumes and determines a collision with other vehicles and obstacles based on detection results of the imaging system 701 and/or the vehicle sensors 710. This function performs collision avoidance control when a collision is presumed and activates a safety apparatus when a collision takes place.

The imaging system 701 is also connected to an alarm device 712 for issuing an alarm to the driver based on a determination result by a collision determination unit. For example, if the possibility of collision is high based on the determination result of the collision determination unit, the main control unit 713 performs vehicle control for avoiding a collision and reducing damages, for example, by applying brakes, releasing the accelerator, or restraining the engine power. The alarm device 712 warns the driver by generating an alarm sound, displaying alarm information on the display screen of a car navigation system or meter panel, or applying a vibration to the seat belt or steering.

According to the present exemplary embodiment, the imaging system 701 captures images of the surrounding of a vehicle, for example, images ahead or behind the vehicle. FIG. 23B illustrates an example of a layout of the imaging system 701 in a case where images ahead of the vehicle are to be captured by the imaging system 701.

The two imaging devices 702 are disposed at forward positions of a vehicle 700. More specifically, assuming that the central line along the forward/backward traveling direction or in an outer shape direction (e.g., in the width direction) of the vehicle 700 is a symmetric axis, it is desirable to dispose the two imaging devices 702 in line symmetry with respect to the symmetric axis in order to acquire information about the distance between the vehicle 700 and the subject and determine the possibility of collision. In addition, it is desirable that the imaging devices 702 are disposed not to disturb the driver's sight when the driver views the situation outside the vehicle 700 from the driver's seat. Desirably, the alarm device 712 is disposed at a position which easily comes into the driver's sight.

Now, a failure detection operation of the imaging device 702 in the imaging system 701 will be described with reference to FIG. 24. The imaging device 702 performs the failure detection operation according to steps S810 to S880 in the flowchart illustrated in FIG. 24.

In step S810, start-up setting processing of each imaging device 702 is performed. More specifically, settings for operations of the imaging device 702 are transmitted from the outside of the imaging system 701 (e.g., the main control unit 713) or the inside of the imaging system 701 to start the imaging operation and failure detection operation.

In step S820, the main control unit 713 acquires a pixel signal from an effective pixel. In step S830, the main control unit 713 acquires the output value from a failure detection pixel arranged for failure detection. The failure detection pixel includes a photoelectric conversion portion similar to the effective pixel. A predetermined voltage is written to the photoelectric conversion portion. The failure detection pixel outputs a signal corresponding to the voltage written to the photoelectric conversion portion. Steps S820 and S830 may be reversed.

In step S840, the main control unit 713 determines whether the output expectation value of the failure detection pixel is equal to the actual output value of the failure detection pixel.

When the output expectation value is equal to the actual output value as a result of the determination (YES in step S840), then in step S850, the main control unit 713 determines that the imaging operation is being performed normally. Then, the processing proceeds to step S860. In step S860, the main control unit 713 transmits the pixel signal of a scanned row to the memory 705 to primarily store the pixel signal. Then, the processing returns to step S820. The main control unit 713 continues the failure detection operation.

On the other hand, when the output expectation value is not equal to the actual output value as a result of the determination (NO in step S840), then in step S870, the main control unit 713 determines that the imaging operation fails and then issues an alarm to the main control unit 713 or the alarm device 712. The alarm device 712 displays on the display unit that a failure is detected. In step S880, the main control unit 713 stops the imaging device 702 and ends the operation of the imaging system 701.

Although, in the flowchart according to the present exemplary embodiment, a loop is formed for each row, a loop may be formed for a plurality of rows or the failure detection operation may be performed for each frame.

The alarm issued in step S870 may be notified to the outside of the vehicle via a wireless network.

Although the present exemplary embodiment has been described above centering on control for avoiding a collision with other vehicles, it is also applicable to automatic driving control for following another vehicle or automatic driving control for keeping the vehicle within a lane. The imaging system 701 is applicable not only to vehicles but also to moving objects (moving apparatuses) such as vessels, airplanes, and industrial robots. In addition, the imaging system 701 is applicable not only to moving objects but also to intelligent transport systems (ITS) and a wide range of apparatuses utilizing object recognition.

Modifications

The present disclosure is not limited to the above-described exemplary embodiments and can be modified in diverse ways.

For example, the present disclosure also includes an exemplary embodiment in which a part of the configuration of another exemplary embodiment is added, or an exemplary embodiment in which a part of the configuration is replaced with a part of the configuration of another exemplary embodiment.

The above-described exemplary embodiments are to be considered as illustrative in embodying the present disclosure, and not restrictive of the technical scope of the present disclosure. The present disclosure may be embodied in diverse forms without departing from the technical concepts or essential characteristics thereof.

The present disclosure makes it possible to provide a layout for reducing the area of wiring regions of a plurality of signal lines provided for pixels in one column in the multilayer wiring configuration.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2017-230984, filed Nov. 30, 2017, which is hereby incorporated by reference herein in its entirety.

What is claimed is:

1. An imaging device, comprising:
   a plurality of pixels arranged over a plurality of rows and a plurality of columns; and
   a plurality of signal lines including a first signal line and a second signal line extending in a first direction, arranged corresponding to one of the plurality of columns and connected to pixels in respectively different rows, and
   wherein the first signal line of the plurality of signal lines is arranged in a first wiring layer, and the second signal line of the plurality of signal lines thereof is arranged in a second wiring layer that is closer to the pixels than the first wiring layer,
   wherein, at a position where a line passes a pixel in a first row out of the plurality of rows along a second direction intersecting with the first direction in a planar view, the first and the second signal lines of the plurality of signal lines are arranged at overlapping positions,
   wherein, at a position where a line passes a pixel in a second row out of the plurality of rows along the second direction, the first and the second signal lines of the plurality of signal lines are arranged at non-overlapping positions, and
   wherein, at a position where a line passes a pixel in a third row out of the plurality of rows along the second direction, the first and the second signal lines of the plurality of signal lines are arranged at overlapping positions.

2. The imaging device according to claim 1, wherein the position where the first and the second signal lines of the plurality of signal lines are not overlapped is a position where the pixel in the second row and the first signal line of the plurality of signal lines are electrically connected.

3. The imaging device according to claim 1,
   wherein each of the plurality of pixels has a pixel output portion, and a connection wiring to which the pixel output portion is connected, and
   wherein the position where the first and the second signal lines of the plurality of signal lines are not overlapped is a position where a via-plug is provided to connect the connection wiring of the pixel in the second row and the first signal line of the plurality of signal lines.

4. The imaging device according to claim 2,
   wherein each of the plurality of pixels has a pixel output portion, and a connection wiring to which the pixel output portion is connected, and
   wherein the position where the first and the second signal lines of the plurality of signal lines are not overlapped is a position where a via-plug is provided to connect the connection wiring of the pixel in the second row and the first signal line of the plurality of signal lines.

5. The imaging device according to claim 3, further comprising a multiplexing circuit to which the plurality of the signal lines is connected, and an analog-to-digital conversion unit connected to the multiplexing circuit.

6. The imaging device according to claim 4, further comprising a multiplexing circuit to which the plurality of signal lines is connected, and an analog-to-digital conversion unit connected to the multiplexing circuit.

7. The imaging device according to claim 5, wherein the multiplexing circuit connects one of the plurality of signal lines to the analog-to-digital conversion unit and then connects another one of the plurality of signal lines to the analog-to-digital conversion unit.

8. The imaging device according to claim 6, wherein the multiplexing circuit connects one of the plurality of signal lines to the analog-to-digital conversion unit and then connects another one of the plurality of signal lines to the analog-to-digital conversion unit.

9. The imaging device according to claim 5, comprising:
   a plurality of sets each including the plurality of signal lines and pixels of the plurality of rows included in the one column; and
   a plurality of multiplexing circuits,
   wherein the pixels of the plurality of rows in the one column include a plurality of first pixels each having a color filter of a first color, and a plurality of second pixels each having a color filter of a second color different from the first color,
   wherein a part of the plurality of first pixels is connected to each of the first and the second signal lines of the plurality of signal lines,
   wherein a part of the plurality of second pixels is connected to each of a third signal line and a fourth signal line of the plurality of signal lines,
   wherein the first and the second signal lines of the plurality of signal lines are connected to one of the plurality of multiplexing circuits, and
   wherein the third and the fourth signal lines of the plurality of signal lines are connected to another one of the plurality of multiplexing circuits.

10. The imaging device according to claim 6, comprising:
    a plurality of sets each including the plurality of signal lines and pixels of the plurality of rows included in the one column; and
    a plurality of multiplexing circuits,
    wherein the pixels of the plurality of rows in the one column include a plurality of first pixels each having a color filter of a first color, and a plurality of second pixels each having a color filter of a second color different from the first color,
    wherein a part of the plurality of first pixels is connected to each of the first and the second signal lines of the plurality of signal lines,
    wherein a part of the plurality of second pixels is connected to each of a third signal line and a fourth signal line of the plurality of signal lines, wherein the first and the second signal lines of the plurality of signal lines are connected to one of the plurality of multiplexing circuits, and wherein the third and the fourth signal lines of the plurality of signal lines are connected to another one of the plurality of multiplexing circuits.

11. The imaging device according to claim 7, comprising:

a plurality of sets each including the plurality of signal lines and pixels of the plurality of rows included in the one column; and a plurality of multiplexing circuits, wherein the pixels of the plurality of rows in the one column include a plurality of first pixels each having a color filter of a first color, and a plurality of second pixels each having a color filter of a second color different from the first color, wherein a part of the plurality of first pixels is connected to each of the first and the second signal lines of the plurality of signal lines, wherein a part of the plurality of second pixels is connected to each of a third signal line and a fourth signal line of the plurality of signal lines, wherein the first and the second signal lines of the plurality of signal lines are connected to one of the plurality of multiplexing circuits, and wherein the third and the fourth signal lines of the plurality of signal lines are connected to another one of the plurality of multiplexing circuits.

12. The imaging device according to claim 8, comprising:

a plurality of sets each including the plurality of signal lines and pixels of the plurality of rows included in the one column; and a plurality of multiplexing circuits, wherein the pixels of the plurality of rows in the one column include a plurality of first pixels each having a color filter of a first color, and a plurality of second pixels each having a color filter of a second color different from the first color, wherein a part of the plurality of first pixels is connected to each of the first and the second signal lines of the plurality of signal lines, wherein a part of the plurality of second pixels is connected to each of a third signal line and a fourth signal line of the plurality of signal lines, wherein the first and the second signal lines of the plurality of signal lines are connected to one of the plurality of multiplexing circuits, and wherein the third and the fourth signal lines of the plurality of signal lines are connected to another one of the plurality of multiplexing circuits.

13. The imaging device according to claim 5, further comprising a control unit, wherein each of the plurality of pixels outputs a first signal based on signals of only a part of the plurality of photoelectric conversion portions, and a second signal based on signals of the plurality of photoelectric conversion portions, wherein a photoelectric conversion period of the photoelectric conversion portions corresponding to the first signal at least partially overlaps with a photoelectric conversion period of the photoelectric conversion portions corresponding to the second signal, wherein the plurality of pixels includes a first pixel and a second pixel, and wherein the control unit controls the analog-to-digital conversion unit, in a first period, to perform analog-to-digital conversion for converting the first signal output by the first pixel into a digital signal, in a second period after the first period, to perform analog-to-digital conversion for converting the first signal output by the second pixel into a digital signal before performing analog-to-digital conversion for converting the second signal output by the first pixel into a digital signal, in a third period after the second period, to perform analog-to-digital conversion for converting the second signal output by the first pixel into a digital signal, and in a fourth period after the third period, to perform analog-to-digital conversion for converting the second signal output by the second pixel into a digital signal.

14. The imaging device according to claim 12, further comprising a control unit, wherein each of the plurality of pixels outputs a first signal based on signals of only a part of the plurality of photoelectric conversion portions, and a second signal based on signals of the plurality of photoelectric conversion portions, wherein a photoelectric conversion period of the photoelectric conversion portions corresponding to the first signal at least partially overlaps with a photoelectric conversion period of the photoelectric conversion portions corresponding to the second signal, wherein the plurality of pixels includes a first pixel and a second pixel, and wherein the control unit controls the analog-to-digital conversion unit, in a first period, to perform analog-to-digital conversion for converting the first signal output by the first pixel into a digital signal, in a second period after the first period, to perform analog-to-digital conversion for converting the first signal output by the second pixel into a digital signal before performing analog-to-digital conversion for converting the second signal output by the first pixel into a digital signal, in a third period after the second period, to perform analog-to-digital conversion for converting the second signal output by the first pixel into a digital signal, and in a fourth period after the third period, to perform analog-to-digital conversion for converting the second signal output by the second pixel into a digital signal.

15. The imaging device according to claim 13, wherein the analog-to-digital conversion unit performs analog-to-digital conversion through comparison between the first signal and a ramp signal, and analog-to-digital conversion through comparison between the second signal and a ramp signal.

16. The imaging device according to claim 13, wherein the analog-to-digital conversion unit is a successive approximation analog-to-digital conversion unit.

17. The imaging device according to claim 13, wherein the analog-to-digital conversion unit is a delta-sigma type analog-to-digital conversion unit.

18. An imaging system, comprising:
the imaging device according to claim 1; and
a signal processing unit configured to generate an image by processing signals output by the imaging device.

19. A moving object, comprising:
the imaging device according to claim 1; and a distance information acquisition unit configured to acquire distance information about a distance to a subject based on a parallax image based on signals from the imaging device, wherein the moving object further comprises a control unit configured to control the moving object based on the distance information.

* * * * *